(12) United States Patent
Nasu

(10) Patent No.: US 12,727,195 B2
(45) Date of Patent: Sep. 1, 2026

(54) SEMICONDUCTOR DEVICE WITH GROOVE STRUCTURE

(71) Applicant: ROHM CO., LTD., Kyoto (JP)

(72) Inventor: Kentaro Nasu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 301 days.

(21) Appl. No.: 18/431,693

(22) Filed: Feb. 2, 2024

(65) Prior Publication Data

US 2024/0178316 A1 May 30, 2024

Related U.S. Application Data

(63) Continuation of application No. PCT/JP2022/019924, filed on May 11, 2022.

(30) Foreign Application Priority Data

Aug. 5, 2021 (JP) ................................ 2021-128850

(51) Int. Cl.
*H10D 30/66* (2025.01)
*H10D 30/01* (2025.01)
(Continued)

(52) U.S. Cl.
CPC ....... *H10D 30/668* (2025.01); *H10D 30/0295* (2025.01); *H10D 30/0297* (2025.01);
(Continued)

(58) Field of Classification Search
CPC .................................................... H10D 30/668
(Continued)

(56) References Cited

U.S. PATENT DOCUMENTS

2007/0145474 A1 6/2007 Annese et al.
2012/0292662 A1* 11/2012 Matsuura ............ H10D 12/481 257/E29.198
(Continued)

FOREIGN PATENT DOCUMENTS

JP H03160761 A 7/1991
JP H04259258 A 9/1992
JP 2002353446 A 12/2002

OTHER PUBLICATIONS

International Search Report for PCT/JP2022/019924, mailed on Aug. 16, 2022.
Written Opinion for PCT/JP2022/019924, mailed on Aug. 16, 2022.

*Primary Examiner* — Ajay Arora
(74) *Attorney, Agent, or Firm* — Rabin & Berdo, P.C.

(57) ABSTRACT

A semiconductor device includes a first conductivity type first semiconductor region formed in a region on the first main surface side in a chip, a second conductivity type second semiconductor region formed in a region on the second main surface side in the chip, a first groove structure including a first groove formed in the first main surface while passing through the first semiconductor region so as to partition the first semiconductor region into a first region and a second region as viewed in cross-section, a control insulating film that covers a wall surface of the first groove, and a control electrode embedded in the first groove while sandwiching the control insulating film so as to control a channel in the second semiconductor region, a first electrode electrically connected to the first semiconductor region in the first region, and a second groove structure including a second groove formed in the first main surface while passing through the first semiconductor region in the second region, and a second electrode embedded in the second groove so as to form a current path via the channel between the first electrode and the second electrode.

20 Claims, 47 Drawing Sheets

(51) Int. Cl.

| | |
|---|---|
| ***H10D 62/10*** | (2025.01) |
| ***H10D 62/13*** | (2025.01) |
| ***H10D 64/23*** | (2025.01) |
| ***H10D 84/00*** | (2025.01) |
| ***H10P 30/20*** | (2026.01) |
| ***H10P 30/22*** | (2026.01) |
| *H10D 62/832* | (2025.01) |

(52) U.S. Cl.
CPC ......... *H10D 62/127* (2025.01); *H10D 62/154* (2025.01); *H10D 64/252* (2025.01); *H10D 84/144* (2025.01); *H10P 30/204* (2026.01); *H10P 30/21* (2026.01); *H10P 30/22* (2026.01); *H10D 62/8325* (2025.01)

(58) Field of Classification Search
USPC .......................................................... 257/330
See application file for complete search history.

(56) References Cited

U.S. PATENT DOCUMENTS

2014/0291762 A1 10/2014 Korec et al.
2017/0278956 A1* 9/2017 Tsuyuki ............... H10D 12/461
2018/0190806 A1* 7/2018 Matsuura ............. H10D 62/106

* cited by examiner

Y
Z
X
2
3(6)
5A
21
22
23
53
54
53
IV
VII
20
57b
(57)
13a
(13)
n
13a
(13)
VII
11
11
14
14
52
56
55a
66
V
n+
n+
n+
n+
V
55
32
33
51
51
65
VI
VI
29
10
36
30
36
10
29
15A(15)
15B(15)
15A(15)
1A

56(54)
31
52
24
50
26
Z
Y
X
28
25
27
n+
29
3
14
n+
n
n
6
10
11
12
13
36
42b
42b
42
p+
41a
41a
42a
41
7
p
p+
8
32
34
35
30
33
15B(15)
1A
15A(15)

Y
Z
X
2
50
5A
21
53
22
23
54
53
20
57b
(57)
13a
(13)
13a
(13)
52
56
72
55a
55
32
51
51
71
29
10
36
30
36
10
29
15A(15)
15B(15)
15A(15)
1A

Y
Z
X
2
60
5A
54
57b
(57)
72
52
56
55a
62
55
51
71
61
1A

Z
Y
X
81
p
7
8
p+
80
82 n-type impurity
Z
Y
X
81
n
6
p
7
p+
8
80
82

FIG. 11J n-type impurity
Z
Y
X
90
81
31
26
24
n+
n+
29
29
14
n+
n+
n
n
6
11
13
36
36
12
p+
p+
p
p
7
10
10
41
41
32
8
p+
80
82
15A(15)
15B(15)
15A(15)

FIG. 11Q 2
3(6)
5A
21
53
22
23
54
53
XV
Y
Z
X
20
57b
(57)
13a
(13)
n
13a
(13)
11
14
11
14
n+
n+
71
XVI
XVI
55
32
33
51
51
29
10
36
30
36
10
29
15A(15)
15B(15)
15A(15)
1B

Load
L
GND
VDD
Gate Driving Circuite
G1
G2
High Side
Low Side
1BH
1BL
1C
103
101
102
104
105
106
5D
5C
2
71
4
75
3
65
70
73
67
X
Y
Z 57
57b
5A
121(56)
121(56)
120A(55)
64
54
127(72)
125(66)
5D
126A(71)
124A(65)
XXII
127(72)
125(66)
126B(71)
124B(65)
123 (62)
122A (61)
57a
XXII
73
67
63
5C
123 (62)
2
70
57b
122B (61)
5B
1D
122B (61)
121 (56)
120B (55)
X
Y
Z 54
20
23
XXIV
55a
121(56)
119(52)
5A
57b
57
119(52)
121(56)
55a
120A(55)
118A(51)
5D
119(52)
121(56)
55a
120B(55)
118B(51)
20
23
53
14
10
29
14
10
29
1D
5B
30
33
30
33
57b
118A
(51)
5C
57a
118B
(51)
2
3
X
Y
Z Y
X
Z
2
3(6)
5A
53
21
22
23
54
53
XXIV
57b
(57)
20
13a
(13)
n
13a
(13)
11
14
11
14
119
(52)
121
(56)
55a
125
(66)
XXV
n+
n+
n+
n+
XXV
32
120A
(55)
115
(33)
118A
(51)
XXVI
XXVI
124A
(65)
114B
(29)
10
117
(36)
116
(30)
117
(36)
10
114A
(29)
111B(15A,15)
112(15B,15)
111A(15A,15)
1D

SEMICONDUCTOR DEVICE WITH GROOVE STRUCTURE

CROSS REFERENCE TO RELATED APPLICATIONS

The present application is a bypass continuation of International Patent Application No. PCT/JP2022/019924, filed on May 11, 2022, which claims priority to Japanese Patent Application No. 2021-128850 filed in the Japan Patent Office on Aug. 5, 2021, and these entire disclosures of the applications are incorporated herein by reference.

BACKGROUND

1. Field of the Disclosure

The present disclosure relates to a semiconductor device.

2. Description of the Related Art

US2007/0145474A1 discloses a semiconductor device including a p-type semiconductor layer, a first trench structure, a plurality of n-type drift layers, and a plurality of n-type drain-source regions. The first trench structure is formed in a main surface of the p-type semiconductor layer. The plurality of n-type drift layers are respectively formed on both sides of the first trench structure in a surface layer portion of the main surface of the p-type semiconductor layer. The plurality of n-type drain-source regions are respectively formed in surface layer portions of the plurality of drift layers. A channel of a transistor is formed in a region along a bottom portion of the first trench structure.

BRIEF DESCRIPTION OF THE DRAWINGS

FIG. 16 a cross-sectional view taken along line XVI-XVI shown in FIG. 15.

FIG. 26 is a cross-sectional view taken along line XXVI-XXVI shown in FIG. 24.

FIG. 31 is an enlarged cross-sectional view corresponding to the region shown in FIG. 5, the view showing a structure example in a case where a base electrode is removed in the semiconductor device according to the first embodiment.

FIG. 32 is an enlarged cross-sectional view corresponding to the region shown in FIG. 5, the view showing a modified example of a third semiconductor region.

DETAILED DESCRIPTION OF THE PREFERRED EMBODIMENTS

Hereinafter, embodiments will be described in detail with reference to the attached drawings. The figures in the attached drawings are not precisely illustrated but are schematic diagrams, and scale size, etc., do not necessarily match. Also, structures corresponding between the attached figures will be given the same reference sign, and overlapping descriptions will be omitted or simplified. Regarding the structures whose descriptions are omitted or simplified, descriptions made before the omission or the simplification will apply.

Figure 1:
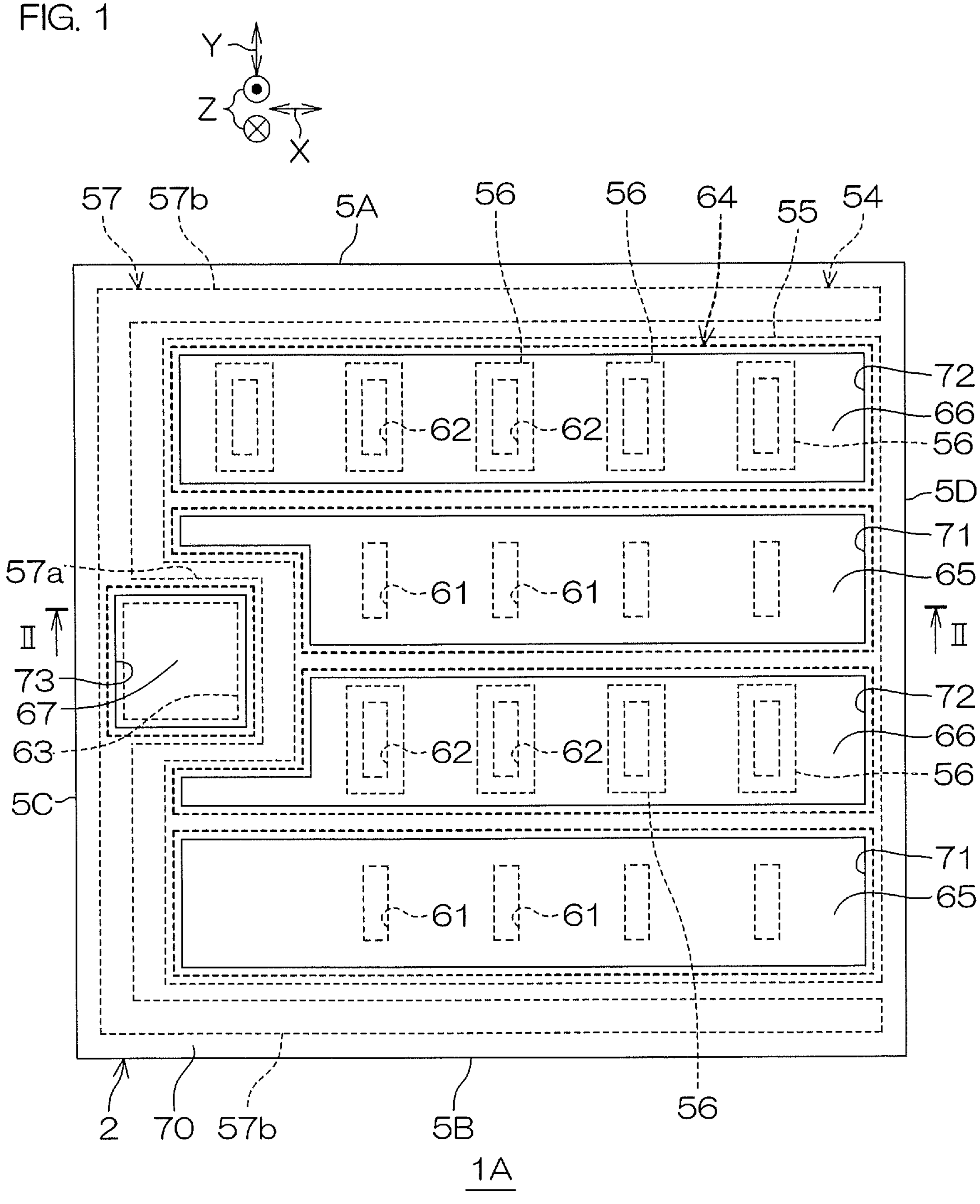
FIG. 1 is a schematic plan view showing a semiconductor device according to a first embodiment.
Figure 2:
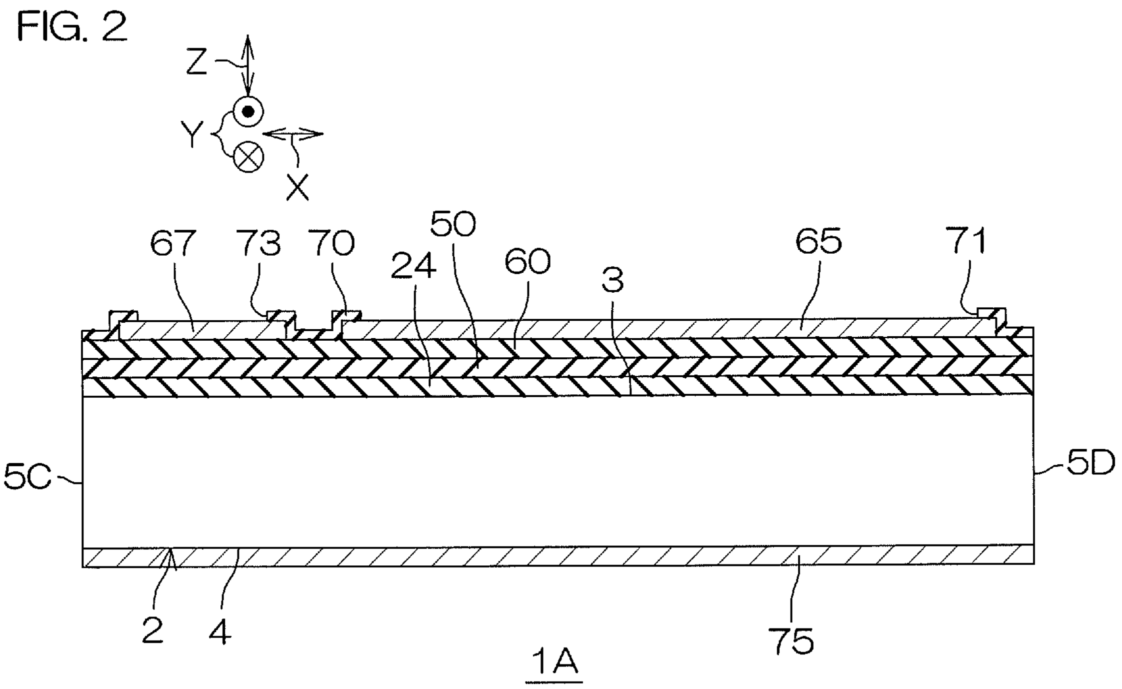
FIG. 2 is a cross-sectional view taken along line II-II shown in FIG. 1.
Figure 3:
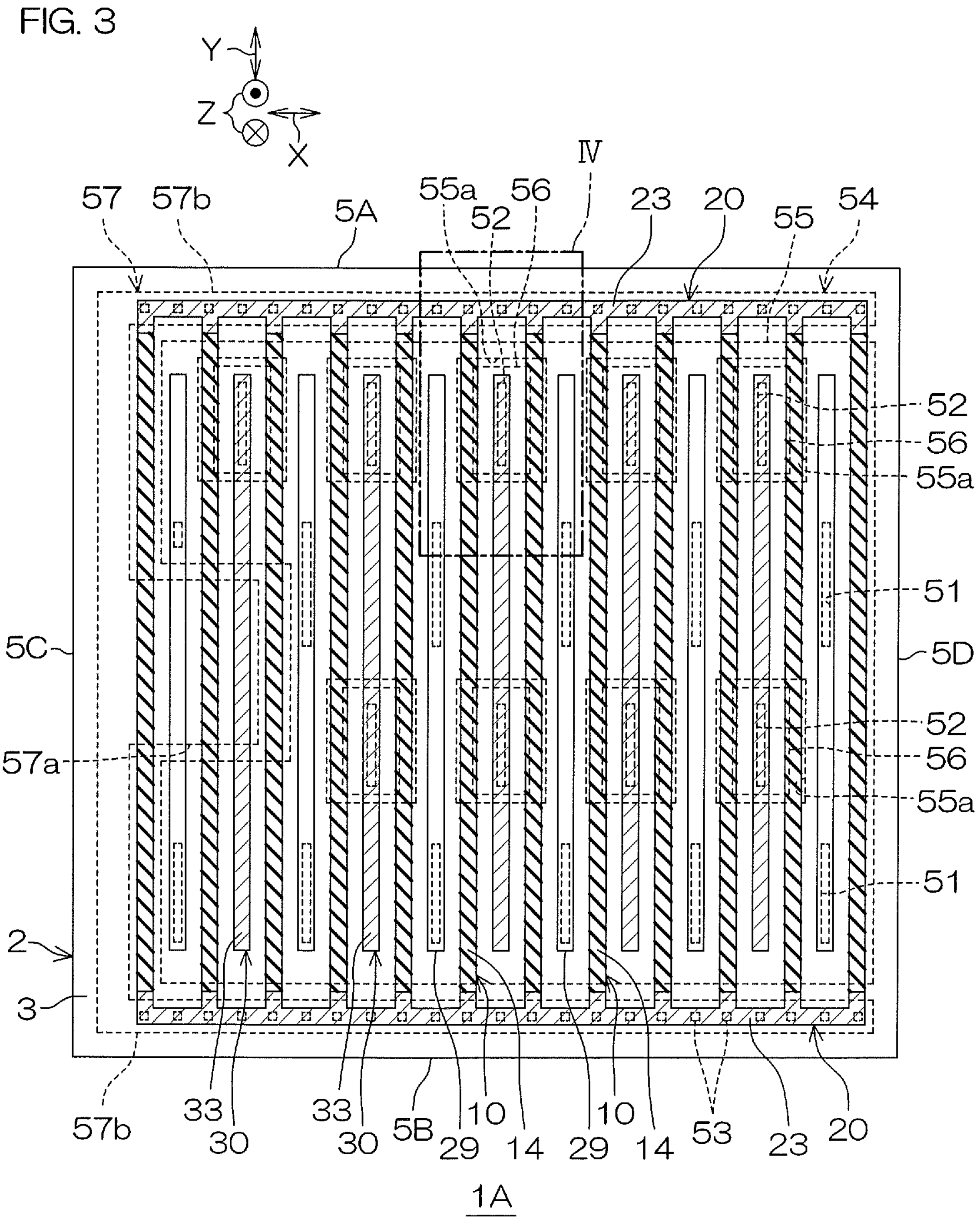
FIG. 3 is a schematic plan view showing a layout example of a first main surface of a chip according to the first embodiment.
Figure 4:
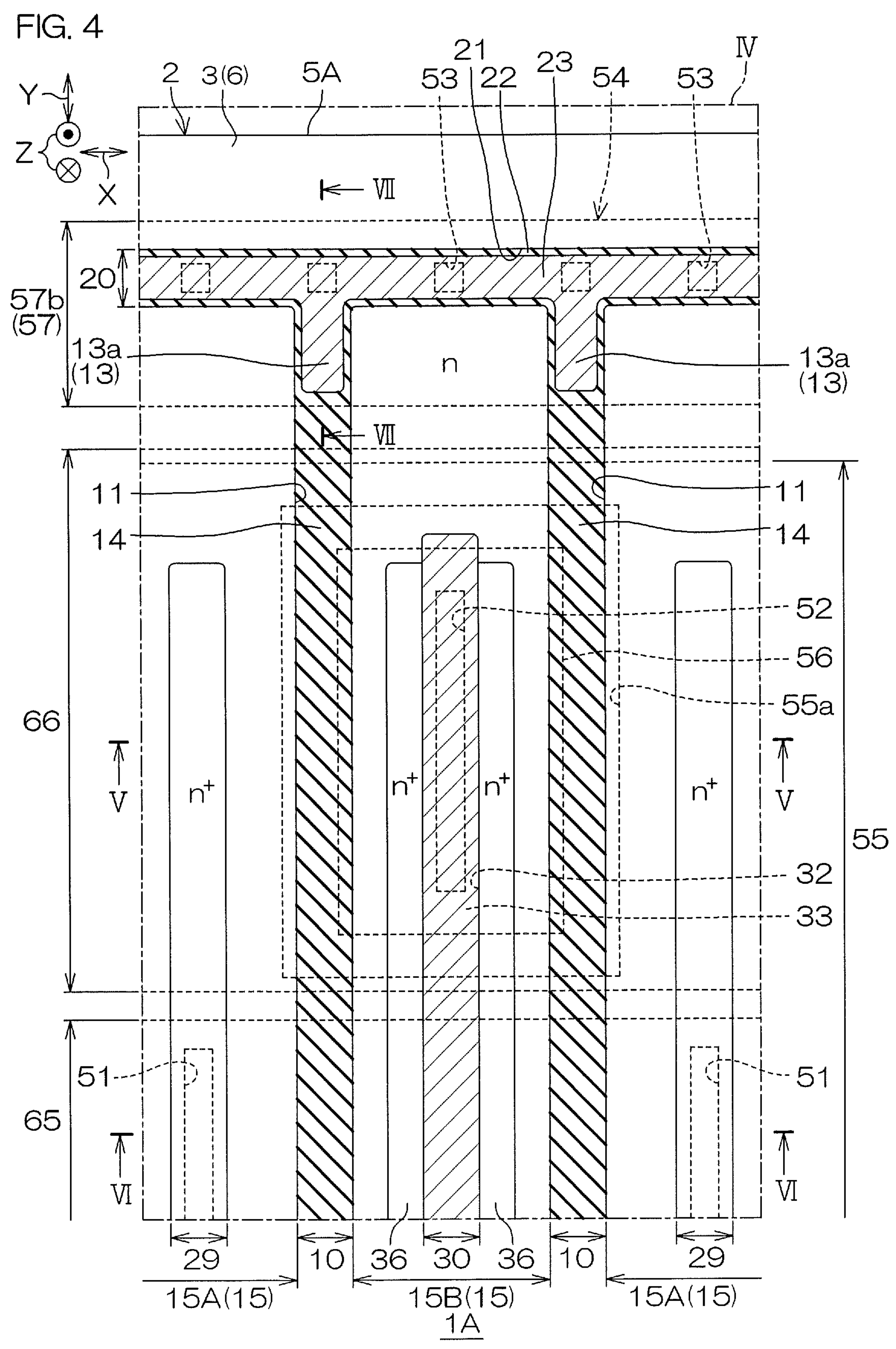
FIG. 4 is an enlarged view of a region IV shown in FIG. 3.
Figure 5:
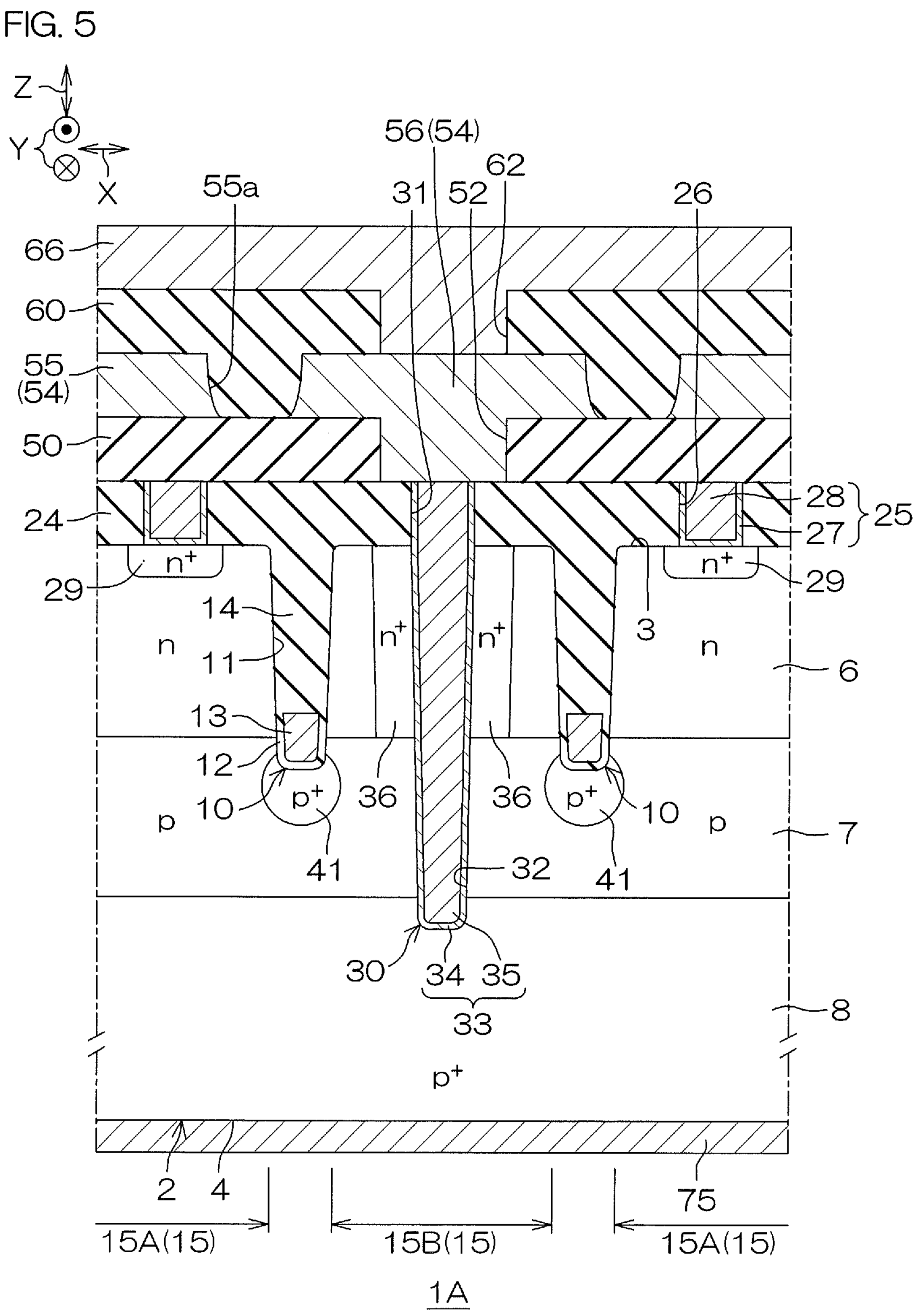
FIG. 5 is a cross-sectional view taken along line V-V shown in FIG. 4.
Figure 6:
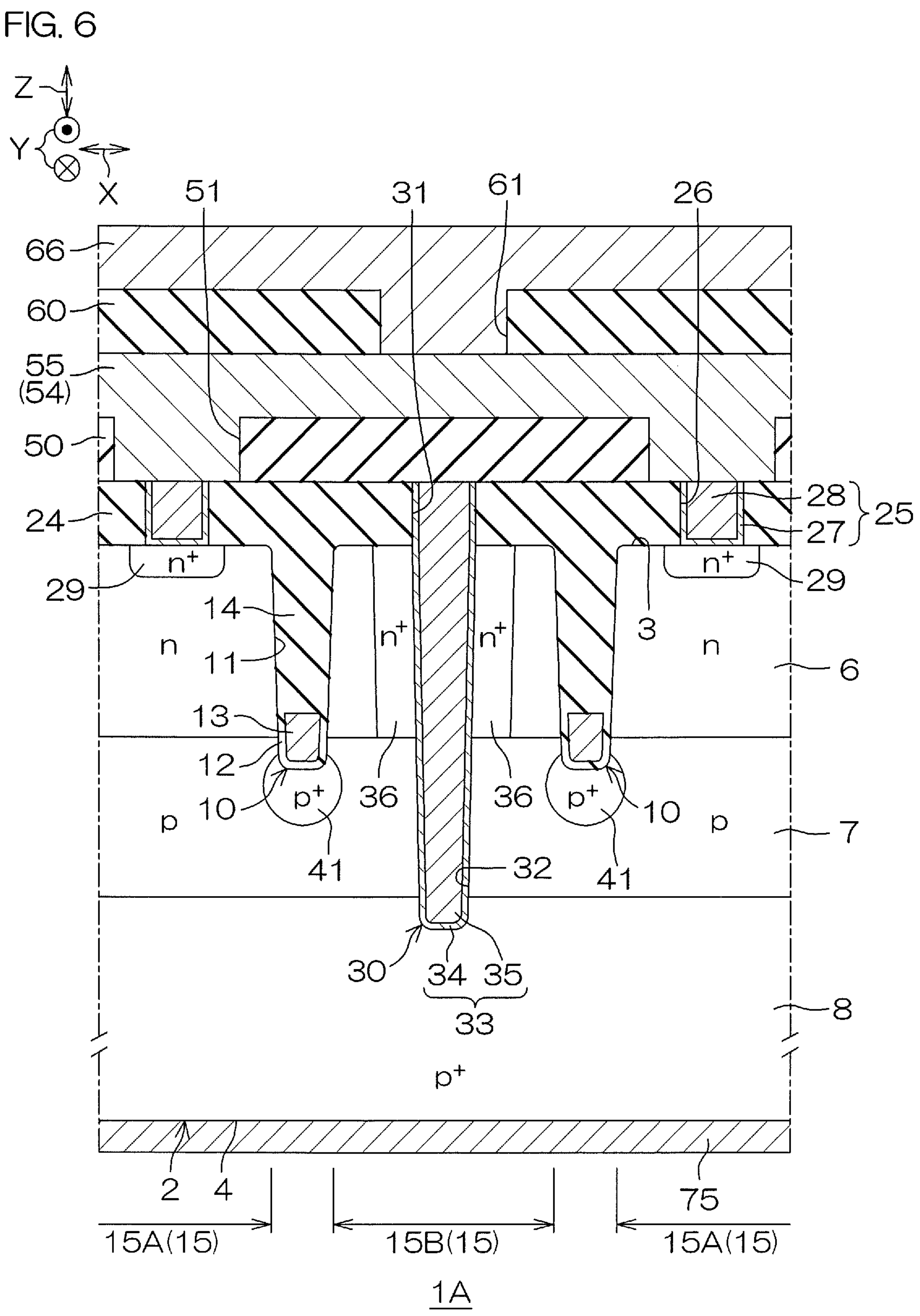
FIG. 6 is a cross-sectional view taken along line VI-VI shown in FIG. 4.
Figure 7:
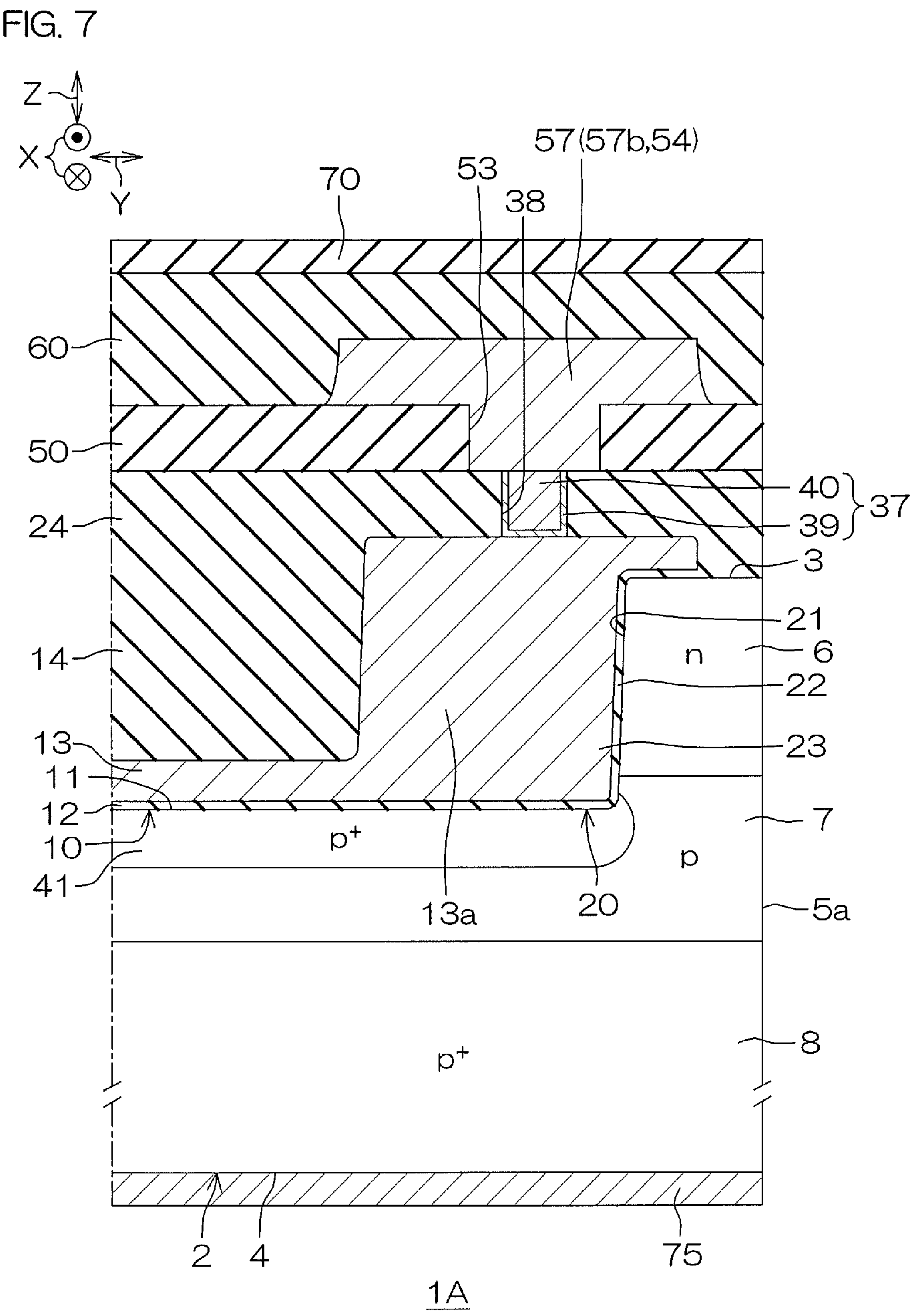
FIG. 7 is a cross-sectional view taken along line VII-VII shown in FIG. 4.

FIG. 1 is a schematic plan view showing a semiconductor device 1A according to a first embodiment. FIG. 2 is a cross-sectional view taken along line II-II shown in FIG. 1. FIG. 3 is a schematic plan view showing a layout example of a first main surface 3 of a chip 2 according to the first embodiment. FIG. 4 is an enlarged view of a region IV shown in FIG. 3. FIG. 5 is a cross-sectional view taken along line V-V shown in FIG. 4. FIG. 6 is a cross-sectional view taken along line VI-VI shown in FIG. 4. FIG. 7 is a cross-sectional view taken along line VII-VII shown in FIG. 4.

Figure 8:
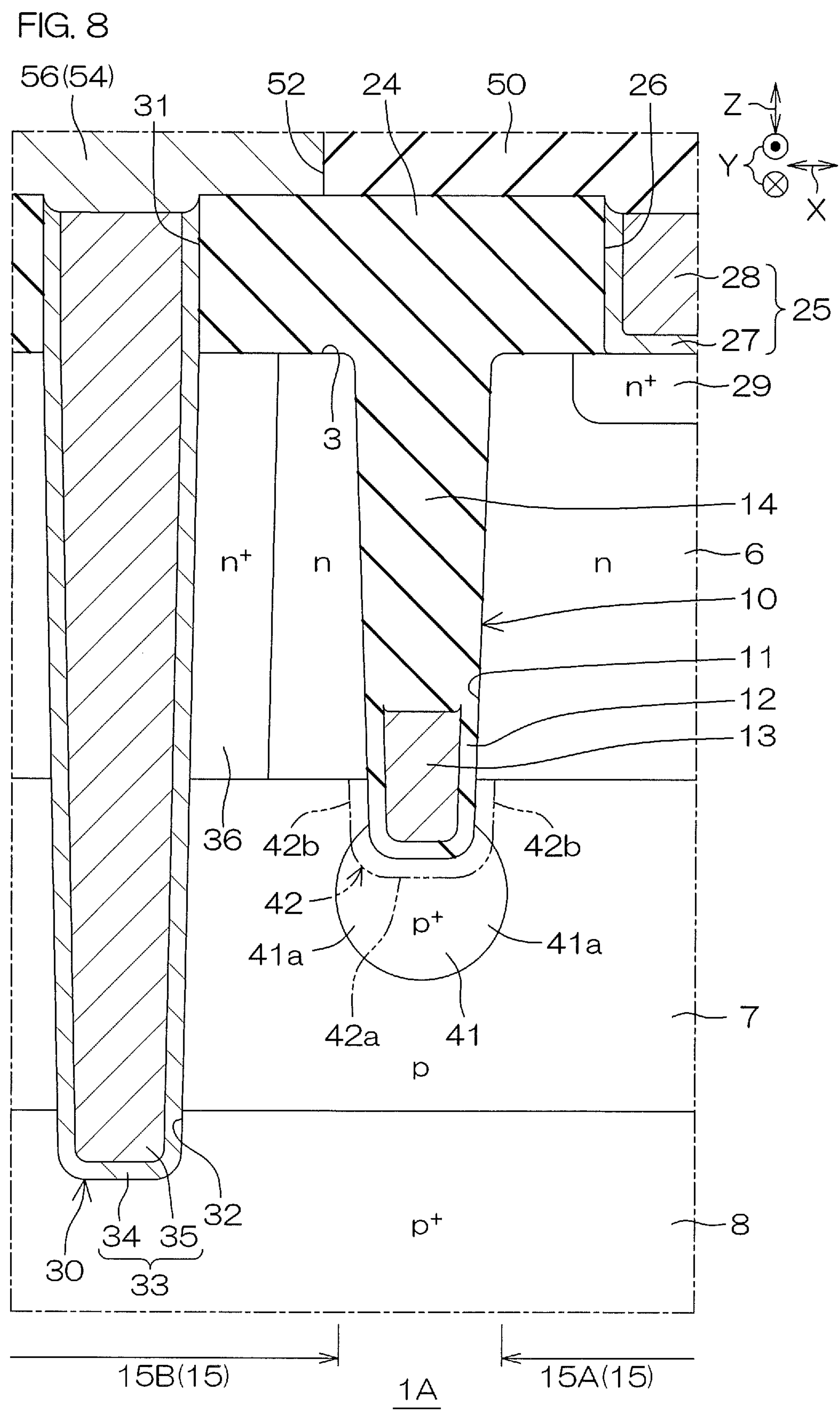
FIG. 8 is an enlarged cross-sectional view showing a major portion inside the chip.
Figure 9:
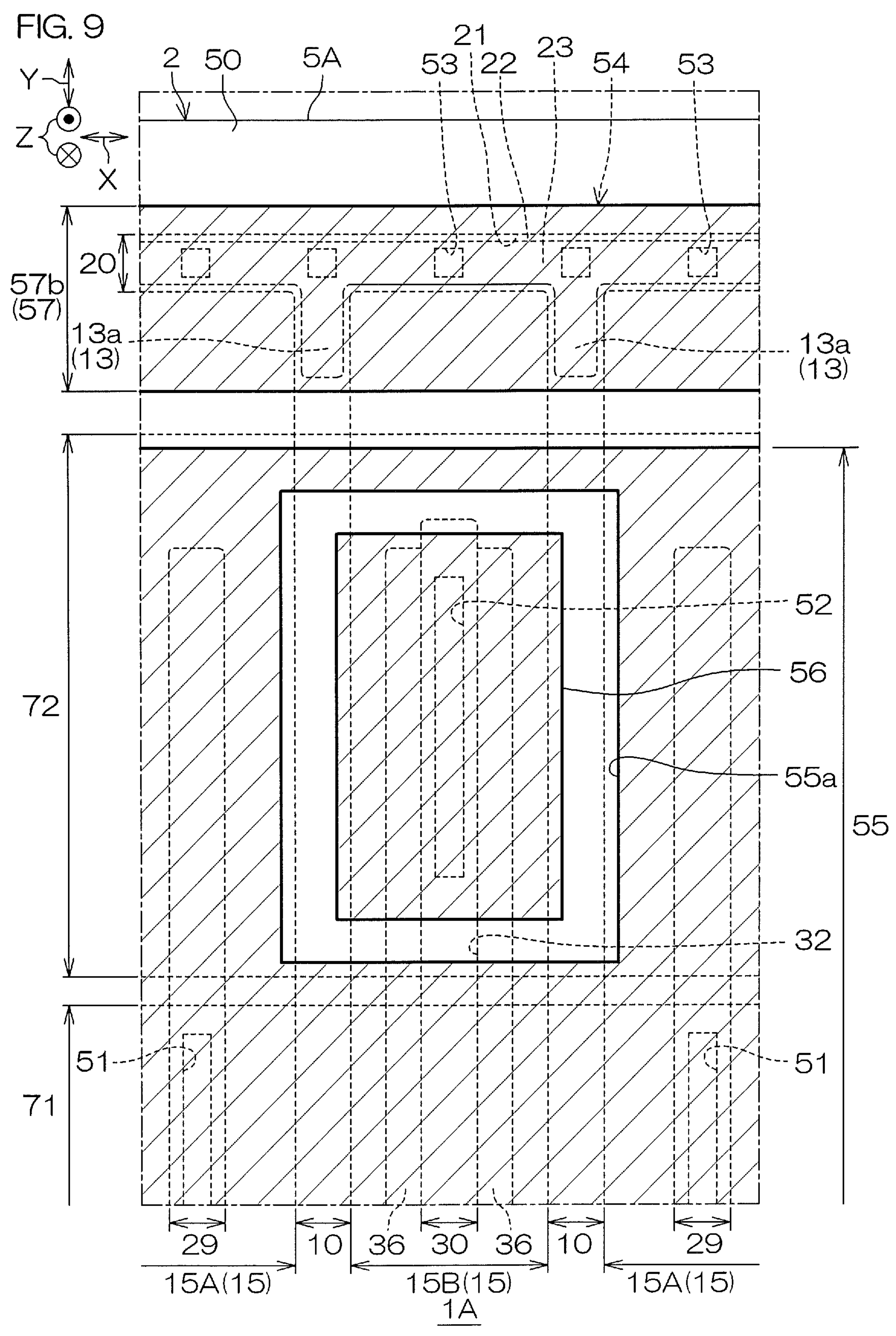
FIG. 9 is an enlarged view corresponding to the region shown in FIG. 4, the view showing a layout example of a first layer wiring arranged on the chip.
Figure 10:
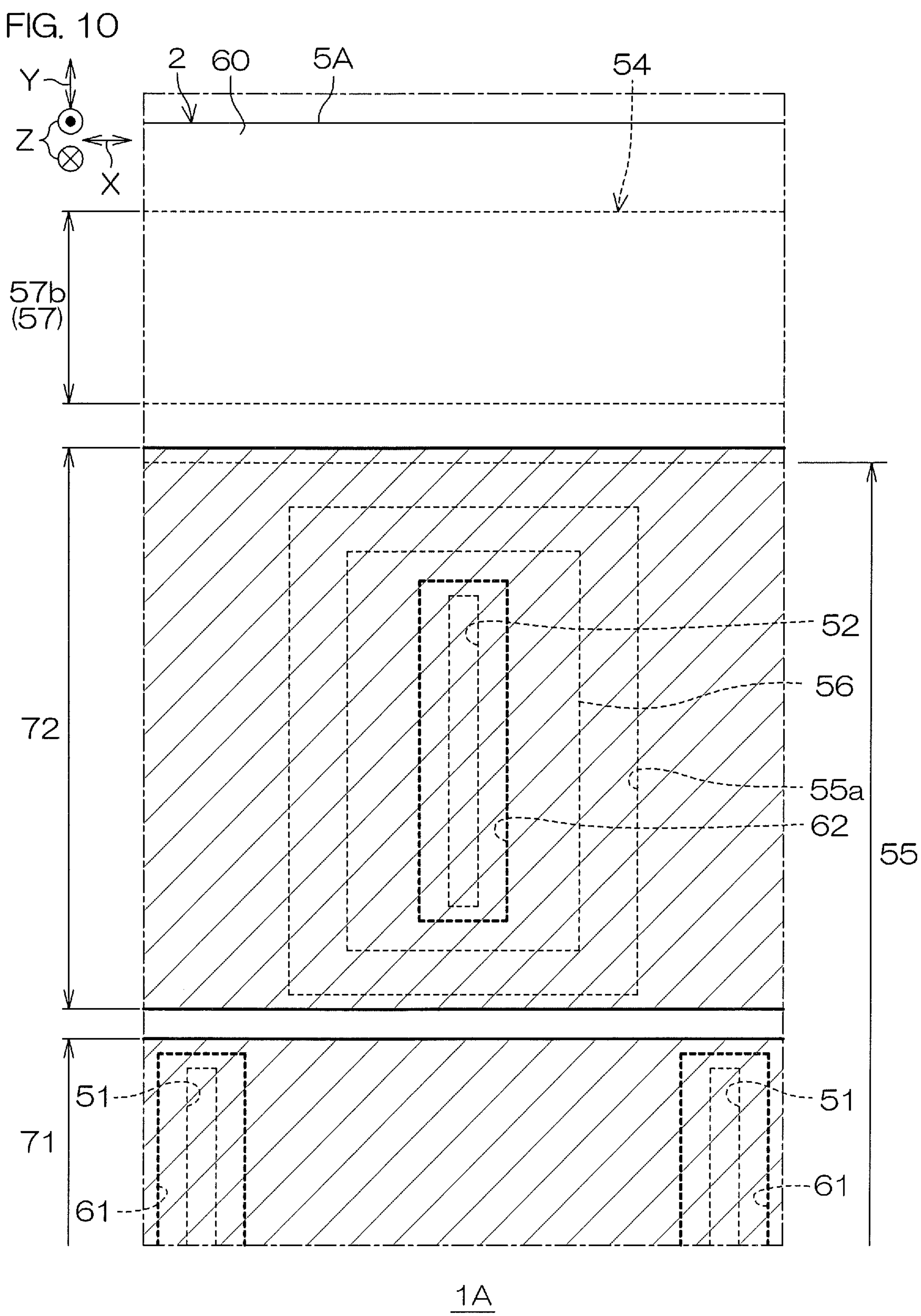
FIG. 10 is an enlarged view corresponding to the region shown in FIG. 4, the view showing a layout example of a second layer wiring arranged on the chip.

FIG. 8 is an enlarged cross-sectional view showing a major portion inside the chip 2. FIG. 9 is an enlarged view corresponding to the region shown in FIG. 4, the view showing a layout example of a first interlayer wiring 54 arranged on the chip 2. FIG. 10 is an enlarged view corresponding to the region shown in FIG. 4, the view showing a layout example of a second interlayer wiring 64 arranged on the chip 2.

With reference to FIGS. 1 to 10, the semiconductor device 1A is a switching device including a trench gate lateral type metal insulator semiconductor field effect transistor (MISFET) structure as an example of an electric field effect transistor in this embodiment. The semiconductor device 1A includes the chip 2 (semiconductor chip) formed in a rectangular parallelepiped shape. The chip 2 includes a monocrystal of Si (silicon) or a wide-bandgap semiconductor. The wide-bandgap semiconductor is a semiconductor having a bandgap exceeding a bandgap of Si. The chip 2 may be an Si chip or an SiC (silicon carbide) chip.

The chip 2 includes the first main surface 3 on one side, a second main surface 4 on the other side, and first to fourth side surfaces 5A to 5D that connect the first main surface 3 and the second main surface 4. The first main surface 3 and the second main surface 4 are formed in a square shape in a plan view seen from the normal direction Z along the thickness direction of the chip 2 (hereinafter, simply referred to as "a plan view"). The second main surface 4 may be a grinding surface having a grinding mark.

The first side surface 5A and the second side surface 5B extend in the first direction X along the first main surface 3 and oppose (reverse) the second direction Y which crosses (specifically, is orthogonal to) the first direction X. The third side surface 5C and the fourth side surface 5D extend in the second direction Y and oppose the first direction X. A length of one side of the chip 2 (length of each of the first to fourth side surfaces 5A to 5D in a plan view) may be not less than 0.5 μmm and not more than 5 μmm.

The semiconductor device 1A includes an n-type (first conductivity type) first semiconductor region 6 formed in a region on the first main surface 3 side in the chip 2. The first semiconductor region 6 may be referred to as the "drift layer." The first semiconductor region 6 is formed in the chip 2 while being spaced from the second main surface 4 on the first main surface 3 side. The first semiconductor region 6 is formed in a layer shape extending along the first main surface 3 in a surface layer portion of the first main surface 3, and exposed from the entire region of the first main surface 3 and parts of the first to fourth side surfaces 5A to 5D.

As a matter of course, the first semiconductor region 6 may be formed in an inward portion of the first main surface 3 while being spaced from the first to fourth side surfaces 5A to 5D in a plan view. The first semiconductor region 6 may have an n-type impurity concentration of not less than $1\times10^{15}$ $cm^{-3}$ and not more than $1\times10^{17}$ $cm^{-3}$. The first semiconductor region 6 may have a thickness of not less than 0.1 μm and not more than 10 μm (preferably, not less than 0.5 μm and not more than 2 μm).

The first semiconductor region 6 preferably includes a pentavalent element having a relatively large diffusion coefficient (n-type impurity). The first semiconductor region 6 preferably includes phosphorus as an example of the pentavalent element. In this embodiment, the first semiconductor region 6 is formed by adding the n-type impurity into a p-type epitaxial layer. That is, the first semiconductor region 6 includes the n-type impurity and a p-type impurity (trivalent element), and has the n-type impurity concentration exceeding a p-type impurity concentration. As a matter of course, the first semiconductor region 6 may be formed by a pure n-type epitaxial layer.

The semiconductor device 1A includes a p-type (second conductivity type) second semiconductor region 7 formed in a region on the second main surface 4 side than the first semiconductor region 6 in the chip 2. The second semiconductor region 7 may be referred to as the "channel forming layer." The second semiconductor region 7 may have a p-type impurity concentration of not less than $1\times10^{14}$ $cm^{-3}$ and not more than $1\times10^{17}$ $cm^{-3}$ (in this embodiment, approximately $1\times10^{16}$ $cm^{-3}$).

The second semiconductor region 7 is formed in a layer shape extending along the first main surface 3 (first semiconductor region 6) in the chip 2, and exposed from parts of the first to fourth side surfaces 5A to 5D. In a case where the first semiconductor region 6 is formed while being spaced inward from a peripheral edge of the first main surface 3, the second semiconductor region 7 may be exposed from a peripheral edge portion of the first main surface 3. The second semiconductor region 7 is electrically connected to the first semiconductor region 6 in the chip 2. Specifically, the second semiconductor region 7 forms a pn junction portion with the first semiconductor region 6.

The second semiconductor region 7 may have a thickness exceeding 0 μm and not more than 50 μm (preferably, not less than 1 μm and not more than 10 μm). The second semiconductor region 7 may have a thickness exceeding the thickness of the first semiconductor region 6. In this embodiment, the second semiconductor region 7 is formed by a p-type epitaxial layer.

The semiconductor device 1A includes a p-type third semiconductor region 8 formed in a region on the second main surface 4 side than the second semiconductor region 7 in the chip 2. The third semiconductor region 8 may be referred to as the "base layer." The third semiconductor region 8 may have a p-type impurity concentration higher than that of the second semiconductor region 7. That is, the third semiconductor region 8 may be formed as a low resistive region (p-type high concentration region) having a resistance value lower than that of the second semiconductor region 7 (p-type low concentration region).

The p-type impurity concentration of the third semiconductor region 8 may be not less than $1\times10^{18}$ $cm^{-3}$ and not more than $1\times10^{21}$ $cm^{-3}$ (in this embodiment, approximately $1\times10^{19}$ $cm^{-3}$). As a matter of course, the third semiconductor region 8 may have a p-type impurity concentration substantially equal to the second semiconductor region 7. In this case, the third semiconductor region 8 may be regarded as a part of the second semiconductor region 7.

The third semiconductor region 8 is formed in a layer shape extending along the second main surface 4 (first main surface 3) in a region between the second main surface 4 and the second semiconductor region 7, and exposed from the entire region of the second main surface 4 and parts of the first to fourth side surfaces 5A to 5D. The third semiconductor region 8 has a thickness exceeding the thickness of the first semiconductor region 6. The thickness of the third semiconductor region 8 exceeds the thickness of the second semiconductor region 7.

The thickness of the third semiconductor region 8 may be not less than 10 μm and not more than 1000 μm (preferably, not less than 50 μm and not more than 500 μm). In this embodiment, the third semiconductor region 8 is formed by a p-type semiconductor substrate. In a case where a conductivity type of the third semiconductor region 8 is an n-type, the third semiconductor region 8 is formed by an n-type semiconductor substrate.

The semiconductor device 1A includes a plurality of first trench structures 10 (first groove structures) formed in the first main surface 3. The first trench structures 10 may be referred to as the "trench gate structures." The plurality of first trench structures 10 are respectively formed in the inward portion of the first main surface 3 while being spaced from the peripheral edge of the first main surface 3.

The plurality of first trench structures 10 are arrayed while being spaced from each other in the first direction X, and respectively formed in a band shape extending in the second direction Y. That is, the plurality of first trench structures 10 are formed in a stripe shape extending in the second direction Y in a plan view. Each of the first trench structures 10 has a first end portion on one side and a second end portion on the other side regarding the second direction Y.

The plurality of first trench structures 10 pass through the first semiconductor region 6 so as to reach the second semiconductor region 7. In this embodiment, each of the first trench structures 10 has a bottom wall positioned in the second semiconductor region 7. The plurality of first trench structures 10 are arranged to respectively control inversion and non-inversion of a channel (channel 42 to be described later) in the second semiconductor region 7.

The plurality of first trench structures 10 may be arrayed at intervals of not less than 0.02 μm and not more than 20 μm (preferably, not less than 0.2 μm and not more than 5 μm). The plurality of first trench structures 10 are preferably arrayed at substantially equal intervals in the first direction X. Each of the first trench structures 10 may have a width of not less than 0.01 μm and not more than 10 μm (preferably, not less than 0.1 μm and not more than 0.5 μm) regarding the first direction X. Each of the first trench structures 10 may have a depth of not less than 0.2 μm and not more than 30 μm (preferably, not less than 0.5 μm and not more than 10 μm).

Hereinafter, an internal structure of a single first trench structure 10 will be described. The first trench structure 10 includes a first trench 11, a gate insulating film 12 (control insulating film), a gate electrode 13 (control electrode), and an embedded insulator 14. The first trench 11 may be referred to as the "gate trench." The first trench 11 is formed in the first main surface 3 and partitions a wall surface (a side wall and the bottom wall) of the first trench structure 10. The first semiconductor region 6 and the second semiconductor region 7 are exposed from the wall surface of the first trench 11.

The first trench 11 may be formed in a tapered shape in which an opening width is narrowed down from the first main surface 3 side toward the bottom wall side in a cross-sectional view. As a matter of course, the first trench 11 may be formed perpendicularly with respect to the first main surface 3. A bottom wall side corner portion of the first trench 11 may be formed in a curved shape. As a matter of course, the entire bottom wall of the first trench 11 may be formed in a shape curved toward the second main surface 4 side.

The gate insulating film 12 covers the side wall and the bottom wall of the first trench 11 in a film shape. In this embodiment, the gate insulating film 12 covers the side wall and the bottom wall on the bottom wall side of the first trench 11, and partitions a recess space on the bottom wall side of the first trench 11. The gate insulating film 12 may have a thickness of not less than 5 nm and not more than 1000 nm regarding the normal direction of the wall surface of the first trench 11.

The gate insulating film 12 includes at least one type of a silicon oxide film, a silicon nitride film, an aluminum oxide film, a zirconium oxide film, a hafnium oxide film, and a tantalum oxide film. The gate insulating film 12 is preferably made of the silicon oxide film. The gate insulating film 12 is particularly preferably made of an oxide (thermally oxidized film) of the chip 2.

The gate electrode 13 is embedded in the first trench 11 while sandwiching the gate insulating film 12. Specifically, the gate electrode 13 is embedded in the recess space partitioned by the gate insulating film 12 on the bottom wall side of the first trench 11, and opposes the second semiconductor region 7 across the gate insulating film 12. The gate electrode 13 passes through a depth position of a border portion between the first semiconductor region 6 and the second semiconductor region 7 in the depth direction of the first trench 11.

That is, the gate electrode 13 has an upper end portion positioned within a thickness range between the first main surface 3 and a bottom portion of the first semiconductor region 6 (second semiconductor region 7), and a lower end portion positioned within a thickness range between the bottom portion of the first semiconductor region 6 (second semiconductor region 7) and the bottom wall of the first trench 11. In this embodiment, the upper end portion of the gate electrode 13 is formed flatly. In this embodiment, the gate electrode 13 is embedded while being spaced from the first main surface 3 on the bottom wall side of the first trench 11. Specifically, the gate electrode 13 is embedded while being spaced from a depth position of an intermediate portion of the first trench 11 on the bottom wall side of the first trench 11.

The gate electrode 13 includes a plurality of pull-out portions **13*a* pulled out from the bottom wall side of the first trench 11 to the opening side. The number of the plurality of pull-out portions 13*a* is arbitrary. In this embodiment, the plurality of pull-out portions 13*a* include a pair of pull-out portions 13*a* separated from each other in the second direction Y. In this embodiment, the pair of pull-out portions 13*a* are respectively formed in both end portions of the first trench 11. The plurality of pull-out portions 13*a*** respectively extend in the second direction Y in a plan view.

The plurality of pull-out portions **13*a* partition the wall surface of the first trench 11 and an opening-side recess on the opening side of the first trench 11. The opening-side recess is partitioned in a band shape extending in the second direction Y in a plan view. The plurality of pull-out portions 13*a* may project to the upper side than the first main surface 3. The plurality of pull-out portions 13*a* may be pulled out from the first trench 11 onto the first main surface 3 while sandwiching a part of the gate insulating film 12. As a matter of course, the plurality of pull-out portions 13*a* may be positioned on the bottom wall side of the first trench 11 with respect to the first main surface 3**.

The gate electrode 13 may include at least one of metal and non-metal conductor. The gate electrode 13 may include at least one type of tungsten, aluminum, copper, aluminum alloy, copper alloy, and conductive polysilicon. The gate electrode 13 preferably includes non-metal conductor (conductive polysilicon). The conductive polysilicon may be p-type polysilicon or n-type polysilicon. The conductive polysilicon is preferably the n-type polysilicon.

The embedded insulator 14 is embedded on the opening side of the first trench 11 so as to cover the gate electrode 13 in the first trench 11. Specifically, the embedded insulator 14 is embedded in the opening-side recess partitioned by the gate electrode 13. The embedded insulator 14 is provided as a field insulator that mitigates an electric field with respect to the first trench 11. The embedded insulator 14 is arranged so that an area to oppose the first semiconductor region 6 exceeds an area of the gate electrode 13 to oppose the first semiconductor region 6.

The embedded insulator 14 has a thickness exceeding the thickness of the gate electrode 13 regarding the depth direction of the first trench 11. The embedded insulator 14 includes at least one type of a silicon oxide film, a silicon nitride film, an aluminum oxide film, a zirconium oxide film, a hafnium oxide film, and a tantalum oxide film. The embedded insulator 14 is preferably made of the silicon oxide film. The embedded insulator 14 is preferably made of the same material as the gate insulating film 12. In this case, preferably, the embedded insulator 14 is made of an insulating evaporation film, and has a density different from the gate insulating film 12.

The semiconductor device 1A includes a plurality of mesa portions 15 partitioned in the first main surface 3 (first semiconductor region 6) by the plurality of first trench structures 10. The plurality of mesa portions 15 are respectively partitioned in a band shape extending in the second direction Y in a region between plural pairs of first trench structures 10 adjacent to each other. The plurality of mesa portions 15 include a plurality of first mesa portions 15A (first regions) and a plurality of second mesa portions 15B (second regions).

The plurality of first mesa portions 15A are arrayed while being spaced from each other in the first direction X so as to sandwich a single mesa portion 15. The plurality of second mesa portions 15B are arrayed alternately with the plurality of first mesa portions 15A along the first direction X so as to sandwich a single first mesa portion 15A in the plurality of mesa portions 15. In this embodiment, the plurality of first mesa portions 15A are provided as the "drain mesa portions" of the MISFET, and the plurality of second mesa portions 15B are provided as the "source mesa portions" of the MISFET.

The semiconductor device 1A includes a plurality of (in this embodiment, two) trench connection structures 20 (groove connection structures) formed in the first main surface 3 so as to be connected to the first trench structures 10. The plurality of trench connection structures 20 include a trench connection structure 20 on one side (on the first side surface 5A side) that connects the first end portions of the plurality of first trench structures 10, and a trench connection structure 20 on the other side (on the second side surface 5B side) that connects the second end portions of the plurality of first trench structures 10.

The trench connection structure 20 on the other side has the same structure as the trench connection structure 20 on one side except the portion that the trench connection structure 20 on the other side is connected to the second end portions of the first trench structures 10. Hereinafter, an arrangement of the trench connection structure 20 on one side will be described, and description of an arrangement of the trench connection structure 20 on the other side will be omitted.

The trench connection structure 20 is formed in the inward portion of the first main surface 3 while being spaced from the peripheral edge of the first main surface 3. The trench connection structure 20 is formed in a band shape extending in the direction (specifically, in the second direction Y) that crosses the direction in which the plurality of first trench structures 10 extend, and connected to one end portions of the plurality of first trench structures 10. The trench connection structure 20 passes through the first semiconductor region 6 so as to reach the second semiconductor region 7. That is, the trench connection structure 20 partitions the plurality of mesa portions 15 (the plurality of first mesa portions 15A and the plurality of second mesa portions 15B) together with the plurality of first trench structures 10.

The trench connection structure 20 may have a width of not less than 0.01 μm and not more than 10 μm (preferably, not less than 0.1 μm and not more than 2 μm) regarding the second direction Y. The trench connection structure 20 may have a substantially equal width to the width of the first trench structure 10. The trench connection structure 20 may respectively have a depth of not less than 0.2 μm and not more than 30 μm (preferably, not less than 0.5 μm and not more than 10 μm). The trench connection structure 20 may have a substantially equal depth to the depth of the first trench structure 10.

The trench connection structure 20 includes a connection trench 21, a connection insulating film 22, and a connection electrode 23. The connection trench 21 is formed in the first main surface 3 so as to communicate with the plurality of first trenches 11, and partitions a wall surface (a side wall and a bottom wall) of the trench connection structure 20. The wall surface (the side wall and the bottom wall) of the trench connection structure 20 continues to the wall surfaces (the side walls and the bottom walls) of the plurality of first trenches 11. The first semiconductor region 6 and the second semiconductor region 7 are exposed from the wall surface of the connection trench 21.

The connection trench 21 may be formed in a tapered shape in which an opening width is narrowed down from the first main surface 3 side toward the bottom wall side in a cross-sectional view. As a matter of course, the connection trench 21 may be formed perpendicularly with respect to the first main surface 3. A bottom wall side corner portion of the connection trench 21 may be formed in a curved shape. As a matter of course, the entire bottom wall of the connection trench 21 may be formed in a shape curved toward the second main surface 4 side.

The connection insulating film 22 covers the side wall and the bottom wall of the connection trench 21 in a film shape. In this embodiment, the connection insulating film 22 covers the side wall and the bottom wall on the opening side and the bottom wall side of the connection trench 21, and partitions a recess space in the connection trench 21. The connection insulating film 22 continues to the plurality of gate insulating films 12 in a portion communicating with the plurality of first trenches 11.

The connection insulating film 22 may have a thickness of not less than 5 nm and not more than 1000 nm. The connection insulating film 22 preferably has a substantially equal thickness to the thickness of the gate insulating film 12. The connection insulating film 22 includes at least one type of a silicon oxide film, a silicon nitride film, an aluminum oxide film, a zirconium oxide film, a hafnium oxide film, and a tantalum oxide film. The connection insulating film 22 is preferably made of the same material as the gate insulating layer.

The connection electrode 23 is embedded in the connection trench 21 while sandwiching the connection insulating film 22, and opposes the first semiconductor region 6 and the second semiconductor region 7. The connection electrode 23 continues to the plurality of gate electrodes 13 in a portion communicating with the plurality of first trenches 11. Specifically, the connection electrode 23 continues to the plurality of pull-out portions 13*a*. Thereby, the connection electrode 23 is fixed at the same electric potential as the gate electrodes 13.

A portion of the connection electrode 23 continuing to the pull-out portions 13*a* may be included in a constituent element of the connection electrode 23, or may be included in a constituent element of the gate electrodes 13. The connection electrode 23 has an upper end portion positioned on the first main surface 3 side with respect to the upper end portions of the gate electrodes 13. The connection electrode 23 may project to the upper side than the first main surface 3. The connection electrode 23 may be pulled out from the connection trench 21 onto the first main surface 3 while sandwiching a part of the connection insulating film 22. As a matter of course, the connection electrode 23 may be positioned on the bottom wall side of the connection trench 21 with respect to the first main surface 3.

The connection electrode 23 may include at least one of a metal and a non-metal conductor. The connection electrode 23 may include at least one type of tungsten, aluminum, copper, aluminum alloy, copper alloy, and conductive polysilicon. The connection electrode 23 is preferably made of the same material as the gate electrodes 13.

The semiconductor device 1A includes a main surface insulating film 24 that selectively covers the first main surface 3. The main surface insulating film 24 covers the plurality of first trench structures 10 and the plurality of trench connection structures 20 on the first main surface 3. In this embodiment, the main surface insulating film 24 covers the entire region of the first main surface 3, and continues to the first to fourth side surfaces 5A to 5D. The main surface insulating film 24 may have a flat surface extending along the first main surface 3. The flat surface of the main surface insulating film 24 may have a grinding mark.

The main surface insulating film 24 may have a thickness of not less than 0.1 m and not more than 2 μm. The thickness of the main surface insulating film 24 preferably exceeds the thickness of the gate insulating film 12. The main surface insulating film 24 includes at least one type of a silicon oxide film, a silicon nitride film, an aluminum oxide film, a zirconium oxide film, a hafnium oxide film, and a tantalum oxide film. The main surface insulating film 24 is preferably made of the silicon oxide film.

In this embodiment, the main surface insulating film 24 is made of the same material as the embedded insulator 14 and integrally formed with the embedded insulator 14. That is, the main surface insulating film 24 enters the plurality of first trenches 11 from the upper side of the first main surface 3 as a part of the embedded insulator 14. In other words, the main surface insulating film 24 is formed by an insulating film made by integrating portions of the plurality of embedded insulators 14, the portions projecting from the plurality of first trenches 11 in a film shape on the first main surface 3.

The semiconductor device 1A includes a plurality of first electrodes 25 electrically connected to the first semiconductor region 6 in the plurality of first mesa portions 15A. In this embodiment, the plurality of first electrodes 25 are provided as the "drain connection electrodes." The plurality of first electrodes 25 pass through the main surface insulating film 24 and are respectively connected to the plurality of first mesa portions 15A. Specifically, the plurality of first electrodes 25 are respectively arranged in a plurality of first connection openings 26 formed in the main surface insulating film 24.

The plurality of first electrodes 25 are respectively formed in a band shape extending in the direction in which the first trench structures 10 extend (that is, in the second direction Y) in a plan view. That is, the plurality of first electrodes 25 form current paths extending along the plurality of first mesa portions 15A. The plurality of first electrodes 25 are preferably respectively connected to central portions of the corresponding first mesa portions 15A while being spaced from the plurality of first trench structures 10 in a plan view.

Each of the first electrodes 25 has a length less than the length of each of the first trenches 11 regarding the second direction Y in a plan view, and is formed while being spaced inward from both end portions of each of the first trenches 11. Both end portions of the plurality of first electrodes 25 oppose the trench connection structures 20 across a part of the first semiconductor region 6 regarding the second direction Y.

The plurality of first electrodes 25 are respectively made of metal. In this embodiment, each of the first electrodes 25 has a laminated structure including a first barrier film 27 and a first electrode main body 28. The first barrier film 27 is formed in a film shape along a wall surface of the first connection opening 26. The first barrier film 27 may be formed by a titanium-based metal film. The first barrier film 27 may have a single layer structure or a laminated structure including any one of or both a titanium film and a titanium nitride film.

The first electrode main body 28 is embedded in the first connection opening 26 while sandwiching the first barrier film 27, and electrically connected to the first mesa portion 15A (first semiconductor region 6) across the first barrier film 27. The first electrode main body 28 may include at least one type of tungsten, aluminum, copper, aluminum alloy, and copper alloy. In this embodiment, the first electrode main body 28 includes tungsten. As a matter of course, each of the first electrodes 25 may have no first barrier film 27 and may be arranged only by the first electrode main body 28.

The semiconductor device 1A includes a plurality of n-type first impurity regions 29 formed in the first semiconductor region 6 in the plurality of first mesa portions 15A. That is, the plurality of first impurity regions 29 are arrayed while being spaced from each other in the first direction X so as to sandwich a single mesa portion 15 in the plurality of mesa portions 15. In this embodiment, the first impurity regions 29 are formed as the "drain regions." The plurality of first impurity regions 29 are respectively electrically connected to the plurality of first electrodes 25 in the plurality of first mesa portions 15A.

The plurality of first impurity regions 29 have an n-type impurity concentration higher than that of the first semiconductor region 6. The n-type impurity concentration of the plurality of first impurity regions 29 may be not less than $1\times10^{18}$ $cm^{-3}$ and not more than $1\times10^{21}$ $cm^{-3}$ (in this embodiment, approximately $1\times10^{19}$ $cm^{3}$). The plurality of first impurity regions 29 preferably include a pentavalent element different from the first semiconductor region 6. The plurality of first impurity regions 29 particularly preferably include a pentavalent element having a diffusion coefficient less than the diffusion coefficient of the pentavalent element of the first semiconductor region 6. The plurality of first impurity regions 29 preferably include arsenic as an example of the pentavalent element.

The plurality of first impurity regions 29 have substantially the same structures except forming positions. Hereinafter, a structure of a single first impurity region 29 will be described. The first impurity region 29 is formed in the surface layer portion of the first main surface 3 while being spaced from the plurality of first trench structures 10 in the corresponding first mesa portion 15A. The first impurity region 29 is formed in a band shape extending in the direction in which the first trench structure 10 extends (that is, in the second direction Y) in a plan view.

The first impurity region 29 is preferably formed in the central portion of the corresponding first mesa portion 15A in a plan view. The first impurity region 29 has a length less than the length of the first trench structure 10 regarding the second direction Y, and is formed while being spaced inward from both end portions of the first trench structure 10. Both end portions of the first impurity region 29 oppose the trench connection structures 20 across a part of the first semiconductor region 6 regarding the second direction Y.

The first impurity region 29 extends in the lateral direction (in the first direction X and the second direction Y) along the first main surface 3 in a cross-sectional view. Specifically, the first impurity region 29 is formed at a depth position on the first main surface 3 side with respect to the upper end portion of the gate electrode 13. The first impurity region 29 opposes the embedded insulator 14 across a part of the first semiconductor region 6 with respect to the lateral direction along the first main surface 3. The first impurity region 29 is separated from the upper end portion of the gate electrode 13 on the first main surface 3 side, and does not oppose the gate electrode 13 in the lateral direction along the first main surface 3. Thereby, an electric field applied to the plurality of first trench structures 10 is mitigated.

The first impurity region 29 may have a thickness of not less than 10 nm and not more than 150 nm (preferably, not less than 50 nm and not more than 100 nm). The first impurity region 29 is preferably formed while being spaced from the upper end portion of the gate electrode 13 with an interval of not less than 0.1 μm and not more than 2 μm (preferably, not less than 0.5 μm and not more than 1.5 μm) regarding the thickness direction of the chip 2 (normal direction Z).

The semiconductor device 1A includes a plurality of second trench structures 30 (second groove structures) formed in the first main surface 3 in the plurality of second mesa portions 15B. That is, the plurality of second trench structures 30 are respectively formed in the plurality of mesa portions 15 where there are no first impurity regions 29 among the plurality of mesa portions 15. Also, the plurality of second trench structures 30 are arrayed alternately with the plurality of first impurity regions 29 along the first direction X so as to sandwich a single first impurity region 29 in the plurality of mesa portions 15.

In this embodiment, the plurality of second trench structures 30 are respectively formed in the corresponding second mesa portions 15B while passing through the main surface insulating film 24. Specifically, the plurality of second trench structures 30 are respectively formed in the second mesa portions 15B via a plurality of second connection openings 31 formed in the main surface insulating film 24. That is, the plurality of second trench structures 30 include portions positioned in the chip 2, and portions positioned in the main surface insulating film 24.

The plurality of second trench structures 30 are respectively formed while being spaced from the plurality of first trench structures 10 in the corresponding second mesa portions 15B. The plurality of second trench structures 30 are respectively formed in a band shape extending in the direction in which the first trench structures 10 extend (that is, in the second direction Y) in a plan view. That is, the plurality of second trench structures 30 form current paths extending along the plurality of second mesa portions 15B. The plurality of second trench structures 30 are preferably respectively formed in central portions of the corresponding second mesa portions 15B in a plan view.

Each of the second trench structures 30 has a length less than the length of each of the first trenches 11 regarding the second direction Y, and is formed while being spaced inward from both end portions of each of the first trenches 11. The plurality of second trench structures 30 oppose the plurality of first impurity regions 29 across the plurality of first trench structures 10 regarding the first direction X. Both end portions of the plurality of second trench structures 30 oppose the trench connection structures 20 across a part of the first semiconductor region 6 regarding the second direction Y.

The plurality of second trench structures 30 pass through the first semiconductor region 6 so as to reach the second semiconductor region 7. In this embodiment, the plurality of second trench structures 30 are formed to be deeper than the plurality of first trench structures 10. Specifically, the plurality of second trench structures 30 pass through the first semiconductor region 6 and the second semiconductor region 7, and reach the third semiconductor region 8. Each of the second trench structures 30 has a bottom wall positioned in the third semiconductor region 8.

An interval between the first trench structure 10 and the second trench structure 30 may be not less than 0.01 μm and not more than 10 μm (preferably, not less than 0.1 μm and not more than 0.5 μm). Each of the second trench structures 30 may have a width of not less than 0.01 μm and not more than 10 μm (preferably, not less than 0.1 μm and not more than 0.5 μm) regarding the first direction X. The width of the plurality of second trench structures 30 may be not less than the width of the first trench structure 10 or may be less than the width of the first trench structure 10. Each of the second trench structures 30 may have a depth of not less than 0.2 μm and not more than 30 μm (preferably, not less than 0.5 μm and not more than 10 μm).

Each of the second trench structures 30 has a trench electrode structure electrically connected to the first semiconductor region 6 and the second semiconductor region 7. Hereinafter, an internal structure of a single second trench structure 30 will be described. The second trench structure 30 includes a second trench 32 and a second electrode 33. In this embodiment, the second electrode 33 is provided as the "source connection electrode." That is, in this embodiment, the second trench structure 30 is provided as the "trench source structure."

The second trench 32 is formed in the first main surface 3 while passing through the main surface insulating film 24, and partitions a wall surface (a side wall and the bottom wall) of the second trench structure 30. In this embodiment, the second trench 32 includes the second connection opening 31 formed in the main surface insulating film 24. Specifically, the second trench 32 passes through the main surface insulating film 24, the first semiconductor region 6, and the second semiconductor region 7 so as to reach the third semiconductor region 8. The first semiconductor region 6, the second semiconductor region 7, the third semiconductor region 8, and the main surface insulating film 24 are exposed from the wall surface of the second trench 32.

The second trench 32 may be formed in a tapered shape in which an opening width is narrowed down from the first main surface 3 side toward the bottom wall side in a cross-sectional view. As a matter of course, the second trench 32 may be formed perpendicularly with respect to the first main surface 3. A bottom wall side corner portion of the second trench 32 may be formed in a curved shape. As a matter of course, the entire bottom wall of the second trench 32 may be formed in a shape curved toward the second main surface 4 side.

The second electrode 33 is embedded in the second trench 32 via no insulating film. The second electrode 33 is mechanically and electrically connected to the first semiconductor region 6, the second semiconductor region 7, and the third semiconductor region 8 in the second trench 32, and mechanically connected to the main surface insulating film 24. The second electrode 33 has a portion positioned on the chip 2 side with respect to the first main surface 3 and a portion positioned on the main surface insulating film 24 side with respect to the first main surface 3 in the second trench 32. That is, the second electrode 33 has an upper end portion projecting to the upper side than the first main surface 3. Also, the upper end portion of the second electrode 33 projects to the upper side than the upper end portion of the gate electrode 13 (upper end portion of the pull-out portion 13*a*).

The second electrode 33 may include at least one of metal and non-metal conductor. The second electrode 33 is preferably made of a conductive material different from the gate electrode 13. The second electrode 33 preferably includes metal. In this embodiment, the second electrode 33 respectively has a laminated structure including a second barrier film 34 and a second electrode main body 35.

The second barrier film 34 is formed in a film shape along the side wall and the bottom wall of the second trench 32, and covers the first semiconductor region 6, the second semiconductor region 7, and the main surface insulating film 24 in the second trench 32. The second barrier film 34 partitions a recess space in the second trench 32. The second barrier film 34 may be formed by a titanium-based metal film. The second barrier film 34 may have a single layer structure or a laminated structure including any one of or both a titanium film and a titanium nitride film. The second barrier film 34 is preferably made of the same material as the first barrier film 27.

The second electrode main body 35 is embedded in the second trench 32 while sandwiching the second barrier film 34, and covers the first semiconductor region 6, the second semiconductor region 7, and the main surface insulating film 24 while sandwiching the second barrier film 34. The second electrode main body 35 is electrically connected to the first semiconductor region 6 and the second semiconductor region 7 via the second barrier film 34.

The second electrode main body 35 may include at least one type of tungsten, aluminum, copper, aluminum alloy, and copper alloy. The second electrode main body 35 is preferably made of the same material as the first electrode main body 28. In this embodiment, the second electrode main body 35 includes tungsten. As a matter of course, the second electrode main body 35 may have no second barrier film 34 but may be arranged only by the second electrode main body 35.

The semiconductor device 1A includes a plurality of n-type second impurity regions 36 formed in the first semiconductor region 6 in the plurality of second mesa portions 15B. That is, the plurality of second impurity regions 36 are formed in the mesa portions 15 different from the plurality of first impurity regions 29. The plurality of second impurity regions 36 are arrayed alternately with the plurality of first impurity regions 29 along the first direction X so as to sandwich a single first impurity region 29. In this embodiment, the second impurity regions 36 are formed as the "source regions." The plurality of second impurity regions 36 are respectively electrically connected to the plurality of second electrodes 33.

The plurality of second impurity regions 36 have an n-type impurity concentration higher than that of the first semiconductor region 6. The n-type impurity concentration of the plurality of second impurity regions 36 may be not less than $1\times10^{18}$ $cm^{-3}$ and not more than $1\times10^{21}$ $cm^{-3}$ (in this embodiment, approximately $1\times10^{19}$ $cm^{-3}$). The n-type impurity concentration (peak value) of the plurality of second impurity regions 36 is preferably substantially equal to the n-type impurity concentration (peak value) of the plurality of first impurity regions 29.

The plurality of second impurity regions 36 preferably include a pentavalent element different from the first semiconductor region 6. The plurality of second impurity regions 36 particularly preferably include a pentavalent element having a diffusion coefficient less than the diffusion coefficient of the pentavalent element of the second semiconductor region 7. The plurality of second impurity regions 36 preferably include arsenic as an example of the pentavalent element.

In this embodiment, a set of plural second impurity regions 36 are formed in the corresponding second mesa portion 15B. In this embodiment, the plurality of second impurity regions 36 are respectively formed on both sides of the second trench 32 in each of the second mesa portions 15B. That is, in this embodiment, at least two second impurity regions 36 oppose each other across a single second trench structure 30 in each of the second mesa portions 15B. The plurality of second impurity regions 36 have substantially the same structures except forming positions. Hereinafter, a structure of a single second impurity region 36 will be described.

In this embodiment, the second impurity region 36 is formed while being spaced from the first trench structure 10 on the second trench structure 30 side in the corresponding second mesa portion 15B. The second impurity region 36 is formed in a band shape extending in the direction in which the second trench structure 30 extends (that is, in the second direction Y) in a plan view. The second impurity region 36 is connected to the second trench structure 30 in a plan view. The second impurity region 36 is directly connected to the second electrode 33.

The second impurity region 36 has a length less than the length of each of the first trench structures 10 regarding the second direction Y, and is formed while being spaced inward from both end portions of each of the first trench structures 10. Both end portions of the second impurity region 36 oppose the trench connection structures 20 across a part of the first semiconductor region 6 regarding the second direction Y.

The second impurity region 36 extends in the vertical direction (normal direction Z) along the wall surface of the second trench structure 30 in a cross-sectional view, and is formed to be deeper than the first impurity region 29. That is, the second impurity region 36 has a bottom portion positioned on the second semiconductor region 7 side of a bottom portion of the first impurity region 29 regarding the thickness direction of the chip 2. In a case where the second trench structure 30 is formed in a tapered shape, the second impurity region 36 may extend so as to be inclined obliquely with respect to the first main surface 3 along the side wall (taper angle) of the second trench structure 30.

The second impurity region 36 extends in a layer shape along the normal direction Z in a region between the first main surface 3 and the second semiconductor region 7 so as to pass through the depth position of the upper end portion of the gate electrode 13. The second impurity region 36 opposes the embedded insulator 14 and the gate electrode 13 across a part of the first semiconductor region 6 regarding the lateral direction along the first main surface 3.

The second impurity region 36 is in contact with the main surface insulating film 24 in a portion exposed from the first main surface 3. In this embodiment, the second impurity region 36 is connected to the second semiconductor region 7. Thereby, the second impurity region 36 is electrically connected to the entire region of a part of the second electrode 33 positioned within a thickness range of the first main surface 3 and the bottom portion of the first semiconductor region 6.

The second impurity region 36 may be formed so that a width along the first direction X becomes uniform from the first main surface 3 toward the second semiconductor region 7 side. The second impurity region 36 may be formed so that the width along the first direction X is gradually reduced from the first main surface 3 toward the second semiconductor region 7 side. The second impurity region 36 may be formed so that the n-type impurity concentration becomes uniform from the first main surface 3 toward the second semiconductor region 7 side. The second impurity region 36 may be formed so that the n-type impurity concentration is gradually reduced from the first main surface 3 toward the second semiconductor region 7 side.

In the second impurity region 36, an offset region may be formed in a portion connected to the second semiconductor region 7. The offset region is a p-type region including the trivalent element (p-type impurity) of the second semiconductor region 7 and the pentavalent element (n-type impurity) of the second impurity region 36, and having a p-type impurity concentration which exceeds the n-type impurity concentration.

As a matter of course, the offset region may replace a part of the second semiconductor region 7 with an n-type region so that a part of the second semiconductor region 7 becomes a part of the second impurity region 36. Also, the second impurity region 36 may be formed in the first semiconductor region 6 while being spaced from the second semiconductor region 7 on the first main surface 3 side so that no offset region is formed.

This embodiment shows the example that the plurality of second impurity regions 36 are formed while being spaced from the plurality of first trench structures 10. However, the plurality of second impurity regions 36 may be in contact with the adjacent first trench structures 10. That is, the plurality of second impurity regions 36 may be in contact with the first trench structures 10 and the second trench structures 30 in the corresponding second mesa portions 15B. In this case, the plurality of second impurity regions 36 may be formed in the entire region positioned between the first trench structures 10 and the second trench structures 30 in the first semiconductor region 6.

The semiconductor device 1A includes a plurality of third electrodes 37 electrically connected to the plurality of first trench structures 10. The plurality of third electrodes 37 are provided as the "gate connection electrodes." The plurality of third electrodes 37 pass through the main surface insulating film 24 and are mechanically and electrically connected to any one of or both the plurality of first trench structures 10 (pull-out portions 13*a*) and the plurality of trench connection structures 20 (connection electrodes 23).

Specifically, the plurality of third electrodes 37 are respectively arranged in a plurality of third connection openings 38 formed in the main surface insulating film 24. In this embodiment, the plurality of third electrodes 37 are mechanically and electrically connected to the plurality of trench connection structures 20. That is, the plurality of third electrodes 37 are electrically connected to the plurality of first trench structures 10 via the plurality of trench connection structures 20.

In this embodiment, the plurality of third electrodes 37 are formed while being spaced from each other along the trench connection structures 20 in a plan view. A planar shape of the plurality of third electrodes 37 is arbitrary. The plurality of third electrodes 37 may be formed in a circular shape or a square shape in a plan view. As a matter of course, the plurality of third electrodes 37 may be respectively formed in a band shape extending along the corresponding trench connection structure 20 in a plan view.

The plurality of third electrodes 37 are respectively made of metal. In this embodiment, each of the third electrodes 37 has a laminated structure including a third barrier film 39 and a third electrode main body 40. The third barrier film 39 is formed in a film shape along a wall surface of the third connection opening 38. The third barrier film 39 may be formed by a titanium-based metal film. The third barrier film 39 may have a single layer structure or a laminated structure including any one of or both a titanium film and a titanium nitride film. The third barrier film 39 is preferably made of the same material as the first barrier film 27.

The third electrode main body 40 is embedded in the third connection opening 38 while sandwiching the third barrier film 39, and electrically connected to the pull-out portion 13*a* (connection electrode 23) across the third barrier film 39. The third electrode main body 40 may include at least one type of tungsten, aluminum, copper, aluminum alloy, and copper alloy. The third electrode main body 40 is preferably made of the same material as the first electrode main body 28. In this embodiment, the third electrode main body 40 includes tungsten. As a matter of course, each of the third electrodes 37 may have no third barrier film 39 and may be arranged only by the third electrode main body 40.

The semiconductor device 1A includes a p-type bottom wall impurity region 41 formed in a region along the bottom wall of the first trench structure 10 in the second semiconductor region 7. In this embodiment, the bottom wall impurity region 41 is formed in the second semiconductor region 7 and has a p-type impurity concentration higher than that of the second semiconductor region 7. The p-type impurity concentration of the bottom wall impurity region 41 is preferably not more than the p-type impurity concentration of the third semiconductor region 8. The p-type impurity concentration of the bottom wall impurity region 41 may be not less than $1\times10^{16}$ $cm^{-3}$ and not more than $1\times10^{19}$ $cm^{-3}$ (in this embodiment, approximately $1\times10^{17}$ $cm^{-3}$).

The bottom wall impurity region 41 is formed in a band shape extending along the bottom wall of the first trench structure 10 while being spaced from the plurality of second trench structures 30 in a plan view. The bottom wall impurity region 41 opposes the gate electrode 13 across the gate insulating film 12 at the bottom wall of the first trench structure 10. The bottom wall impurity region 41 may cover the bottom wall and the side wall of the first trench structure 10 in a lower end portion of the first trench structure 10.

The bottom wall impurity region 41 may cover the bottom wall of the trench connection structure 20 in the second semiconductor region 7. In this case, the bottom wall impurity region 41 may be formed in a band shape extending along the bottom wall of the trench connection structure 20 in a plan view. As a matter of course, the bottom wall of the trench connection structure 20 may be exposed from the bottom wall impurity region 41.

The bottom wall impurity region 41 is formed while being spaced from a bottom portion of the second semiconductor region 7 (third semiconductor region 8) on the bottom wall side of the first trench structure 10, and opposes the third semiconductor region 8 across a part of the second semiconductor region 7. A bottom portion of the bottom wall impurity region 41 may be formed while being spaced from the bottom portion of the second semiconductor region 7 (third semiconductor region 8) with an interval of not less than 0.1 μm and not more than 2.5 μm (preferably, not less than 1 μm and not more than 2 μm).

Further, the bottom wall impurity region 41 is formed while being spaced from the bottom portion of the first semiconductor region 6 on the bottom portion side of the second semiconductor region 7. In this embodiment, the bottom wall impurity region 41 includes a bulge portion 41*a* that extends from the bottom wall of the first trench structure 10 in the direction along the first main surface 3. The bulge portion 41*a* is formed while being spaced from the bottom portion of the first semiconductor region 6 on the second semiconductor region 7 side, and opposes the bottom portion of the first semiconductor region 6 across a part of the second semiconductor region 7 in the thickness direction of the chip 2.

In a case where the first trench structure 10 is formed in a tapered shape, the bulge portion 41*a* opposes the side wall of the first trench structure 10 in the thickness direction of the chip 2. In a case where the second impurity region 36 is formed while being spaced from the first trench structure 10, the bulge portion 41*a* does not oppose the second impurity region 36 in the thickness direction of the chip 2.

The bottom wall impurity region 41 may have a thickness of not less than 10 nm and not more than 500 nm. The thickness of the bottom wall impurity region 41 is preferably not less than 100 nm and not more than 300 nm. The thickness of the bottom wall impurity region 41 is a distance between the bottom wall of the first trench structure 10 and the bottom portion of the bottom wall impurity region 41.

The bottom wall impurity region 41 has a width exceeding a width of the bottom wall of the first trench structure 10 regarding the first direction X. The width of the bottom wall impurity region 41 is formed by a width of the most bulged region in the bottom wall impurity region 41. The width of the bottom wall impurity region 41 may exceed the opening width of the first trench structure 10. The width of the bottom wall impurity region 41 may be not less than 0.1 μm and not more than 0.5 μm.

This embodiment shows the example that the bottom wall impurity region 41 includes the bulge portion 41*a*. However, the bottom wall impurity region 41 may have no bulge portion 41*a* and may be formed only in a region along the bottom wall of the first trench structure 10. In this case, the bottom wall impurity region 41 may be formed in a film shape in the region along the bottom wall of the first trench structure 10. Also, in this case, the width of the bottom wall impurity region 41 may be substantially equal to the width of the bottom wall of the first trench structure 10.

The semiconductor device 1A includes the channel 42 of the MISFET formed in the region along the bottom wall of the first trench structure 10 in the second semiconductor region 7 (see a double-chain line portion of FIG. 8). In this embodiment, the channel 42 includes a high concentration channel 42A and a low concentration channel 42B. The high concentration channel 42A is formed in the bottom wall impurity region 41, and the low concentration channel 42B is formed in a part of the second semiconductor region 7 positioned between the first semiconductor region 6 and the bottom wall impurity region 41.

The high concentration channel 42A (bottom wall impurity region 41) suppresses a depletion layer spreading from the first semiconductor region 6 from overlapping in the region along the bottom wall of the first trench structure 10. Thereby, a punch-through of the first semiconductor region 6 is suppressed, and a decrease in withstand voltage is suppressed. Meanwhile, the low concentration channel 42B allows the spread of a depletion layer from a border portion between the first semiconductor region 6 and the second semiconductor region 7. Thereby, an effect of improving withstand voltage by the depletion layer is obtained.

The semiconductor device 1A includes a first interlayer insulating film 50 laminated on the main surface insulating film 24. The first interlayer insulating film 50 may include at least one of silicon oxide and silicon nitride. The first interlayer insulating film 50 covers the entire region of the main surface insulating film 24, and continues to the first to fourth side surfaces 5A to 5D. The first interlayer insulating film 50 may have a flat surface extending along the first main surface 3. The flat surface of the first interlayer insulating film 50 may have a grinding mark.

The first interlayer insulating film 50 includes a plurality of first lower side openings 51, a plurality of second lower side openings 52, and a plurality of third lower side openings 53. The plurality of first lower side openings 51 respectively expose the plurality of first electrodes 25. In this embodiment, the plurality of first lower side openings 51 are arrayed while being spaced from each other in a one-to-many correspondence for each first electrode 25 so that the first electrode 25 is exposed from plural portions.

In this embodiment, the plurality of first lower side openings 51 are arrayed in a matrix with respect to the plurality of first electrodes 25 so as to oppose each other in the first direction X and the second direction Y in a plan view. In this embodiment, the plurality of first lower side openings 51 are respectively formed in a band shape extending along the first electrodes 25 in a plan view. The plurality of first lower side openings 51 may be respectively formed in a circular shape, an oval shape, or a polygonal shape in a plan view.

The plurality of second lower side openings 52 respectively expose the plurality of second electrodes 33. In this embodiment, the plurality of second lower side openings 52 are arrayed while being spaced from each other in a one-to-many correspondence for each second electrode 33 so that the second electrode 33 is exposed from plural portions. In this embodiment, the plurality of second lower side openings 52 are arrayed in a matrix with respect to the plurality of second electrodes 33 so as to oppose each other in the first direction X and the second direction Y in a plan view.

Further, the plurality of second lower side openings 52 are arrayed while being displaced from the plurality of first lower side openings 51 in the second direction Y so as not to oppose the plurality of first lower side openings 51 in the first direction X in a plan view. In this embodiment, the plurality of second lower side openings 52 are respectively formed in a band shape extending along the second electrodes 33 in a plan view. The plurality of second lower side openings 52 may be respectively formed in a circular shape, an oval shape, or a polygonal shape in a plan view.

The plurality of third lower side openings 53 respectively expose the plurality of third electrodes 37. In this embodiment, the plurality of third lower side openings 53 are provided in a one-to-one correspondence with the plurality of third electrodes 37. The plurality of third lower side openings 53 may be respectively formed in a circular shape, an oval shape, or a polygonal shape in a plan view. As a matter of course, in a case where each of the third electrodes 37 extends in a band shape in a plan view, the plurality of third lower side openings 53 may be respectively formed in a band shape extending along each of the third electrodes 37 in a plan view.

With reference to FIG. 9, the semiconductor device 1A includes the first interlayer wiring 54 arranged on the first interlayer insulating film 50. The first interlayer wiring 54 may include at least one type of titanium, tungsten, aluminum, copper, aluminum alloy, copper alloy, and conductive polysilicon. The first interlayer wiring 54 may respectively include at least one of a Cu film (Cu film whose purity is not less than 99%), a pure Al film (Al film whose purity is not less than 99%), an AlCu alloy film, an AlSi alloy film, and an AlSiCu alloy film. The number and the routing mode of the first interlayer wiring 54 are arbitrary and not restricted to the specific number or the specific routing mode.

In this embodiment, the first interlayer wiring 54 includes at least one (in this embodiment, one) first lower side wiring 55, at least one (in this embodiment, a plurality of) second lower side wirings 56, and at least one (in this embodiment, one) third lower side wiring 57. In this embodiment, the first lower side wiring 55 is the "drain wiring," the second lower side wirings 56 are the "source wirings," and the third lower side wiring 57 is the "gate wiring."

The first lower side wiring 55 is arranged in a film shape on the first interlayer insulating film 50, and covers the plurality of first lower side openings 51. In this embodiment, the first lower side wiring 55 overlaps all the first trench structures 10 and all the second trench structures 30 in a plan view. The first lower side wiring 55 preferably covers at least inward portions of all the first trench structures 10 and at least inward portions of all the second trench structures 30 in a plan view.

In this embodiment, the first lower side wiring 55 covers the inward portions of all the first trench structures 10 so that both end portions of all the first trench structures 10 are exposed in a plan view. Also, the first lower side wiring 55 covers both end portions and the inward portions of all the second trench structures 30 in a plan view. The first lower side wiring 55 covers all the first lower side openings 51, and all the second lower side openings 52 are exposed from the first lower side wiring 55.

Specifically, the first lower side wiring 55 has a plurality of removal portions 55*a* from which the plurality of second lower side openings 52 are respectively exposed. In this embodiment, each of the removal portions 55*a* has a wall surface positioned on the main surface insulating film 24 in a plan view, and surrounds the corresponding second lower side opening 52 on the main surface insulating film 24.

That is, the plurality of removal portions 55*a* are formed as openings from which the corresponding second lower side openings 52 are exposed. In this embodiment, the plurality of removal portions 55*a* are respectively formed in a square shape (specifically, an oblong shape extending along the first lower side openings 51) in a plan view. The plurality of removal portions 55*a* may be respectively formed in a circular shape, an oval shape, or a polygonal shape in a plan view.

The first lower side wiring 55 enters all the first lower side openings 51 from the upper side of the first interlayer insulating film 50, and is respectively electrically connected to all the first electrodes 25 in all the first lower side openings 51. Thereby, the single first lower side wiring 55 is electrically connected to all the first mesa portions 15A (first impurity regions 29). The first lower side wiring 55 may be formed in a square shape or a polygonal shape in a plan view.

The plurality of second lower side wirings 56 are respectively arranged in a film shape on the first interlayer insulating film 50 while being spaced from the first lower side wiring 55, and respectively cover the plurality of second lower side openings 52. In this embodiment, the plurality of second lower side wirings 56 respectively cover the corresponding second lower side openings 52 in a one-to-one correspondence. Specifically, the plurality of second lower side wirings 56 are respectively arranged in the plurality of removal portions 55*a* of the first lower side wiring 55.

The plurality of second lower side wirings 56 enter the corresponding second lower side openings 52 from the upper side of the first interlayer insulating film 50, and are respectively electrically connected to the corresponding second electrodes 33 in the corresponding second lower side openings 52. Thereby, the plurality of second lower side wirings 56 are electrically connected to the plurality of second mesa portions 15B (second impurity regions 36). In this embodiment, each of the second lower side wirings 56 has a planar shape similar to a part of or all of a planar shape of the corresponding removal portion 55*a* in a plan view. The total plane area of the plurality of second lower side wirings 56 is preferably less than a plane area of the single first lower side wiring 55.

The third lower side wiring 57 is arranged in a film shape on the first interlayer insulating film 50 while being spaced from the first lower side wiring 55 and the second lower side wirings 56, and covers the plurality of third lower side openings 53. Specifically, the third lower side wiring 57 is arranged in a region between a peripheral edge of the first interlayer insulating film 50 and a peripheral edge of the first lower side wiring 55.

The third lower side wiring 57 enters the plurality of third lower side openings 53 from the upper side of the first interlayer insulating film 50, and is electrically connected to the plurality of third electrodes 37 in the plurality of third lower side openings 53. That is, the third lower side wiring 57 is electrically connected to the plurality of first trench structures 10 (gate electrodes 13) via the plurality of third electrodes 37.

In this embodiment, the third lower side wiring 57 includes a pad portion 57*a* and aline portion 57*b*. The pad portion 57*a* is an island-shaped portion formed to be relatively wide in a plan view. The pad portion 57*a* is arranged in an arbitrary region overlapping a peripheral edge portion of the chip 2 in a plan view. In this embodiment, the pad portion 57*a* is arranged in a region along a central portion of the third side surface 5C in a plan view.

As a matter of course, the pad portion 57*a* may be arranged in a region along an arbitrary corner portion of the chip 2 in a plan view. In this embodiment, the pad portion 57*a* is formed in a square shape in a plan view. The pad portion 57*a* may be formed in a circular shape, an oval shape, or a polygonal shape in a plan view.

The line portion 57*b* is a portion pulled out from the pad portion 57*a* onto the first interlayer insulating film 50 in a line shape. In this embodiment, the line portion 57*b* is pulled out from the pad portion 57*a* in a band shape narrower than the pad portion 57*a*. The line portion 57*b* is placed so as to cross (specifically, be orthogonal to) the end portions of the plurality of first trench structures 10 in a plan view. The line portion 57*b* extends in a band shape along at least two of the first to fourth side surfaces 5A to 5D so as to partition the inward portion of the first main surface 3 from at least two directions in a plan view.

In this embodiment, the line portion 57*b* extends along the first to third side surfaces 5A to 5C so as to partition the inward portion of the first main surface 3 from three directions in a plan view. As a matter of course, the line portion 57*b* may extend along the first to fourth side surfaces 5A to 5D in a plan view, and partition the inward portion of the first main surface 3 from four directions. In this embodiment, the line portion 57*b* is arranged immediately above the plurality of trench connection structures 20 so as to cross both end portions of the plurality of first trench structures 10 in a plan view.

In this embodiment, the line portion 57*b* is arranged while being spaced from both end portions of the plurality of second trench structures 30 on the peripheral edge side of the first interlayer insulating film 50 in a plan view, and does not oppose the plurality of second trench structures 30 in the laminating direction (normal direction Z). The third lower side wiring 57 enters the plurality of third lower side openings 53 from the upper side of the first interlayer insulating film 50, and is respectively electrically connected to the plurality of third electrodes 37 in the plurality of third lower side openings 53. Thereby, the pad portion 57*a* is electrically connected to the plurality of first trench structures 10 via the line portion 57*b*.

The semiconductor device 1A includes a second interlayer insulating film 60 laminated on the first interlayer insulating film 50 so as to cover the first interlayer wiring 54. The second interlayer insulating film 60 may include at least one of silicon oxide and silicon nitride. The second interlayer insulating film 60 covers the entire region of the first interlayer insulating film 50, and continues to the first to fourth side surfaces 5A to 5D. The second interlayer insulating film 60 may have a flat surface extending along the first main surface 3. The flat surface of the second interlayer insulating film 60 may have a grinding mark.

The second interlayer insulating film 60 includes at least one (in this embodiment, a plurality of) first upper side openings 61, at least one (in this embodiment, a plurality of) second upper side openings 62, and at least one (in this embodiment, one) third upper side opening 63. The plurality of first upper side openings 61 respectively expose arbitrary portions of the first lower side wiring 55.

In this embodiment, the plurality of first upper side openings 61 are arrayed in a matrix so as to oppose each other in the first direction X and the second direction Y in a plan view. In this embodiment, the plurality of first upper side openings 61 are respectively formed in a band shape extending in the second direction Y in a plan view. The plurality of first upper side openings 61 may be respectively formed in a circular shape, an oval shape, or a polygonal shape in a plan view.

The plurality of second upper side openings 62 respectively expose the plurality of second lower side wirings 56. In this embodiment, the plurality of second upper side openings 62 are provided in a one-to-one correspondence with each of the second lower side wirings 56. In this embodiment, the plurality of second upper side openings 62 are arrayed in a matrix so as to oppose each other in the first direction X and the second direction Y following the layout of the plurality of second lower side wirings 56 in a plan view.

Further, the plurality of second upper side openings 62 are arrayed while being displaced from the plurality of first upper side openings 61 in the second direction Y so as not to oppose the plurality of first upper side openings 61 in the first direction X in a plan view. In this embodiment, the plurality of second upper side openings 62 are respectively formed in a band shape extending along the second lower side wirings 56 in a plan view. The plurality of second upper side openings 62 may be respectively formed in a circular shape, an oval shape, or a polygonal shape in a plan view.

The third upper side opening 63 exposes at least the pad portion 57*a* in the third lower side wiring 57. In this embodiment, the third upper side opening 63 exposes an inward portion of the pad portion 57*a* while being spaced from a peripheral edge of the pad portion 57*a* in a plan view, and does not expose the line portion 57*b*. That is, the second interlayer insulating film 60 covers the entire region of the line portion 57*b*. The third upper side opening 63 is formed in a planar shape (in this embodiment, a square shape) along the peripheral edge of the pad portion 57*a* in a plan view. The third upper side opening 63 may be respectively formed in a circular shape, an oval shape, or a polygonal shape in a plan view.

With reference to FIGS. 1 and 10, the semiconductor device 1A includes the second interlayer wiring 64 arranged on the second interlayer insulating film 60. The second interlayer wiring 64 may respectively include at least one type of titanium, tungsten, aluminum, copper, aluminum alloy, copper alloy, and conductive polysilicon.

The second interlayer wiring 64 may respectively include at least one of a Cu film (Cu film whose purity is not less than 99%), a pure Al film (Al film whose purity is not less than 99%), an AlCu alloy film, an AlSi alloy film, and an AlSiCu alloy film. The number and the routing mode of the second interlayer wiring 64 are arbitrary and not restricted to the specific number or the specific routing mode.

In this embodiment, the second interlayer wiring 64 includes at least one (in this embodiment, a plurality of) first upper side wirings 65, at least one (in this embodiment, a plurality of) second upper side wirings 66, and at least one (in this embodiment, one) third upper side wiring 67. In this embodiment, the first upper side wirings 65 are provided as the "drain pad wirings," the second upper side wirings 66 are provided as the "source pad wirings," and the third upper side wiring 67 is provided as the "gate pad wiring."

In this embodiment, the plurality of first upper side wirings 65 are respectively arranged in a film shape on the second interlayer insulating film 60 so as to overlap the first lower side wiring 55 in a plan view. In this embodiment, the plurality of first upper side wirings 65 are respectively formed in a band shape extending in the first direction X, and arrayed while being spaced from each other in the second direction Y. The plurality of first upper side wirings 65 overlap the inward portions of the plurality of (in this embodiment, all the) first trench structures 10 and the inward portions of the plurality of (in this embodiment, all the) second trench structures 30 in a plan view.

The plurality of first upper side wirings 65 respectively cover the plurality of first upper side openings 61 arrayed in the first direction X, and respectively expose the plurality of second upper side openings 62. The plurality of first upper side wirings 65 respectively enter the plurality of corresponding first upper side openings 61 from the upper side of the second interlayer insulating film 60, and are respectively electrically connected to the first lower side wiring 55 in the plurality of first upper side openings 61. Thereby, the plurality of first upper side wirings 65 are electrically connected to the plurality of first mesa portions 15A via the single first lower side wiring 55.

The plurality of second upper side wirings 66 are respectively arranged in a film shape on the second interlayer insulating film 60 so as to overlap the plurality of second lower side wirings 56 in a plan view. In this embodiment, the plurality of second upper side wirings 66 respectively overlap the plurality of second lower side wirings 56 in a plan view. In this embodiment, the plurality of second upper side wirings 66 are respectively formed in a band shape extending in the first direction X, and arrayed while being spaced from each other in the second direction Y.

The plurality of second upper side wirings 66 overlap the inward portions of the plurality of (in this embodiment, all the) first trench structures 10 and the inward portions of the plurality of (in this embodiment, all the) second trench structures 30 in a plan view. Specifically, the plurality of second upper side wirings 66 are arrayed alternately with the plurality of first upper side wirings 65 along the second direction Y.

The plurality of second upper side wirings 66 respectively cover the plurality of second upper side openings 62 arrayed in the first direction X. The plurality of second upper side wirings 66 respectively enter the plurality of corresponding second upper side openings 62 from the upper side of the second interlayer insulating film 60, and are respectively electrically connected to the corresponding second lower side wirings 56 in the plurality of second upper side openings 62. Thereby, the plurality of second upper side wirings 66 are electrically connected to the plurality of second mesa portions 15B (second trench structures 30) via the plurality of second lower side wirings 56.

The third upper side wiring 67 is arranged in a film shape on the second interlayer insulating film 60 so as to cover the third upper side opening 63 while being spaced from the first upper side wirings 65 and the second upper side wirings 66. The third upper side wiring 67 is arranged on the second interlayer insulating film 60 so as to overlap at least the pad portion 57*a* in the third lower side wiring 57 in a plan view. In this embodiment, the third upper side wiring 67 overlaps the pad portion 57*a* while being spaced inward from the peripheral edge of the pad portion 57*a* in a plan view. The third upper side wiring 67 does not overlap the line portion 57*b* in a plan view.

The third upper side wiring 67 enters the third upper side opening 63 from the upper side of the second interlayer insulating film 60, and is electrically connected to the pad portion 57*a* in the third upper side opening 63. Thereby, the third upper side wiring 67 is electrically connected to the plurality of first trench structures 10 via the line portion 57*b* and the third electrodes 37. The third upper side wiring 67 is formed in a planar shape (in this embodiment, a square shape) along the peripheral edge of the pad portion 57*a* in a plan view. The third upper side wiring 67 may be respectively formed in a circular shape, an oval shape, or a polygonal shape in a plan view.

With reference to FIG. 2, the semiconductor device 1A includes an uppermost insulating film 70 formed on the second interlayer insulating film 60. The uppermost insulating film 70 may be referred to as the "passivation film." The uppermost insulating film 70 may have a laminated structure including an inorganic insulating film (inorganic film) and an organic insulating film (organic film) laminated in this order from the second interlayer insulating film 60 side. As a matter of course, the uppermost insulating film 70 may have a single layer structure including an inorganic insulating film (inorganic film) or an organic insulating film (organic film).

The inorganic insulating film is preferably made of an insulating material different from the second interlayer insulating film 60. The inorganic insulating film may be made of, for example, a silicon nitride film. The organic insulating film may be made of photosensitive resin. The organic insulating film may include at least one of a polyimide film, a polyamide film, and a polybenzoxazole film.

The uppermost insulating film 70 selectively covers the second interlayer wiring 64 so that the second interlayer wiring 64 is partially exposed, and continues to the first to fourth side surfaces 5A to 5D. In a case where the uppermost insulating film 70 includes the organic insulating film, the uppermost insulating film 70 may be formed while being spaced inward from the first to fourth side surfaces 5A to 5D so that the peripheral edge portion of the second interlayer insulating film 60 is exposed in a plan view. The uppermost insulating film 70 includes at least one (in this embodiment, a plurality of) first pad openings 71, at least one (in this embodiment, a plurality of) second pad openings 72, and at least one (in this embodiment, one) third pad opening 73.

The plurality of first pad openings 71 are respectively formed while being spaced inward from peripheral edge portions of the plurality of first upper side wirings 65, and respectively expose inward portions of the plurality of first upper side wirings 65 as terminal electrodes. The plurality of second pad openings 72 are respectively formed while being spaced inward from peripheral edge portions of the plurality of second upper side wirings 66, and respectively expose inward portions of the plurality of second upper side wirings 66 as terminal electrodes. The third pad opening 73 is formed while being spaced inward from a peripheral edge portion of the pad portion 57*a* of the third upper side wiring 67, and exposes the inward portion of the pad portion 57*a* as a terminal electrode.

The semiconductor device 1A includes a base electrode 75 that covers the second main surface 4 of the chip 2. In this embodiment, the base electrode 75 covers the entire region of the second main surface 4, and continues to the first to fourth side surfaces 5A to 5D. The base electrode 75 is electrically connected to the second semiconductor region 7 exposed from the second main surface 4. That is, the base electrode 75 is electrically connected to the second trench structures 30 (second electrodes 33) via the second semiconductor region 7.

The base electrode 75 may be arranged so that an electric potential is applied from the second trench structures 30 via the second semiconductor region 7. The base electrode 75 may be arranged so that an electric potential is to be applied to the second trench structures 30 via the second semiconductor region 7. The base electrode 75 may include at least one of a Ti film, a Ni film, a Pd film, an Au film, an Ag film, and an Al film. The base electrode 75 may have a laminated structure in which at least two of a Ti film, a Ni film, a Pd film, an Au film, an Ag film, and an Al film are laminated in an arbitrary order.

In such a way, the semiconductor device 1A has a trench gate lateral type MISFET structure. In this MISFET structure, a gate potential is to be applied to the first trench structures 10 (gate electrodes 13), a drain potential is to be applied to the first mesa portions 15A, and a source potential is to be applied to the second mesa portions 15B.

Thereby, the channel 42 is formed in a region on the lower side of the first trench structures 10 in the second semiconductor region 7, and a current path that connects the first electrodes 25 (first mesa portions 15A) and the second electrodes 33 (second mesa portions 15B) is formed. Thereby, a drain-source current flows between the first electrodes 25 (first mesa portions 15A) and the second electrodes 33 (second mesa portions 15B).

Figure 11A:
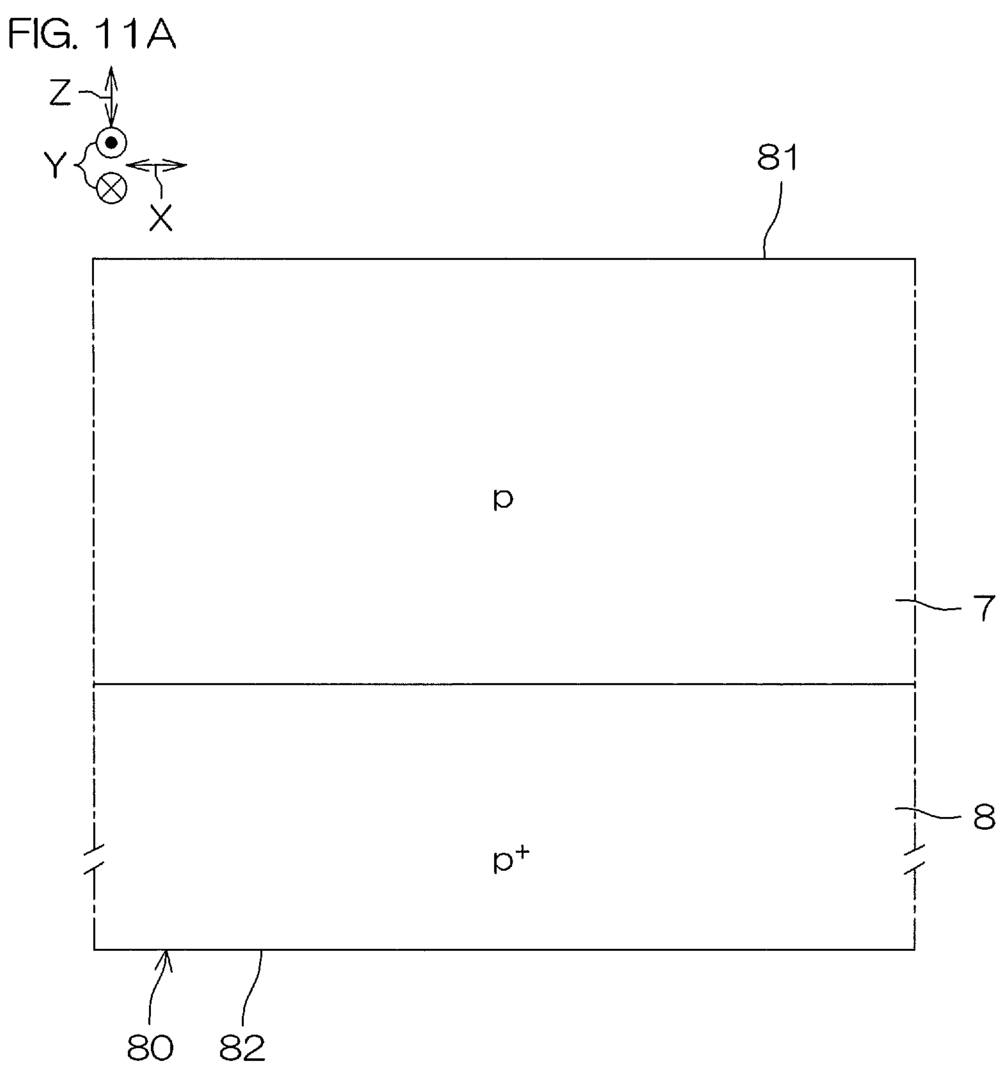
FIGS. 11A to 11Q are cross-sectional views showing an example of a method of manufacturing the semiconductor device shown in FIG. 1.

Hereinafter, an example of a method of manufacturing the semiconductor device 1A will be described. FIGS. 11A to 11Q are cross-sectional views showing the example of the method of manufacturing the semiconductor device 1A shown in FIG. 1. Any of FIGS. 11A to 11Q is a cross-sectional view of a region corresponding to FIG. 5.

With reference to FIG. 11A, a disc-shaped wafer 80 is prepared. The wafer 80 includes a first wafer main surface 81 on one side, and a second wafer main surface 82 on the other side. The wafer 80 includes the second semiconductor region 7 on the first wafer main surface 81 side, and the third semiconductor region 8 on the second wafer main surface 82 side. In this embodiment, the third semiconductor region 8 is formed by a p-type semiconductor substrate, and the second semiconductor region 7 is formed by a p-type epitaxial layer. That is, the wafer 80 is formed by a so-called epitaxial wafer. The second semiconductor region 7 (epitaxial layer) is formed by growing silicon from the third semiconductor region 8 (semiconductor substrate) by the epitaxial growth method.

Figure 11B:
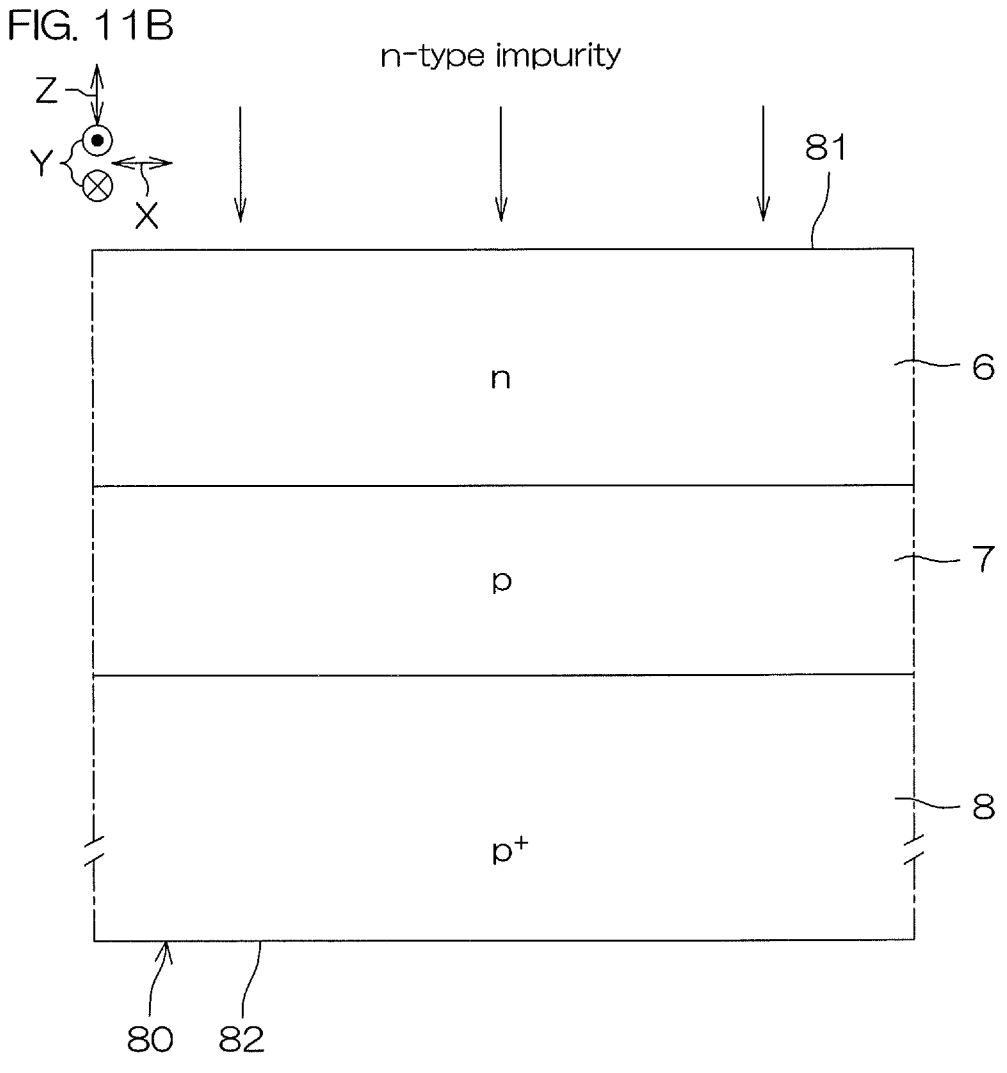

With reference to FIG. 11B, the first semiconductor region 6 is formed in a surface layer portion of the first wafer main surface 81. The first semiconductor region 6 is formed by introducing an n-type impurity into the surface layer portion of the first wafer main surface 81 by an ion injection method. Specifically, the n-type impurity is introduced into a surface layer portion of the second semiconductor region 7 while being spaced from the bottom portion of the second semiconductor region 7 on the first wafer main surface 81 side. The n-type impurity may be introduced into the entire region of the surface layer portion of the first wafer main surface 81 via no ion injection mask.

As a matter of course, the n-type impurity may be introduced into a region where the first semiconductor region 6 is to be formed in the surface layer portion of the first wafer main surface 81 via an ion injection mask. Also, the first semiconductor region 6 may be formed by growing silicon from the second semiconductor region 7 (semiconductor substrate) by an epitaxial growth method. In this case, the first wafer main surface 81 is formed by a crystal surface (crystal growth surface) of the first semiconductor region 6.

Figure 11C:
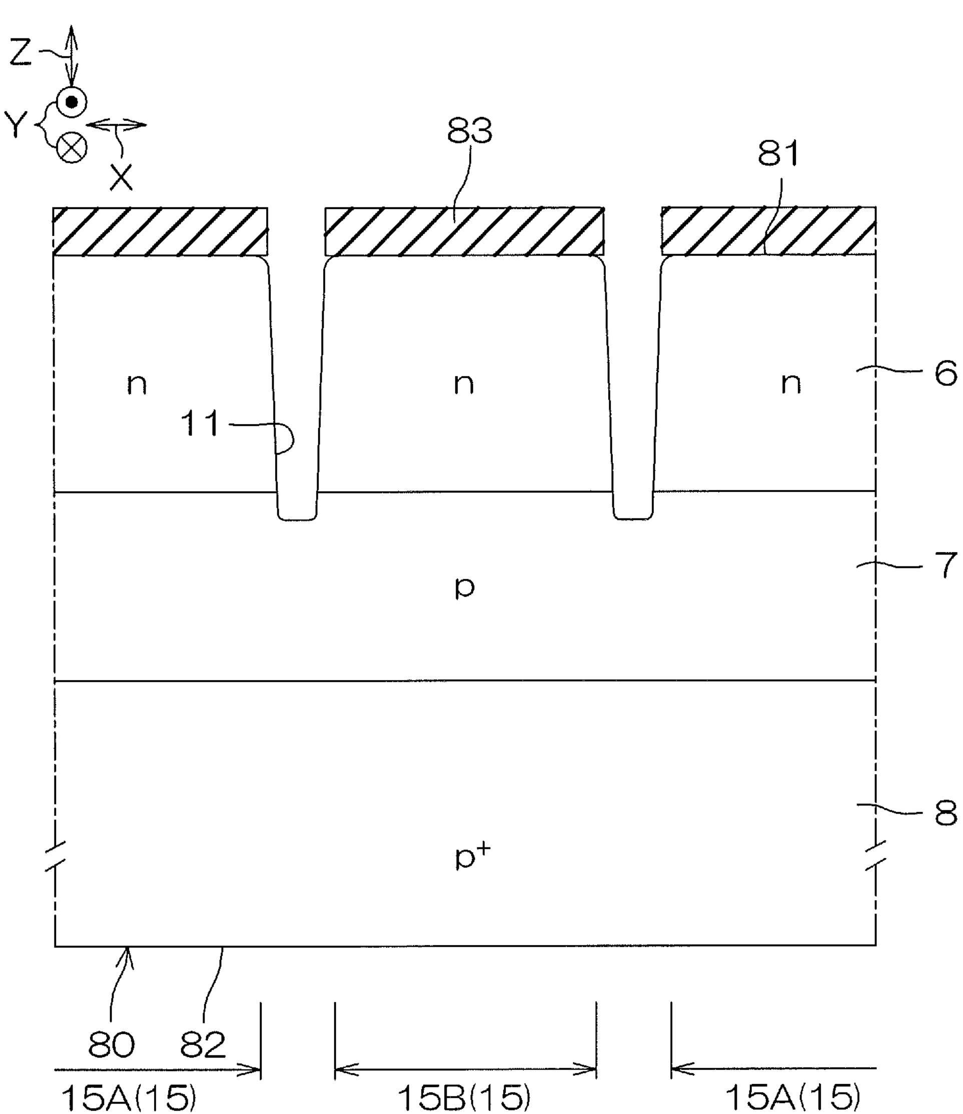

With reference to FIG. 11C, the plurality of first trenches 11 and the plurality of connection trenches 21 are formed in the first wafer main surface 81. In this step, first, a hard mask 83 having predetermined patterns is formed on the first wafer main surface 81. The hard mask 83 expose regions where the plurality of first trenches 11 and the plurality of connection trenches 21 are to be formed in the first wafer main surface 81 and covers the other region.

The hard mask 83 may be formed by an oxidation treatment method or a chemical vapor deposition (CVD) method. An unnecessary portion of the hard mask 83 is removed by an etching method via a resist mask (not shown). The etching method may be a wet etching method and/or a dry etching method.

Next, an unnecessary portion of the wafer 80 is removed by an etching method via the hard mask 83. The etching method may be a wet etching method and/or a dry etching method. The etching method is preferably a reactive ion etching (RIE) method as an example of the dry etching method.

Thereby, the plurality of first trenches 11 and the plurality of connection trenches 21 are formed. Also, the plurality of mesa portions 15 (the plurality of first mesa portions 15A and the plurality of second mesa portions 15B) are partitioned in the first wafer main surface 81 by the plurality of first trenches 11 (plurality of connection trenches 21). The hard mask 83 is removed after that.

Figure 11D:
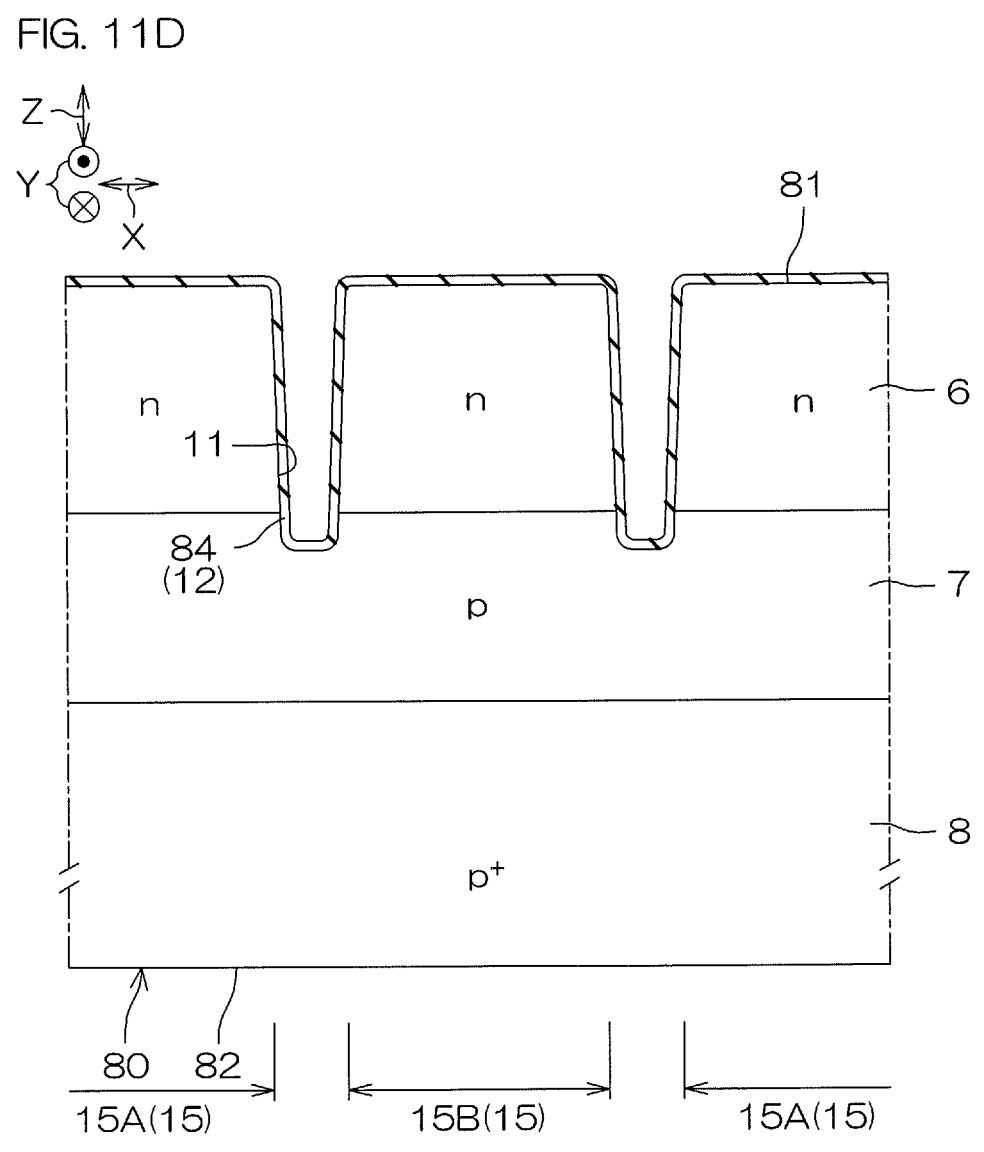

With reference to FIG. 11D, a first base insulating film 84 to be a base of the plurality of gate insulating films 12 and the plurality of connection insulating films 22 is formed on the first wafer main surface 81. The first base insulating film 84 is formed on the first wafer main surface 81 including wall surfaces of the plurality of first trenches 11 and wall surfaces of the plurality of connection trenches 21. The first base insulating film 84 may be formed by an oxidation treatment method and/or a CVD method (preferably, by a thermal oxidation treatment method).

Figure 11E:
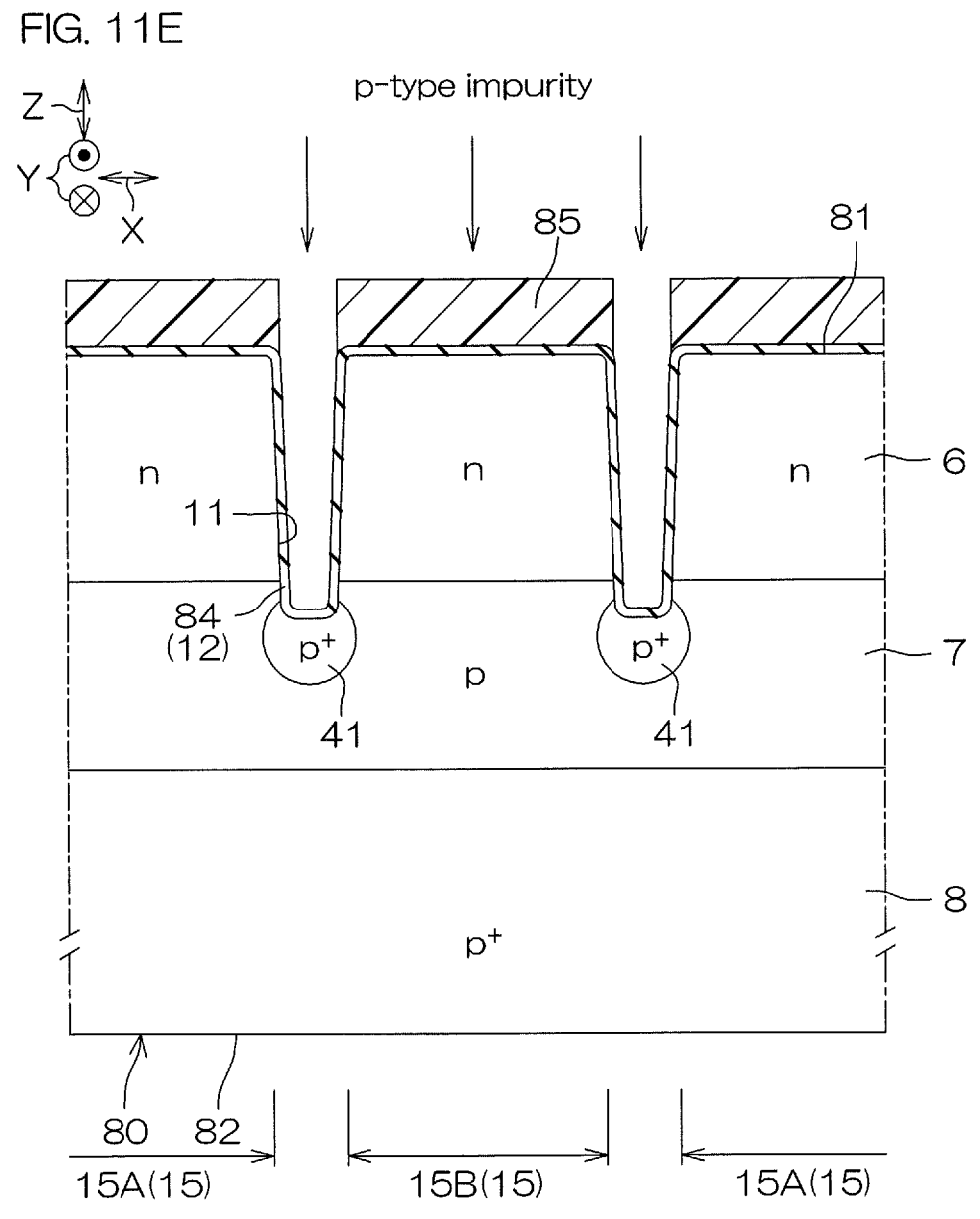

With reference to FIG. 11E, the plurality of bottom wall impurity regions 41 are formed in regions along the bottom walls of the plurality of first trenches 11 and the bottom walls of the plurality of connection trenches 21 in the second semiconductor region 7. In this step, first, an ion injection mask 85 having predetermined patterns is formed on the first wafer main surface 81. The plurality of first trenches 11 and the plurality of connection trenches 21 are exposed from the ion injection mask 85, and the ion injection mask 85 covers the other region.

Next, a p-type impurity is introduced into the second semiconductor region 7 via the bottom walls of the plurality of first trenches 11 and bottom walls of the plurality of connection trenches 21 by an ion injection method via the ion injection mask 85. Thereby, the plurality of bottom wall impurity regions 41 are formed. The ion injection mask 85 is removed after that. As a matter of course, the ion injection mask 85 may cover the plurality of connection trenches 21. In this case, the plurality of bottom wall impurity regions 41 from which the bottom walls of the plurality of connection trenches 21 are exposed are formed.

Figure 11F:
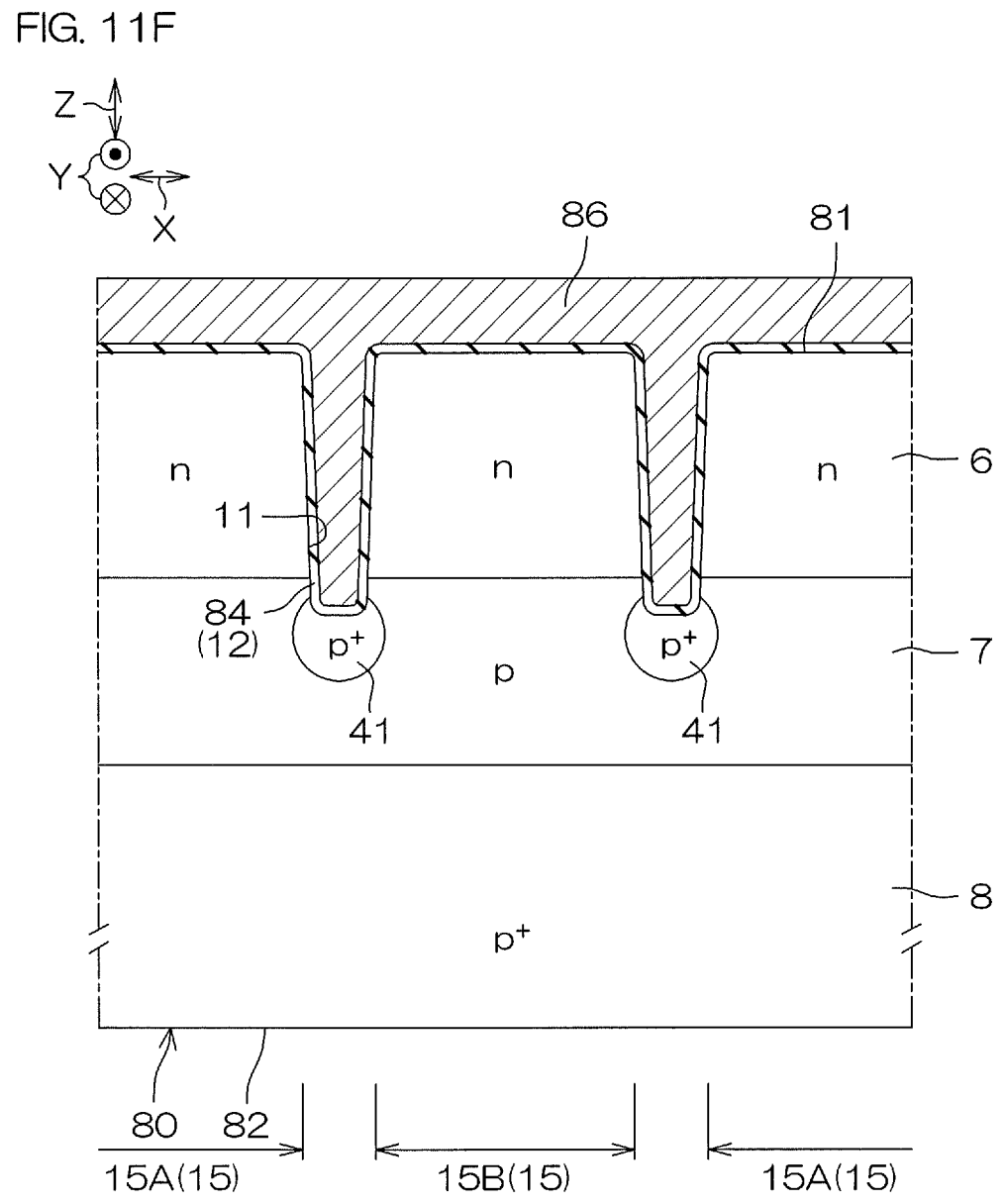

With reference to FIG. 11F, a first base electrode 86 to be a base of the plurality of gate electrodes 13 and the plurality of connection electrodes 23 is formed on the first wafer main surface 81. The first base electrode 86 is formed in a film shape so as to fill the plurality of first trenches 11 and the plurality of connection trenches 21 and cover the first wafer main surface 81.

In this embodiment, the first base electrode 86 includes conductive polysilicon. The first base electrode 86 may be formed by a CVD method. After the first base electrode 86 is formed, an electrode surface of the first base electrode 86 may be flattened. The electrode surface of the first base electrode 86 may be flattened by a chemical mechanical polishing (CMP) method.

Figure 11G:
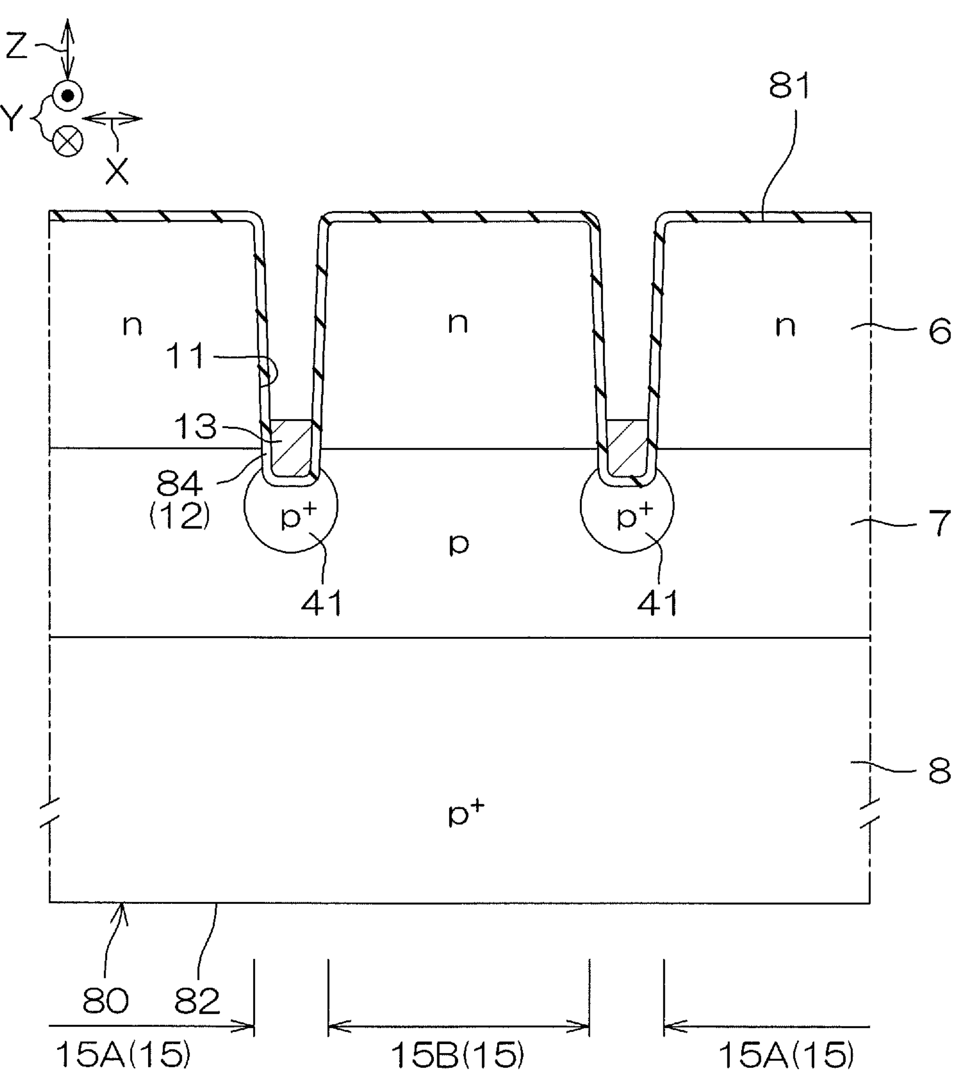

With reference to FIG. 11G, an unnecessary portion of the first base electrode 86 is removed. In this step, a resist mask (not shown) having predetermined patterns is formed on the first wafer main surface 81. The resist mask (not shown) covers a part to be the pull-out portions 13*a* and a part to be the connection electrodes 23 in the first base electrode 86, and the other region is exposed from the resist mask. Next, the unnecessary portion of the first base electrode 86 is removed by an etching method via the resist mask (not shown).

The first base electrode 86 is removed until the electrode surface (etching surface) of the first base electrode 86 is positioned in a region between the intermediate portion of the first trench 11 and the bottom wall of the first trench 11. Thereby, the gate electrodes 13 (pull-out portions 13*a*) and the connection electrodes 23 are formed. Prior to the etching method via the resist mask (not shown), the first base electrode 86 may be removed until the first base insulating film 84 is exposed. In this case, the plurality of pull-out portions 13*a* and the connection electrodes 23 respectively having upper end portions positioned on the bottom wall side of the first trenches 11 with respect to the first wafer main surface 81 are formed.

Figure 11H:
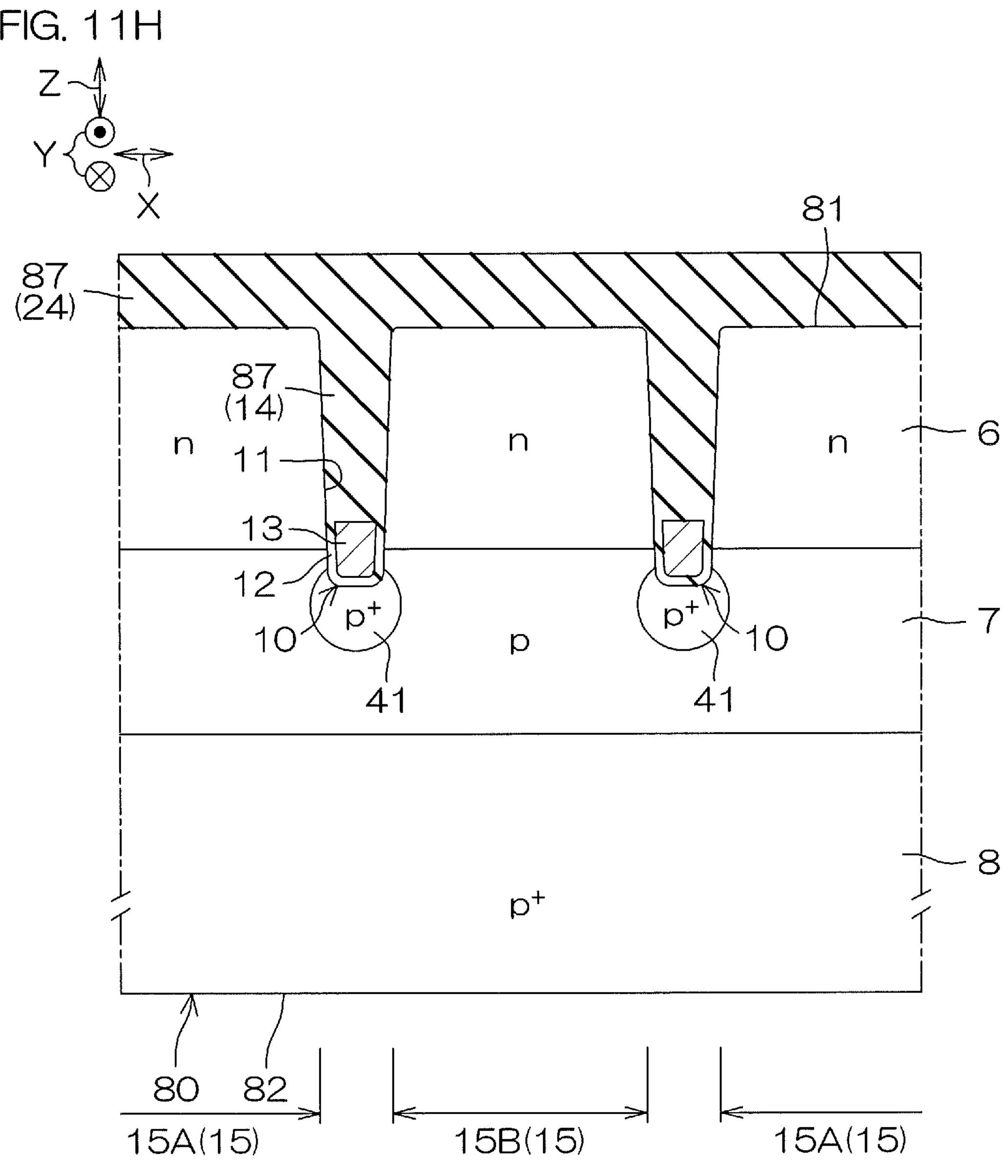
Figure 11:
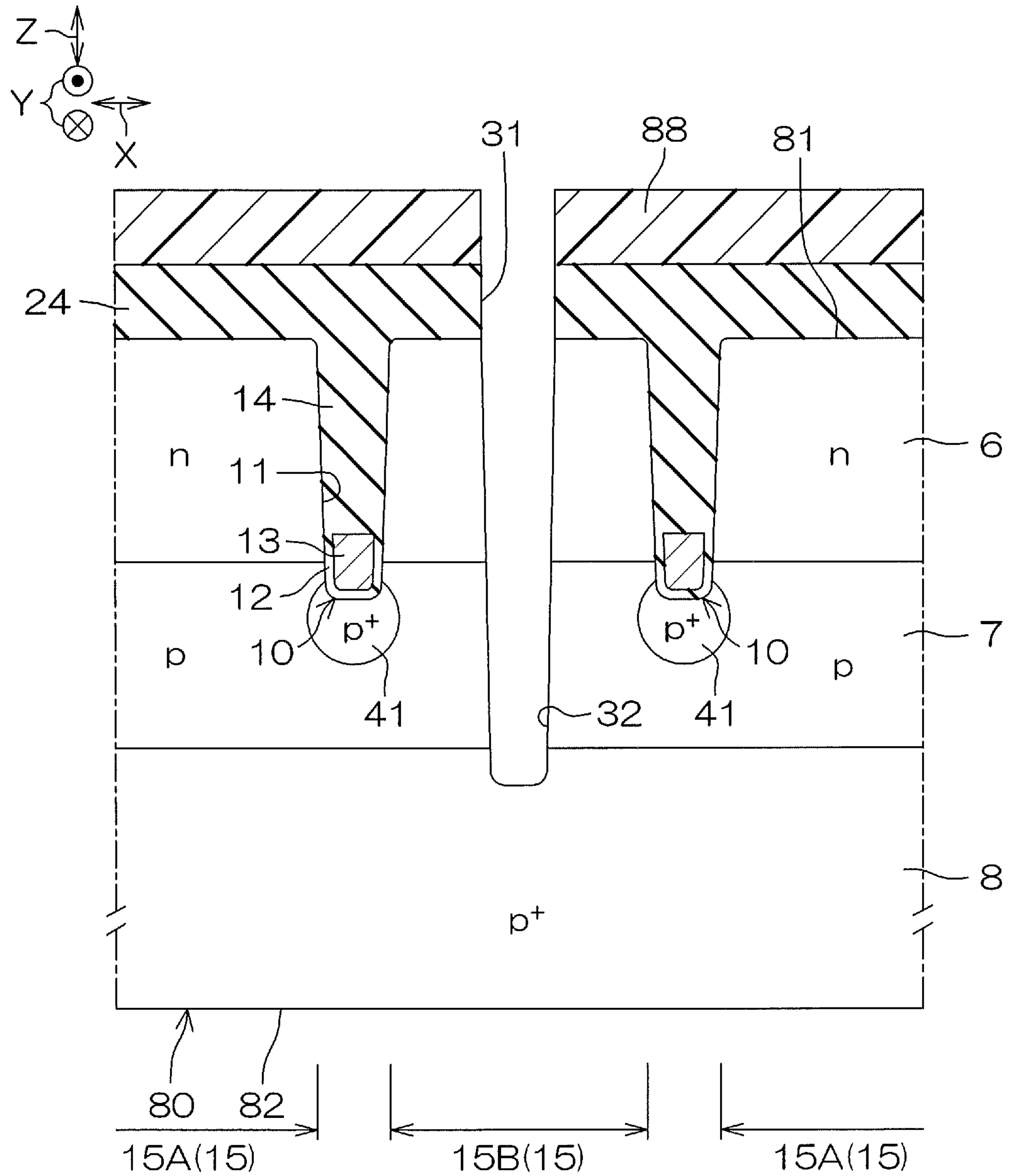

With reference to FIG. 11H, a second base insulating film 87 to be a base of the embedded insulator 14 and the main surface insulating film 24 is formed on the first wafer main surface 81. In this embodiment, the second base insulating film 87 is formed by a silicon oxide film. The second base insulating film 87 may be formed by a CVD method. The CVD method is preferably an HDP (high density plasma)-CVD method for the second base insulating film 87.

The second base insulating film 87 fills recess spaces partitioned by the plurality of pull-out portions 13*a* in the plurality of first trenches 11 and covers the first wafer main surface 81, the plurality of pull-out portions 13*a*, and the connection electrodes 23. After the second base insulating film 87 is formed, an exposed surface of the second base insulating film 87 may be flattened. The exposed surface of the second base insulating film 87 may be flattened by a CMP method. Thereby, the embedded insulators 14 positioned in the first trenches 11 and the main surface insulating film 24 positioned on the first wafer main surface 81 are formed.

With reference to FIG. 11I, the plurality of second trenches 32 are formed on the first wafer main surface 81. In this step, first, a resist mask 88 having predetermined patterns is formed on the main surface insulating film 24. The resist mask 88 exposes regions where the plurality of second trenches 32 are to be formed in the main surface insulating film 24 (first wafer main surface 81) and covers the other region. Next, an unnecessary portion of the main surface insulating film 24 is removed by an etching method via the resist mask 88. The etching method may be a wet etching method and/or a dry etching method (preferably, the RIE method). Thereby, the plurality of second connection openings 31 are formed in the main surface insulating film 24.

Next, an unnecessary portion of the wafer 80 is removed by an etching method via the resist mask 88. The etching method may be a wet etching method and/or a dry etching method (preferably, an RIE method). The unnecessary portion of the wafer 80 is removed until the unnecessary portion passes through the first semiconductor region 6 and the second semiconductor region 7, and the third semiconductor region 8 is exposed. Thereby, the plurality of second trenches 32 respectively including the second connection openings 31 are formed in the first wafer main surface 81. The resist mask 88 is removed after that.

Figure 11J:
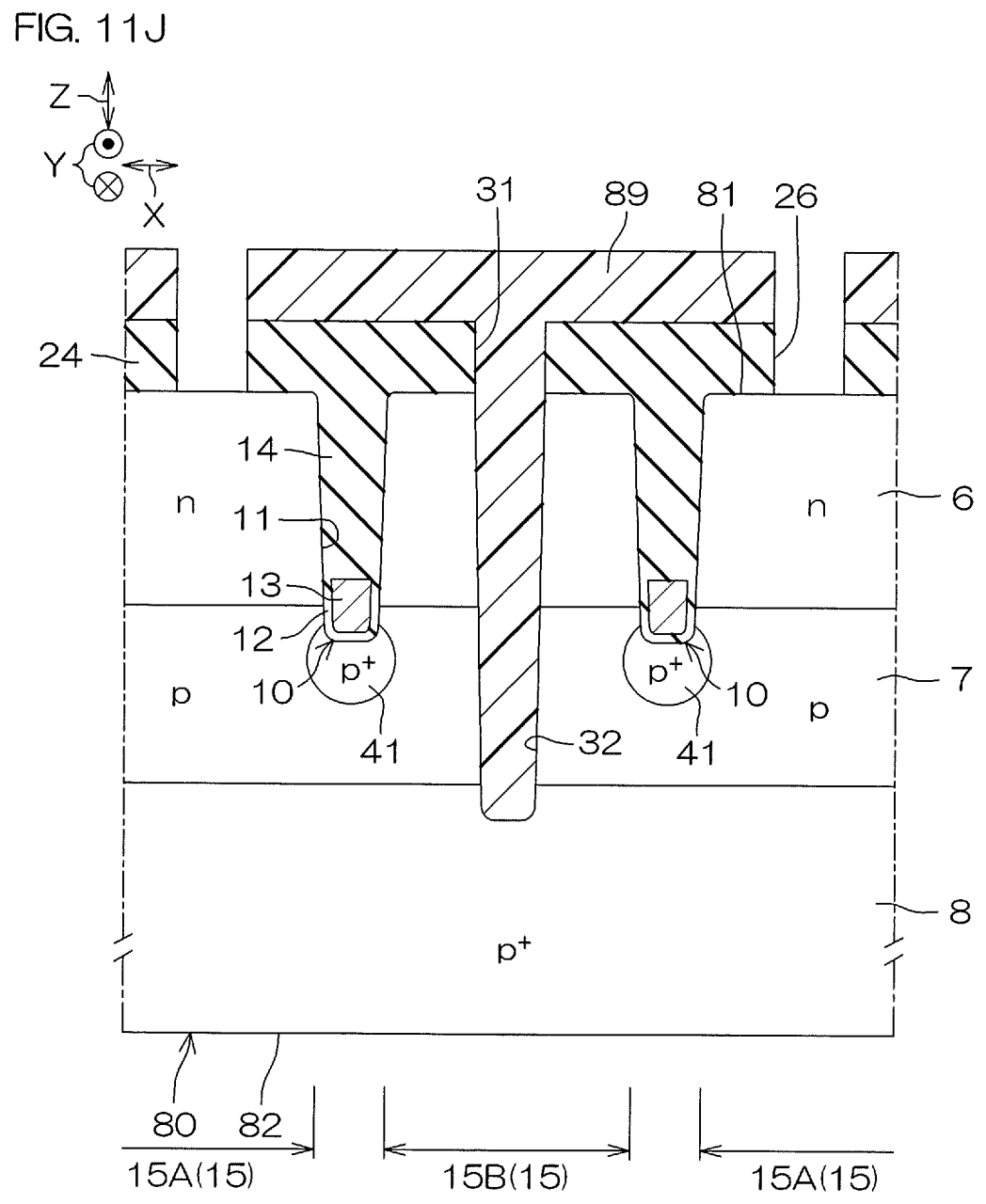

With reference to FIG. 11J, the plurality of first connection openings 26 and the plurality of third connection openings 38 are formed in the main surface insulating film 24. In this step, first, a resist mask 89 having predetermined patterns is formed on the main surface insulating film 24. The resist mask 89 exposes regions where the plurality of first connection openings 26 and the plurality of third connection openings 38 are to be formed in the main surface insulating film 24 and covers the other region.

Next, an unnecessary portion of the main surface insulating film 24 is removed by an etching method via the resist mask 89. The etching method may be a wet etching method and/or a dry etching method (preferably, an RIE method). Thereby, the plurality of first connection openings 26 and the plurality of third connection openings 38 are formed in the main surface insulating film 24. The resist mask 89 is removed after that.

Figure 11K:
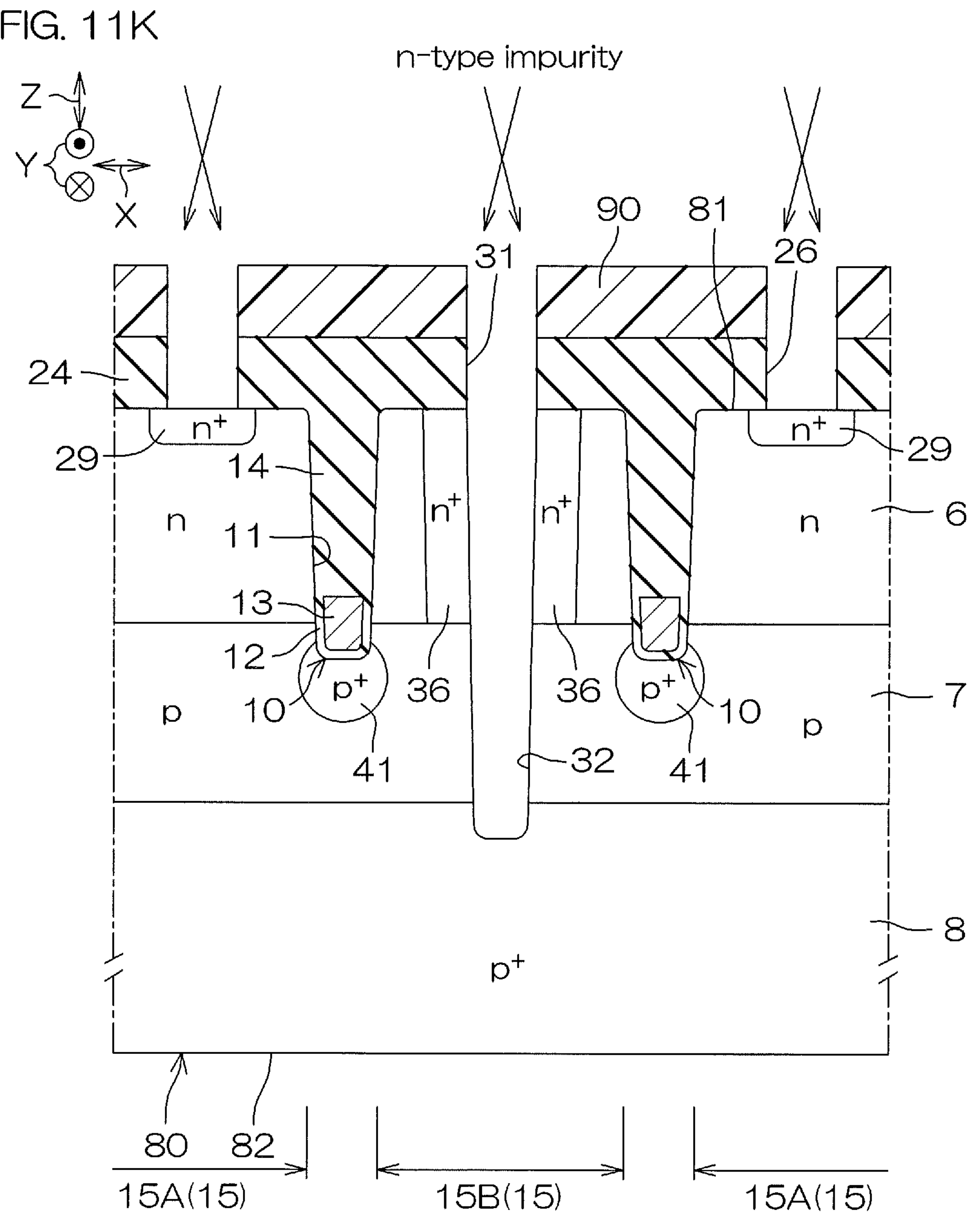

With reference to FIG. 11K, the plurality of first impurity regions 29 and the plurality of second impurity regions 36 are formed. In this step, first, an ion injection mask 90 having predetermined patterns is formed on the main surface insulating film 24. The ion injection mask 90 exposes regions where the plurality of first impurity regions 29 and the plurality of second impurity regions 36 are to be formed in the first wafer main surface 81 and covers the other region.

Next, an n-type impurity is introduced into a portion exposed from the main surface insulating film 24 in the first semiconductor region 6 by an ion injection method via the ion injection mask 90. In this embodiment, the n-type impurity is introduced into the first semiconductor region 6 by an angle obliquely inclined with respect to the first wafer main surface 81 by an oblique ion injection method.

Thereby, the plurality of first impurity regions 29 and the plurality of second impurity regions 36 are formed in a self-aligned manner with respect to the plurality of first connection openings 26, the plurality of second connection openings 31 (plurality of second trenches 32), and the plurality of third connection openings 38. The ion injection mask 90 is removed after that. As a matter of course, the n-type impurity may be introduced into the first semiconductor region 6 with the main surface insulating film 24 as an ion injection mask without using the ion injection mask 90.

Figure 11L:
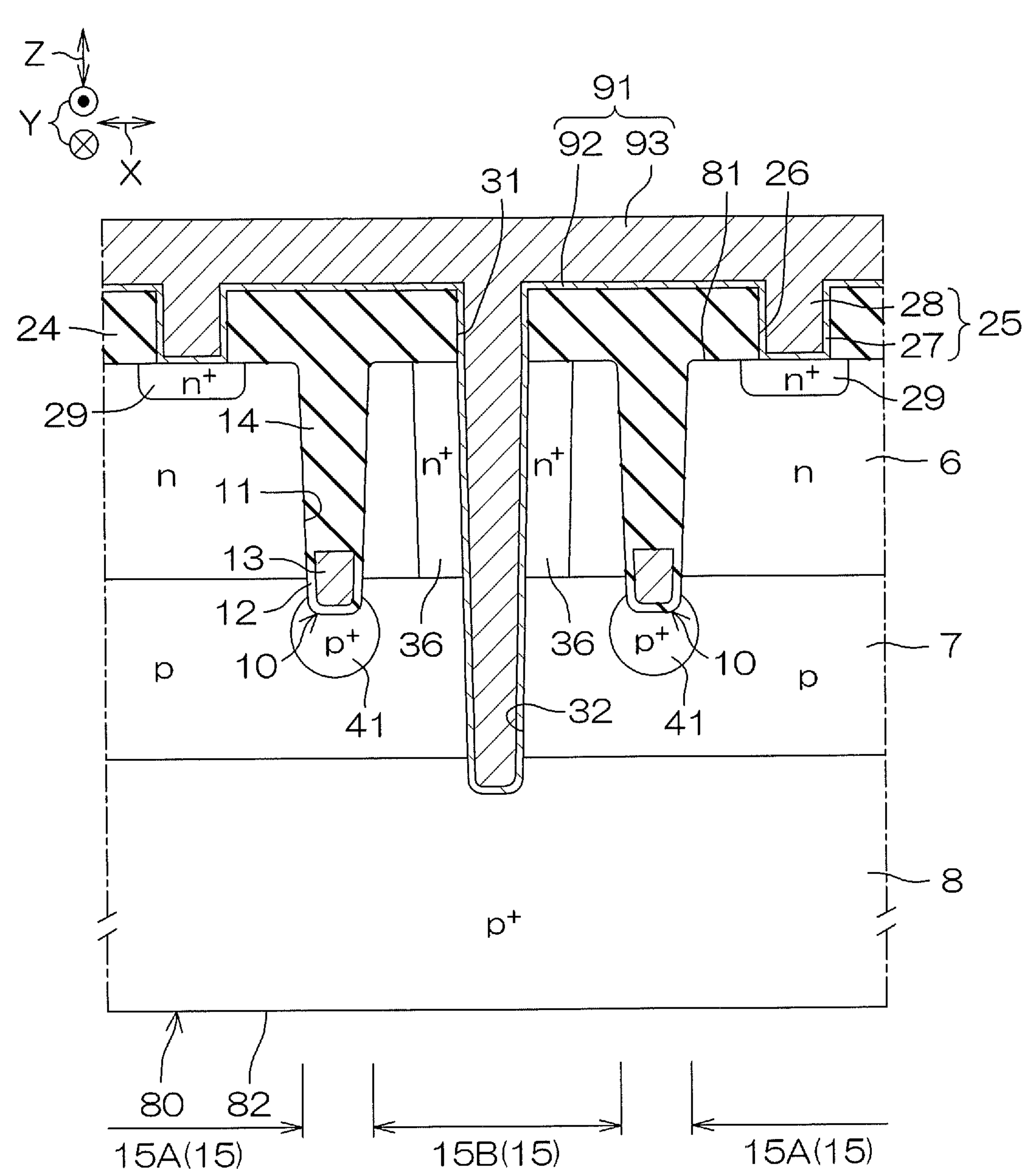

With reference to FIG. 11L, a second base electrode 91 to be a base of the plurality of first electrodes 25, the plurality of second electrodes 33, and the plurality of third electrodes 37 is formed on the main surface insulating film 24. The second base electrode 91 fills the plurality of first connection openings 26, the plurality of second trenches 32 (second connection openings 31), and the plurality of third connection openings 38 and covers the main surface insulating film 24.

In this embodiment, the second base electrode 91 has a base barrier film 92 and an electrode main body film 93 laminated in this order from the wafer 80 side. The base barrier film 92 is a base of the plurality of first to third barrier films 27, 34, 39, and the electrode main body film 93 is a base of the plurality of first to third electrode main bodies 28, 35, 40. The base barrier film 92 and the electrode main body film 93 may be formed by a sputtering method and/or an evaporation method.

Figure 11M:
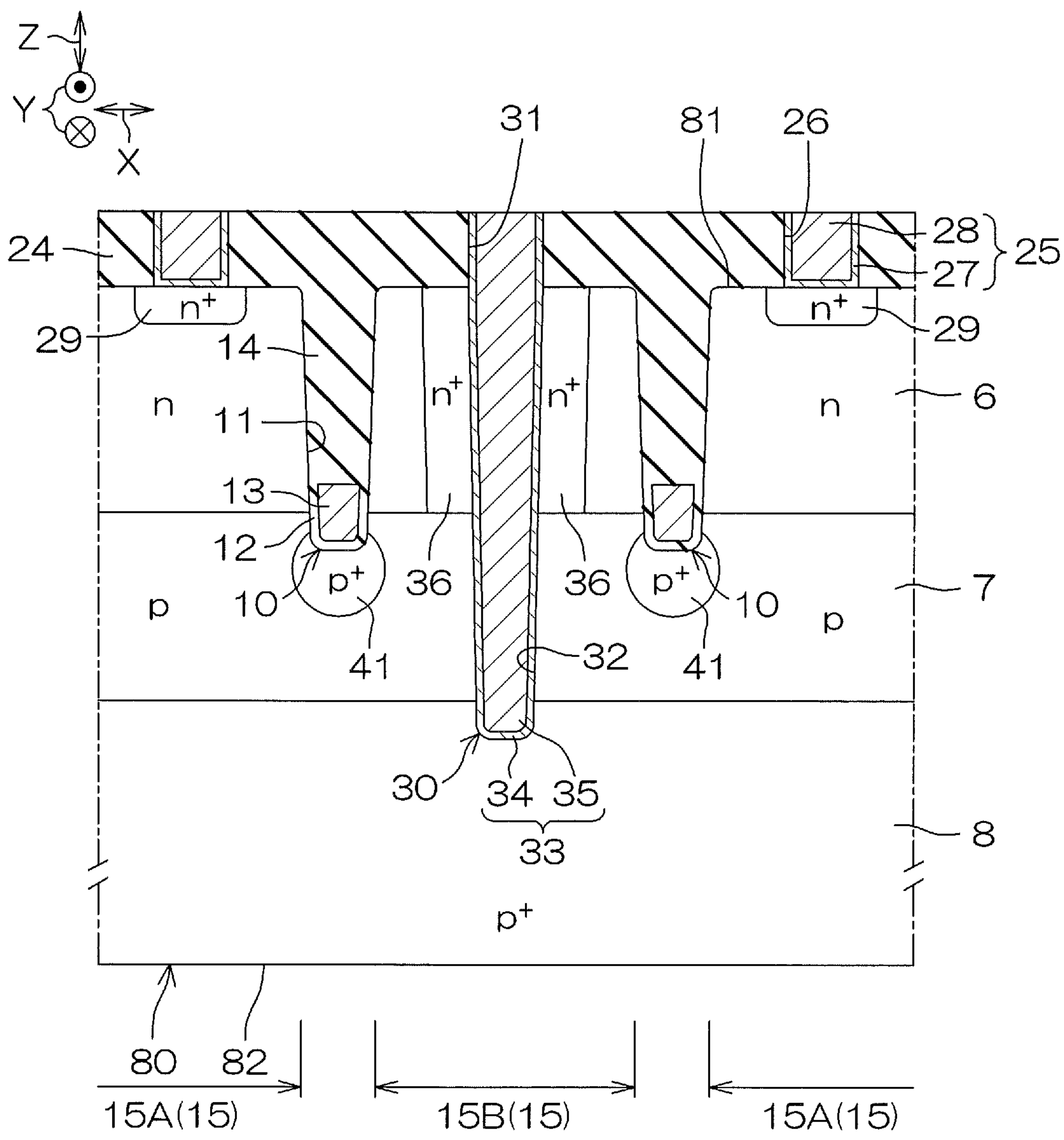

With reference to FIG. 11M, an unnecessary portion of the second base electrode 91 is removed by an etching method. The etching method may be a wet etching method and/or a dry etching method (preferably, an RIE method). The second base electrode 91 is removed until the main surface insulating film 24 is exposed. Thereby, the plurality of first electrodes, 25, the plurality of second electrodes 33, and the plurality of third electrodes 37 are formed.

Figure 11N:
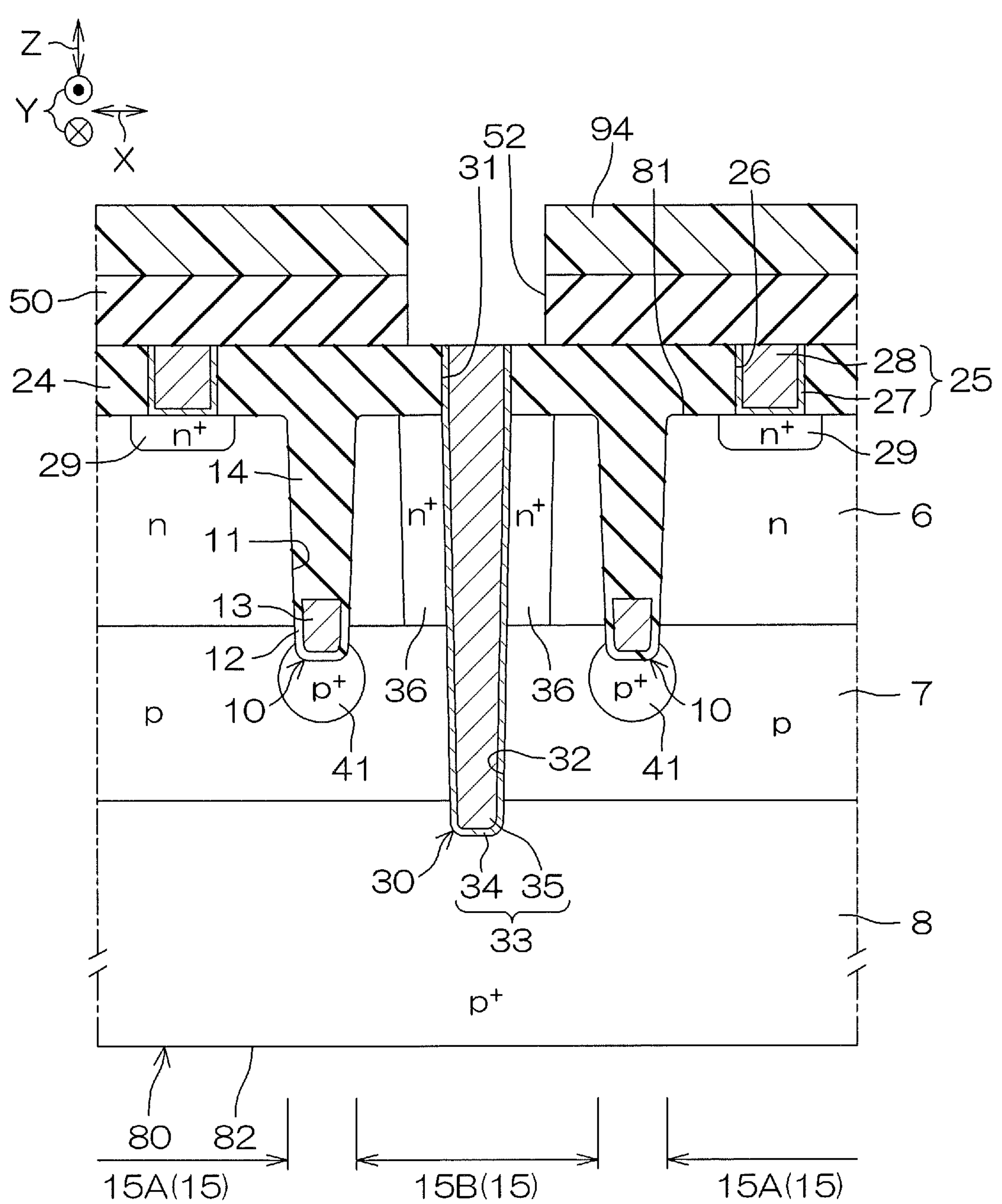

With reference to FIG. 11N, the first interlayer insulating film 50 is formed on the main surface insulating film 24. In this embodiment, the first interlayer insulating film 50 is formed by a silicon oxide film. The first interlayer insulating film 50 may be formed by a CVD method. Next, a resist mask 94 having predetermined patterns is formed on the first interlayer insulating film 50. The resist mask 94 exposes regions where the plurality of first lower side openings 51, the plurality of second lower side openings 52, and the plurality of third lower side openings 53 are to be formed and covers the other region.

Next, an unnecessary portion of the first interlayer insulating film 50 is removed by an etching method via the resist mask 94. The first interlayer insulating film 50 is removed until the main surface insulating film 24 is exposed. The etching method may be a wet etching method and/or a dry etching method (preferably, an RIE method). Thereby, the plurality of first lower side openings 51, the plurality of second lower side openings 52, and the plurality of third lower side openings 53 are formed in the main surface insulating film 24. The resist mask 94 is removed after that.

With reference to FIG. 11O, a third base electrode 95 to be a base of the first interlayer wiring 54 (the first lower side wiring 55, the plurality of second lower side wirings 56, and the third lower side wiring 57) is formed on the first interlayer insulating film 50. In this embodiment, the third base electrode 95 is formed by an Al-based electrode. The third base electrode 95 may be formed by a sputtering method and/or an evaporation method. The third base electrode 95 fills the plurality of first lower side openings 51, the plurality of second lower side openings 52, and the plurality of third lower side openings 53, and covers the first interlayer insulating film 50.

Next, a resist mask 96 having predetermined patterns is formed on the third base electrode 95. The resist mask 96 covers a region where the first interlayer wiring 54 is to be formed and exposes the other region. Next, an unnecessary portion of the third base electrode 95 is removed by an etching method via the resist mask 96. The etching method may be a wet etching method and/or a dry etching method (preferably, an RIE method). Thereby, the first interlayer wiring 54 is formed. The resist mask 96 is removed after that.

Figure 11P:
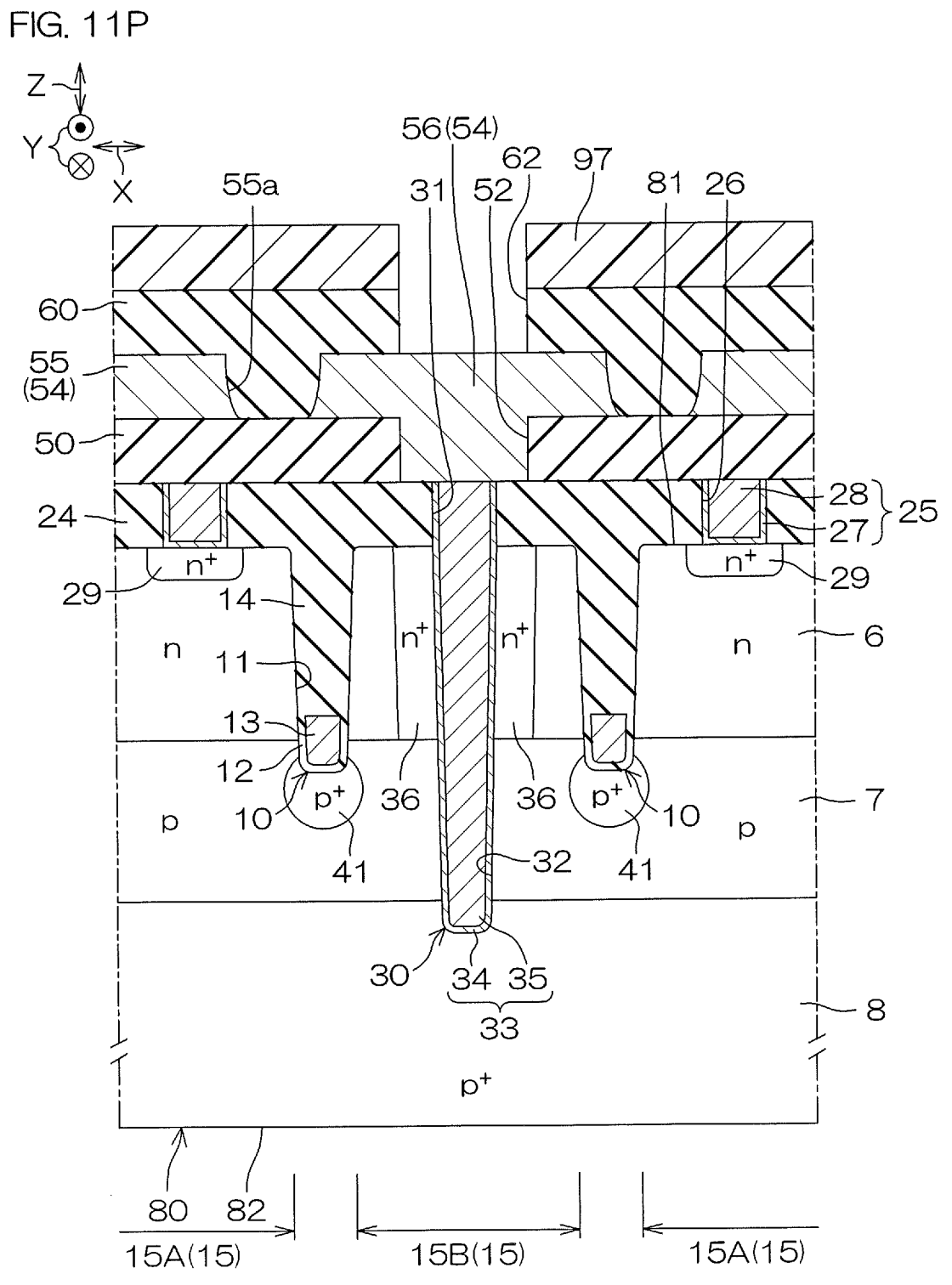
Figure 11Q:
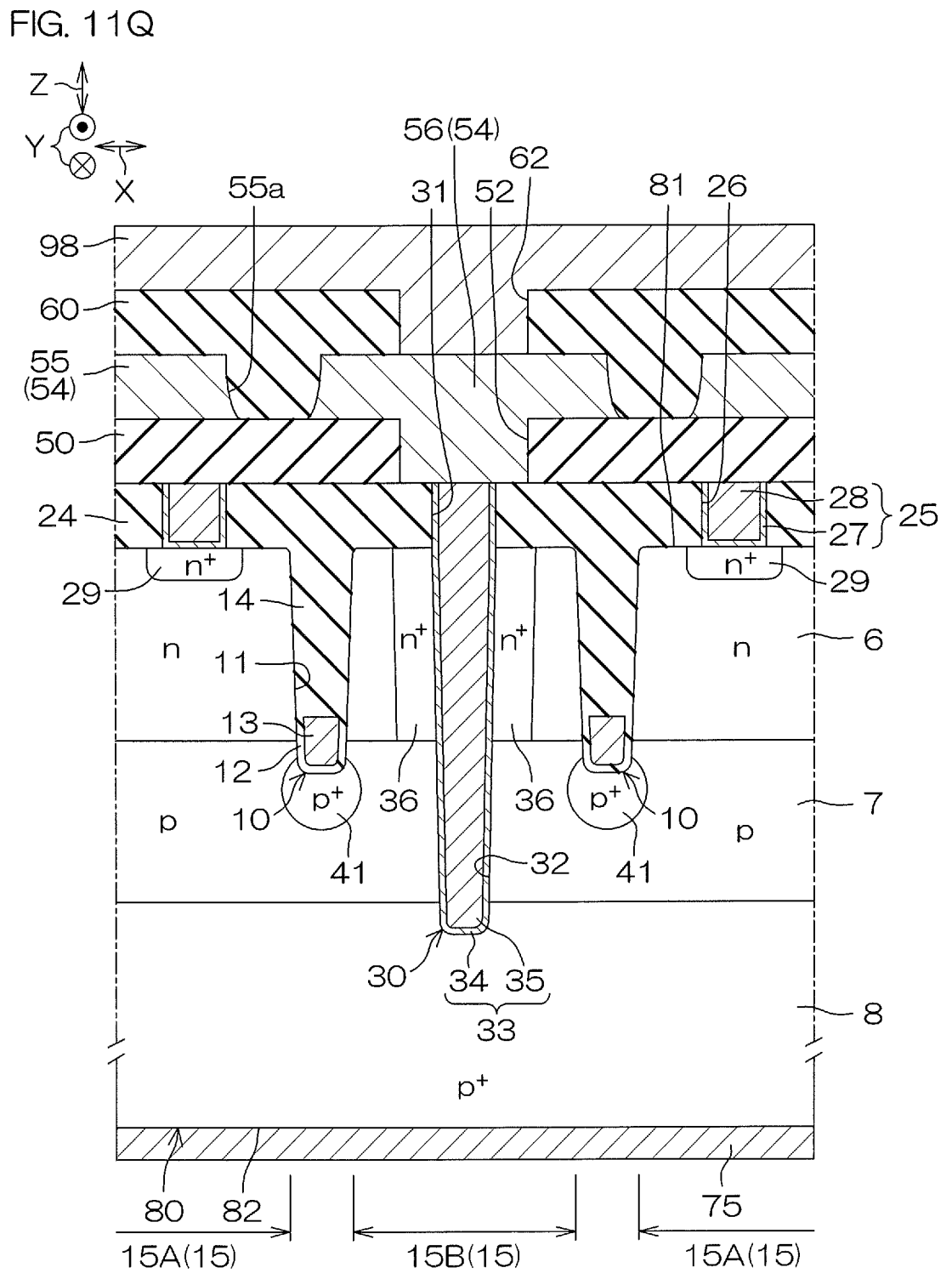

With reference to FIG. 11P, the second interlayer insulating film 60 is formed on the first interlayer insulating film 50. In this embodiment, the second interlayer insulating film 60 is formed by a silicon oxide film. The second interlayer insulating film 60 may be formed by a CVD method. Next, a resist mask 97 having predetermined patterns is formed on the second interlayer insulating film 60. The resist mask 97 exposes regions where the plurality of first upper side openings 61, the plurality of second upper side openings 62, and the third upper side opening 63 are to be formed and covers the other region.

Next, an unnecessary portion of the second interlayer insulating film 60 is removed by an etching method via the resist mask 97. The etching method may be a wet etching method and/or a dry etching method (preferably, an RIE method). The second interlayer insulating film 60 is removed until the first interlayer wiring 54 is exposed. Thereby, the plurality of first upper side openings 61, the plurality of second upper side openings 62, and the third upper side opening 63 are formed in the main surface insulating film 24. The resist mask 97 is removed after that.

With reference to FIG. 11Q, a fourth base electrode 98 to be a base of the second interlayer wiring 64 (the plurality of first upper side wirings 65, the plurality of second upper side wirings 66, and the third upper side wiring 67) is formed on the second interlayer insulating film 60. In this embodiment, the fourth base electrode 98 is formed by an A1-based electrode. The fourth base electrode 98 may be formed by a sputtering method and/or an evaporation method. The fourth base electrode 98 fills the plurality of first upper side openings 61, the plurality of second upper side openings 62, and the third upper side opening 63 and covers the second interlayer insulating film 60.

Next, a resist mask (not shown) having predetermined patterns is formed on the fourth base electrode 98. The resist mask (not shown) covers a region where the second interlayer wiring 64 is to be formed, and exposes the other region. Next, an unnecessary portion of the fourth base electrode 98 is removed by an etching method via the resist mask (not shown). The etching method may be a wet etching method and/or a dry etching method (preferably, an RIE method). Thereby, the second interlayer wiring 64 is formed. The resist mask (not shown) is removed after that.

After that, the uppermost insulating film 70 and the base electrode 75 are respectively formed, and the wafer 80 is selectively cut in the thickness direction. Prior to a step of forming the base electrode 75, a step of grinding the second wafer main surface 82 may be implemented. After the steps including the above steps, the semiconductor device 1A is manufactured.

As described above, the semiconductor device 1A includes the chip 2, the n-type (first conductivity type) first semiconductor region 6, the p-type (second conductivity type) second semiconductor region 7, the first trench structures 10 (first groove structures), the first electrodes 25, and the second trench structures 30 (second groove structures). The chip 2 has the first main surface 3 on one side, and the second main surface 4 on the other side. The first semiconductor region 6 is formed in the region on the first main surface 3 side in the chip 2. The second semiconductor region 7 is formed in the region on the second main surface 4 side than the first semiconductor region 6 in the chip 2.

The first trench structure 10 includes the first trench 11 (first groove), the gate insulating film 12 (control insulating film), and the gate electrode 13 (control electrode). The first trench 11 is formed in the first main surface 3 while passing through the first semiconductor region 6 so as to partition the first semiconductor region 6 into the first mesa portion 15A (first region) on one side and the second mesa portion 15B (second region) on the other side in a cross-sectional view. The gate insulating film 12 covers the wall surface of the first trench 11. The gate electrode 13 is embedded in the first trench 11 while sandwiching the gate insulating film 12, and controls the channel 42 in the second semiconductor region 7.

The first electrode 25 is electrically connected to the first semiconductor region 6 in the first mesa portion 15A. The second trench structure 30 includes the second trench 32 (second groove) and the second electrode 33. The second trench 32 is formed in the first main surface 3 while passing through the first semiconductor region 6 in the second mesa portion 15B. The second electrode 33 is embedded in the second trench 32 and forms the current path via the channel 42 between the first electrode 25 and the second electrode 33.

According to this structure, the trench gate lateral type MISFET structure in which the current path between the first electrode 25 and the second electrode 33 inside the chip 2 is controlled by the first trench structure 10 is configured. Therefore, it is possible to provide the semiconductor device 1A having the new structure (MISFET structure).

Also, according to this structure, in comparison to the case where the second electrode 33 is arranged on the same layer as the first electrode 25, it is possible to shorten the current path between the first electrode 25 and the second electrode 33. Thus, it is possible to reduce ON resistance. Also, since it is possible to increase the volume (wiring area) of the second electrode 33 inside the chip 2 in the thickness direction of the chip 2, it is possible to reduce wiring resistance of the second electrode 33. Also, since the second electrode 33 is arranged inside the chip 2, it is possible to ease wiring rules of the first electrode 25. Thereby, it is possible to increase a wiring area of the first electrode 25. Thus, it is possible to reduce wiring resistance of the first electrode 25.

The second electrode 33 is preferably electrically connected to both the first semiconductor region 6 and the second semiconductor region 7 in the second trench 32. The second trench 32 is preferably deeper than the first trench 11. According to these structures, it is possible to properly shorten the current path between the first electrode 25 and the second electrode 33. Also, it is possible to properly increase the volume of the second electrode 33 in the thickness direction of the chip 2.

The semiconductor device 1A preferably includes the first impurity region 29 and the second impurity region 36. The first impurity region 29 is formed in the first mesa portion 15A at a concentration higher than that of the first semiconductor region 6 so as to be electrically connected to the first electrode 25. The second impurity region 36 is formed in the second mesa portion 15B at a concentration higher than that of the first semiconductor region 6 so as to be electrically connected to the second electrode 33.

According to this structure, it is possible to reduce contact resistance of the first semiconductor region 6 with respect to the first electrode 25 by the first impurity region 29, and it is possible to reduce contact resistance of the first semiconductor region 6 with respect to the second electrode 33 by the second impurity region 36. Also, it is possible to form the current path via the first impurity region 29 and the second impurity region 36 between the first electrode 25 and the second electrode 33. Therefore, it is possible to properly reduce the ON resistance.

The second impurity region 36 is preferably formed to be deeper than the first impurity region 29. According to this structure, it is possible to properly reduce the ON resistance by the relatively deep second impurity region 36. Preferably, the first impurity region 29 extends in the lateral direction along the first main surface 3 in a cross-sectional view, and the second impurity region 36 extends in the vertical direction along the second trench structure 30 in a cross-sectional view. The second impurity region 36 preferably extends along the wall surface of the second trench structure 30 so as to be in contact with the second electrode 33. According to this structure, it is possible to properly reduce the contact resistance of the first semiconductor region 6 with respect to the second electrode 33 by the second impurity region 36.

The gate electrode 13 is preferably embedded in the first trench 11 while being spaced from the first main surface 3 on the bottom wall side of the first trench 11. The gate electrode 13 is particularly preferably embedded in the first trench 11 while being spaced from the intermediate portion of the first trench 11 on the bottom wall side of the first trench 11. According to these structures, it is possible to suppress electric field concentration with respect to the first trench structure 10.

The first trench structure 10 preferably further includes the embedded insulator 14 embedded in the first trench 11 so as to cover the gate electrode 13. According to this structure, it is possible to make the embedded insulator 14 function as a field insulating film in the first trench 11. Thereby, it is possible to suppress the electric field concentration with respect to the first trench structure 10 by the embedded insulator 14. Regarding the depth direction of the first trench 11, the thickness of the embedded insulator 14 preferably exceeds the thickness of the gate electrode 13. According to this structure, it is possible to properly suppress the electric field concentration with respect to the first trench structure 10 by the embedded insulator 14.

The semiconductor device 1A preferably includes the main surface insulating film 24 that covers the first main surface 3 and the first trench structure 10. In this case, preferably, the first electrode 25 passes through the main surface insulating film 24 and the second trench structure 30 has the second trench 32 passing through the main surface insulating film 24. In this structure, the second electrode 33 preferably has the portion positioned on the chip 2 side with respect to the first main surface 3 and the portion positioned on the main surface insulating film 24 side with respect to the first main surface 3 in the second trench 32. The main surface insulating film 24 is preferably thicker than the gate insulating film 12.

The semiconductor device 1A preferably includes the p-type bottom wall impurity region 41 formed along the bottom wall of the first trench structure 10 in the second semiconductor region 7. According to this structure, it is possible to suppress the depletion layer spreading from the first semiconductor region 6 from overlapping in the region along the bottom wall of the first trench structure 10 by the bottom wall impurity region 41. Thereby, it is possible to suppress the punch-through of the first semiconductor region 6.

The semiconductor device 1A may include the p-type third semiconductor region 8 formed in the region on the second main surface 4 side than the second semiconductor region 7 in the chip 2, the third semiconductor region having a higher impurity concentration than the second semiconductor region 7. According to this structure, the second semiconductor region 7 whose concentration is lower than the third semiconductor region 8 forms the pn junction portion with the first semiconductor region 6.

Thereby, it is possible to properly spread the depletion layer from the second semiconductor region 7 into the first semiconductor region 6, and it is possible to improve the withstand voltage (breakdown voltage). In this case, preferably, the bottom wall of the first trench structure 10 is positioned in the second semiconductor region 7, and the bottom wall of the second trench structure 30 is positioned in the third semiconductor region 8. According to this structure, it is possible to form the channel 42 of the MISFET structure in the second semiconductor region 7, and at the same time, it is possible to properly electrically connect the second trench structure 30 to the second semiconductor region 7.

The gate electrode 13 may include a non-metal conductor. The second electrode 33 preferably includes metal. According to this structure, it is possible to properly reduce the wiring resistance of the second electrode 33. The plurality of first trench structures 10 may be formed, and the second trench structure 30 may be formed in the region between the plurality of first trench structures 10. The chip 2 may include an Si monocrystal or an SiC monocrystal.

The semiconductor device 1A preferably further includes the first lower side wiring 55 (first wiring) and the second lower side wiring 56 (second wiring). The first lower side wiring 55 is arranged on the first electrode 25 so as to be electrically connected to the first electrode 25. The second lower side wiring 56 is arranged on the second electrode 33 so as to be electrically connected to the second electrode 33.

In this case, the second lower side wiring 56 preferably has the plane area less than the plane area of the first lower side wiring 55. According to this structure, it is possible to form the second electrode 33 having the relatively large volume (wiring area) inside the chip. Thus, it is possible to reduce the wiring area of the second lower side wiring 56. Thereby, by the reduced amount of the wiring area of the second lower side wiring 56, it is possible to increase the wiring area of the first lower side wiring 55. Therefore, it is possible to reduce the wiring resistance of the first lower side wiring 55.

The semiconductor device 1A preferably includes the base electrode 75 that covers the second main surface 4 so as to be electrically connected to the second semiconductor region 7. The base electrode 75 is particularly preferably electrically connected to the second electrode 33 via the second semiconductor region 7. The base electrode 75 may be arranged so that an electric potential is applied from the second electrode 33 via the second semiconductor region 7. The base electrode 75 may be arranged so that an electric potential is to be applied to the second electrode 33 via the second semiconductor region 7.

Figure 12:
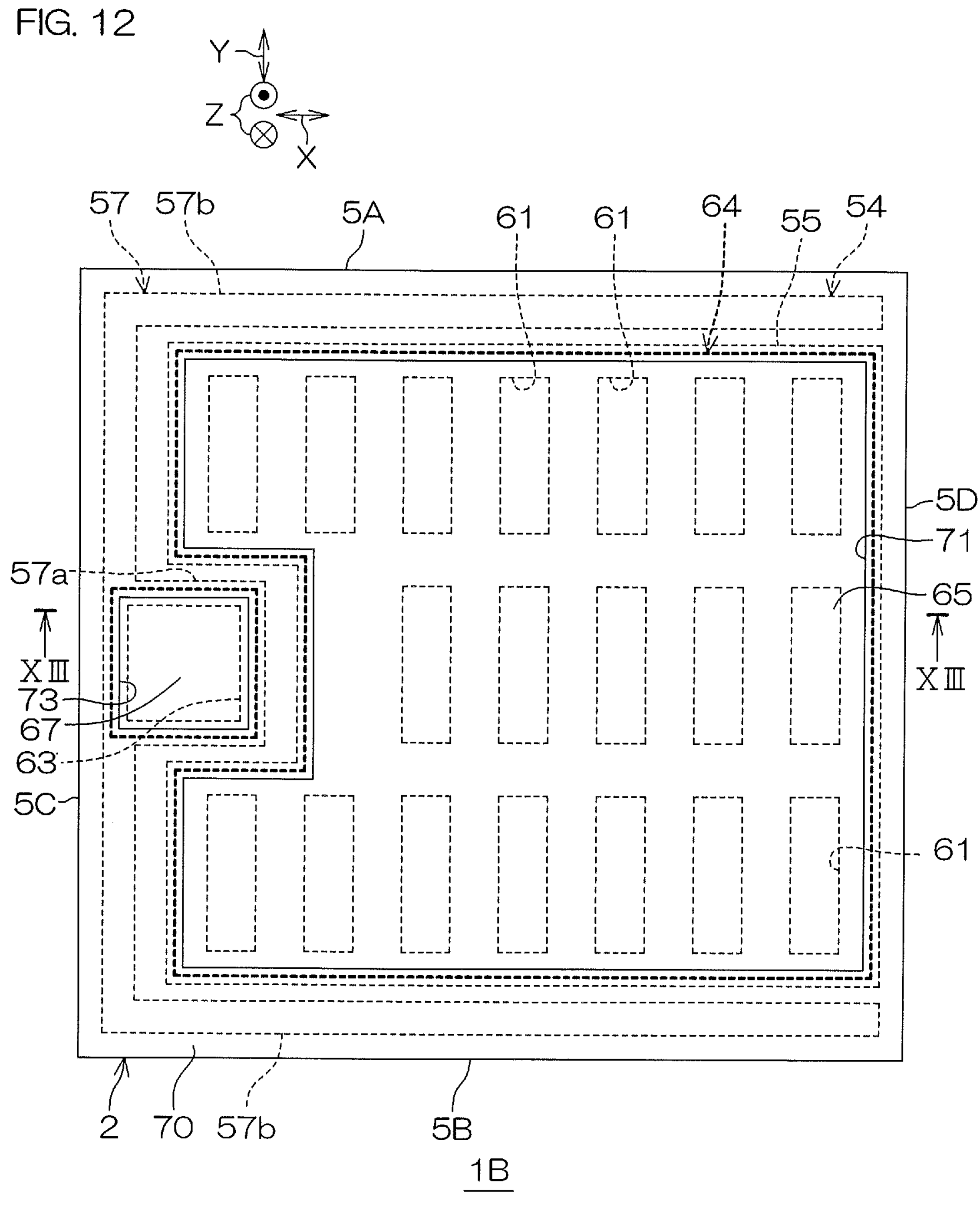
FIG. 12 is a schematic plan view showing a semiconductor device according to a second embodiment.
Figure 13:
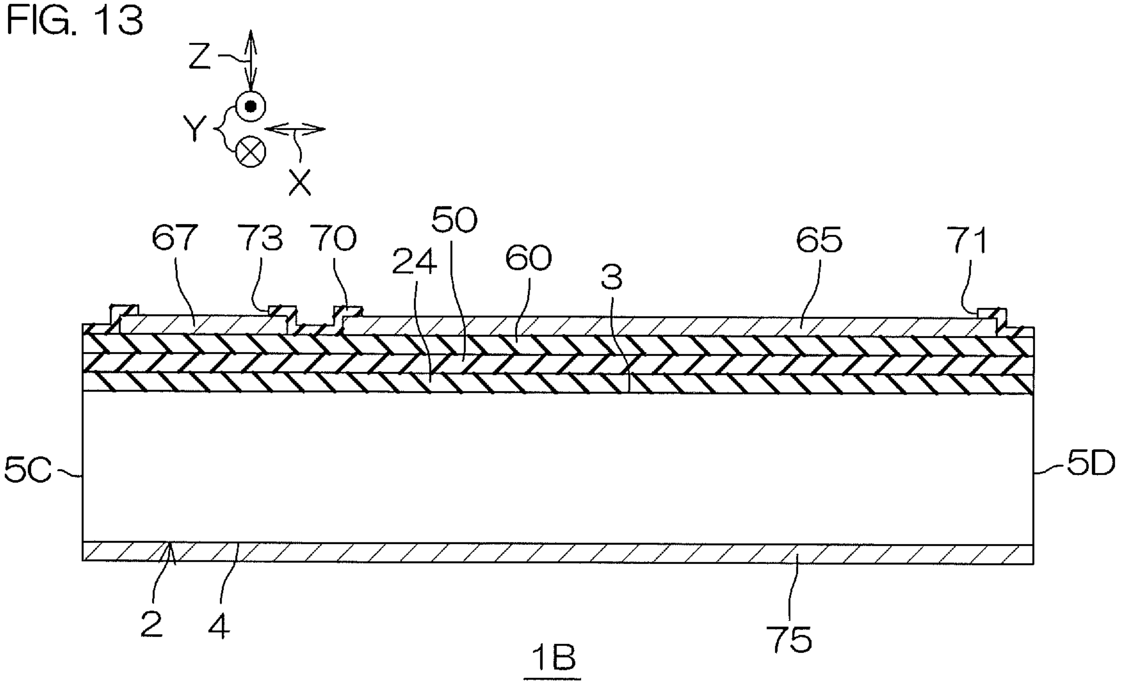
FIG. 13 is a cross-sectional view taken along line XIII-XIII shown in FIG. 12.
Figure 14:
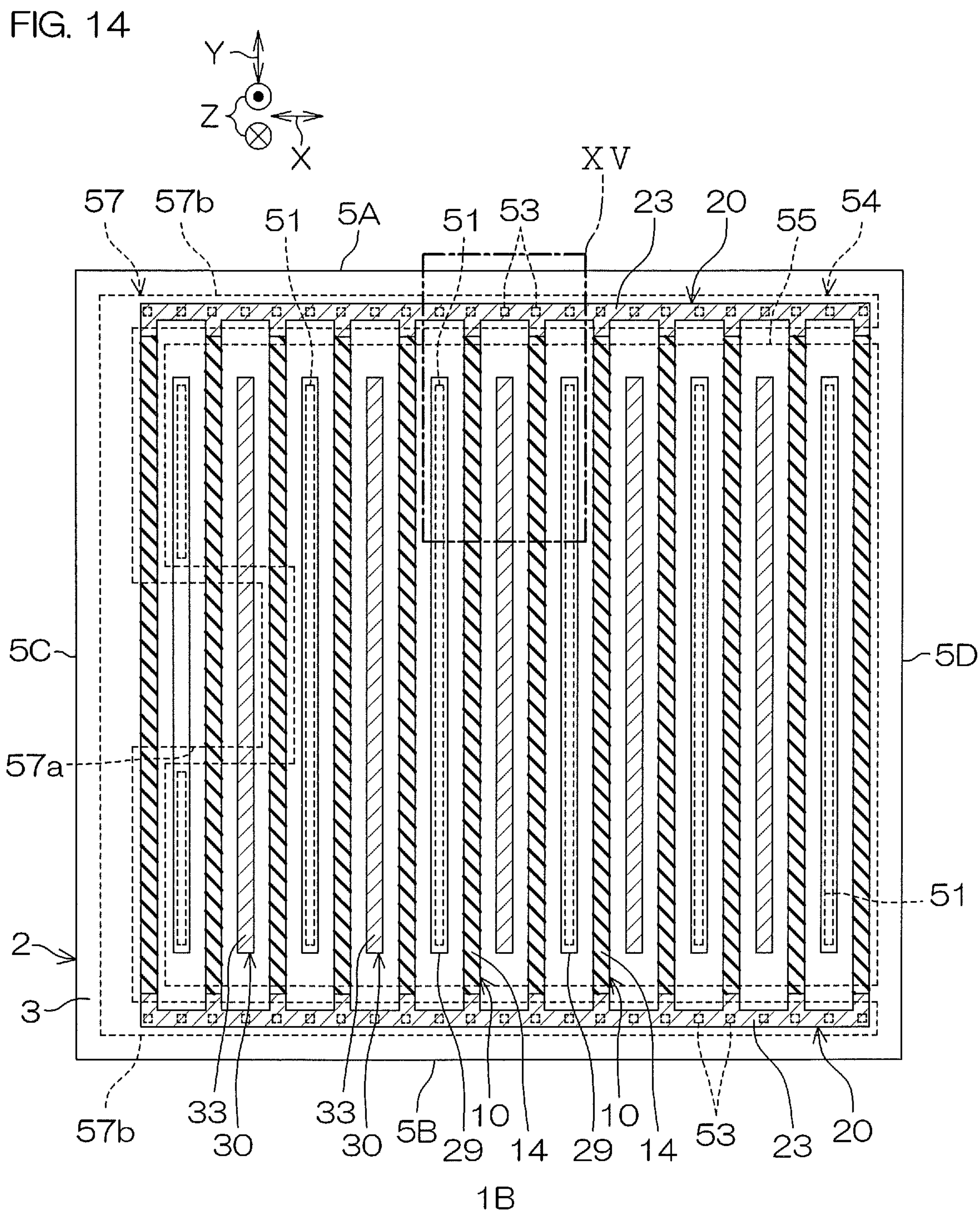
FIG. 14 is a schematic plan view showing a layout example of a first main surface of a chip according to the second embodiment.
Figure 15:
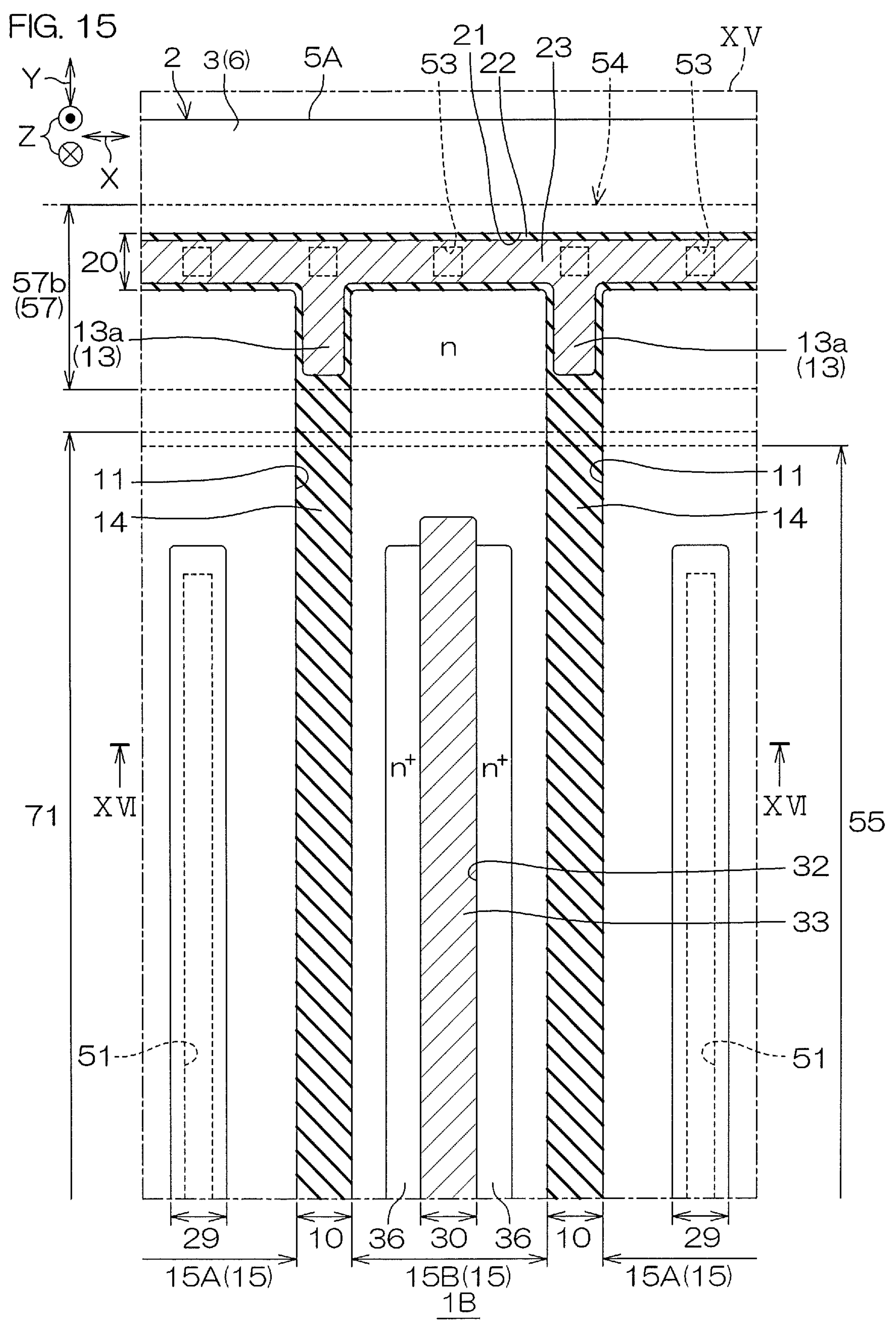
FIG. 15 is an enlarged view of a region XV shown in FIG. 14.
Figure 16:
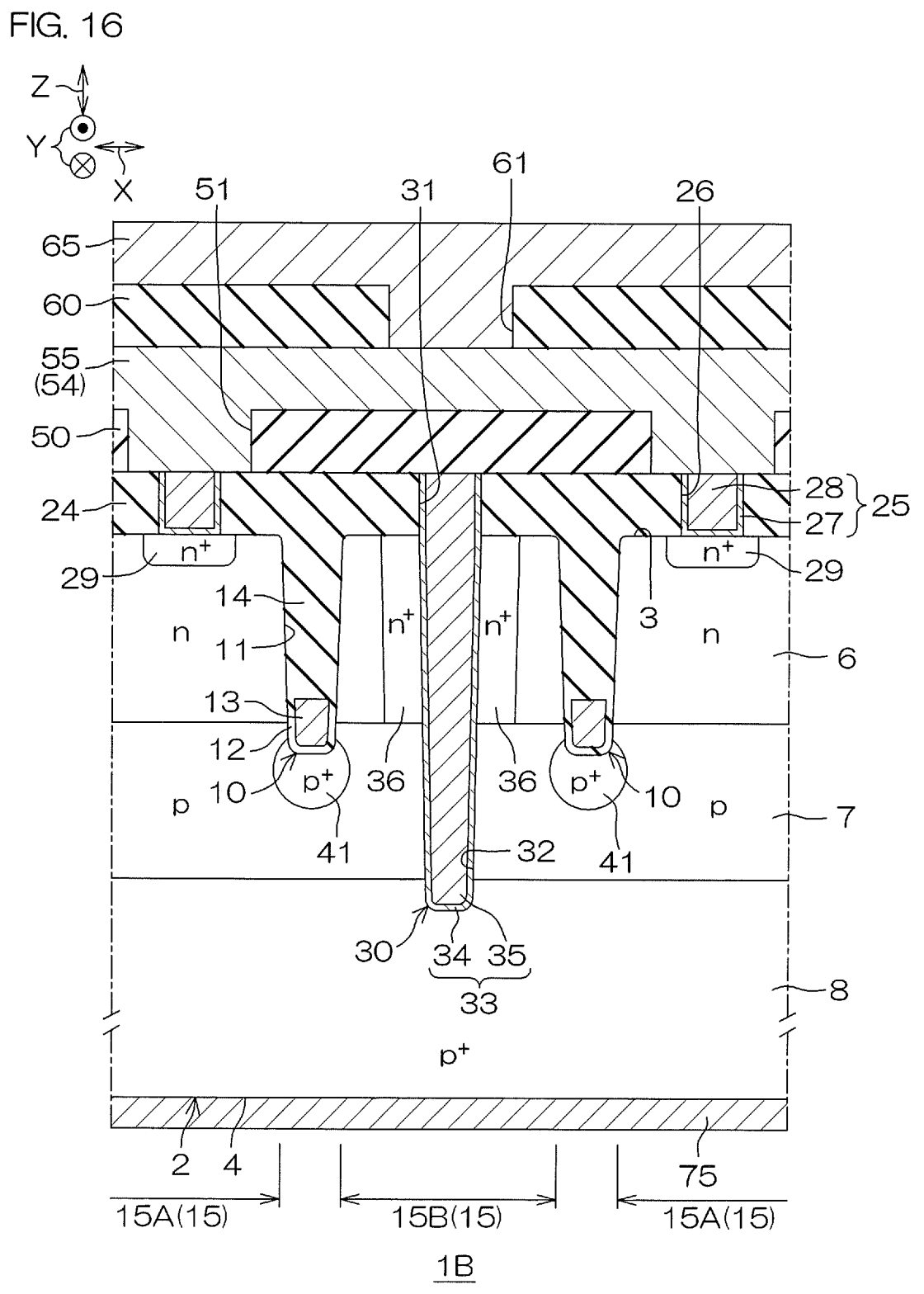
Figure 17:
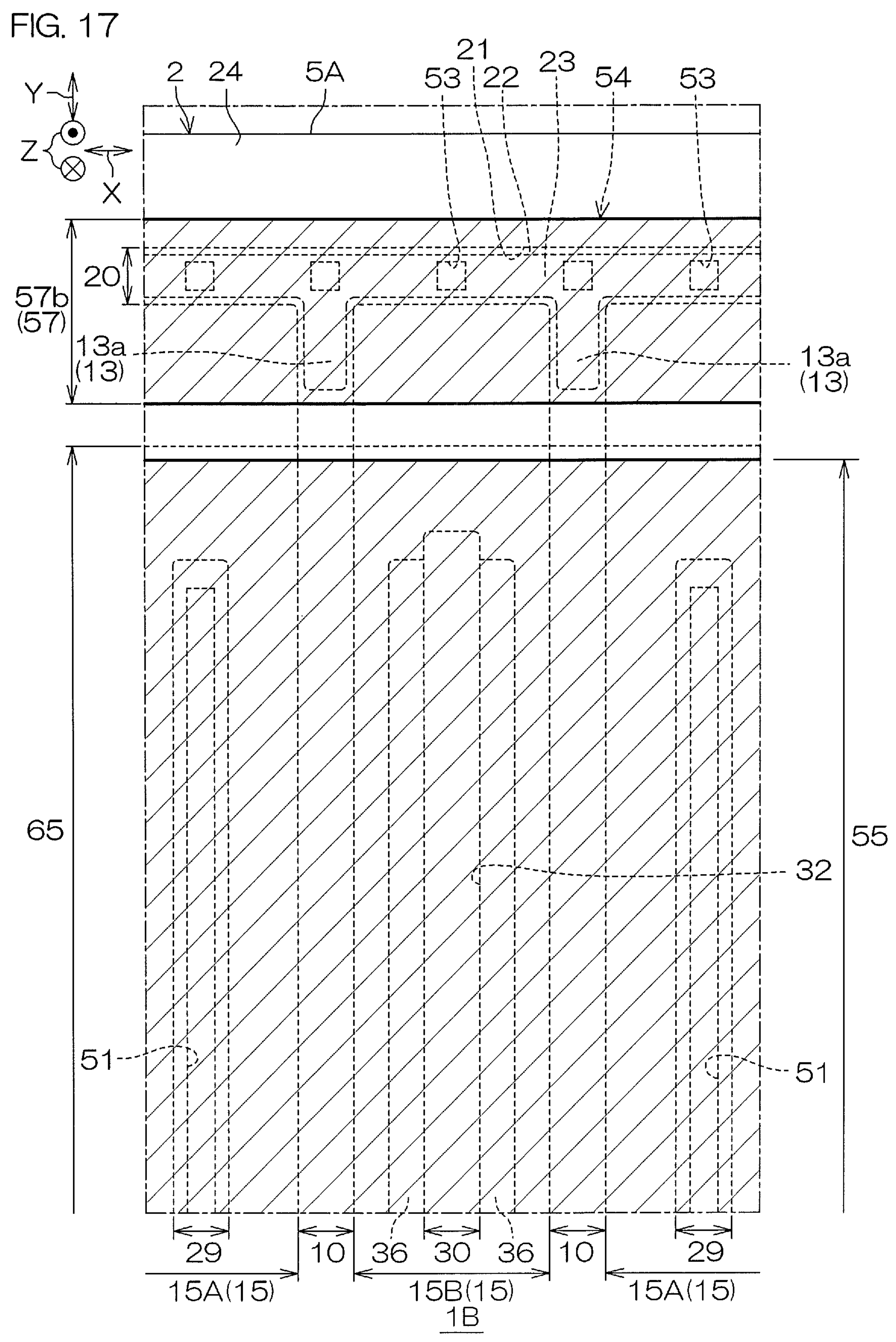
FIG. 17 is an enlarged view corresponding to the region shown in FIG. 15, the view showing a layout example of a first layer wiring arranged on the chip.

FIG. 12 is a schematic plan view showing a semiconductor device 1B according to a second embodiment. FIG. 13 is a cross-sectional view taken along line XIII-XIII shown in FIG. 12. FIG. 14 is a schematic plan view showing a layout example of a first main surface 3 of a chip 2 according to the second embodiment. FIG. 15 is an enlarged view of a region XV shown in FIG. 14. FIG. 16 a cross-sectional view taken along line XVI-XVI shown in FIG. 15. FIG. 17 is an enlarged view corresponding to the region shown in FIG. 15, the view showing a layout example of a first interlayer wiring 54 arranged on the chip 2.

With reference to FIGS. 12 to 17, the semiconductor device 1B is a switching device of a trench gate three-dimensional type MISFET structure including both characteristics of a lateral type in which a current path is formed in the lateral direction along the first main surface 3 and characteristics of a vertical type in which a current path is formed in the vertical direction perpendicular to the first main surface 3. A structure inside the chip 2 according to the semiconductor device 1B is substantially the same as the structure inside the chip 2 according to the semiconductor device 1A.

The semiconductor device 1B is formed by changing layouts of the masks for forming wirings in FIGS. 11A to 11Q described above, and has wiring patterns and voltage application conditions different from the semiconductor device 1A. Specifically, the semiconductor device 1B has only a wiring electrically connected to first mesa portions 15A (first electrodes 25) and a wiring electrically connected to first trench structures 10, and does not have a wiring electrically connected to second mesa portions 15B (second trench structures 30). Hereinafter, structures in the semiconductor device 1B different from the semiconductor device 1A will be described.

The semiconductor device 1B includes the above-described first interlayer insulating film 50 that is laminated on a main surface insulating film 24. In this embodiment, the first interlayer insulating film 50 is formed on the main surface insulating film 24 so as to cover both end portions and inward portions of the plurality of second trench structures 30. In this embodiment, the first interlayer insulating film 50 covers the entire region of the plurality of second trench structures 30. Therefore, the first interlayer insulating film 50 includes a plurality of first lower side openings 51 and a plurality of third lower side openings 53, and does not include second lower side openings 52 from which the second trench structures 30 are exposed. The plurality of third lower side openings 53 are formed in the same mode as with the case of the first embodiment.

In this embodiment, the plurality of first electrodes 25 are exposed from the plurality of first lower side openings 51 in a one-to-one correspondence. The plurality of first lower side openings 51 are respectively formed in a band shape extending along the corresponding first electrodes 25. As a matter of course, the plurality of first lower side openings 51 may be provided in a one-to-many correspondence for each first electrode 25 so that the first electrode 25 is exposed from plural portions as with the case of the first embodiment.

The semiconductor device 1B includes the above-described first interlayer wiring 54 that is formed on the first interlayer insulating film 50. In this embodiment, the first interlayer wiring 54 includes at least one (in this embodiment, one) first lower side wiring 55, and at least one (in this embodiment, one) third lower side wiring 57, and does not include second lower side wirings 56. The third lower side wiring 57 is formed in the same mode as with the case of the first embodiment.

In this embodiment, the first lower side wiring 55 does not have removal portions **55*a* and covers the entire region of at least one (in this embodiment, the plurality of) second trench structures 30. That is, wiring resistance of the first lower side wiring 55 is reduced as removal portions 55*a* are not provided. As a matter of course, the first lower side wiring 55 may be formed so as to cover the entire region of all the second trench structures 30**.

The first lower side wiring 55 enters all the first lower side openings 51 from the upper side of the first interlayer insulating film 50, and is respectively electrically connected to all the first electrodes 25 in all the first lower side openings 51. Thereby, the single first lower side wiring 55 is electrically connected to all the first mesa portions 15A via all the first electrodes 25.

The semiconductor device 1B includes the second interlayer insulating film 60 described above, the second interlayer insulating film being laminated on the first interlayer insulating film 50 so as to cover the first interlayer wiring 54. In this embodiment, the second interlayer insulating film 60 includes at least one (in this embodiment, a plurality of) first upper side openings 61 and at least one (in this embodiment, one) third upper side opening 63, and does not include second upper side openings 62. The third upper side opening 63 is formed in the same mode as with the case of the first embodiment.

Arbitrary portions of the first lower side wiring 55 are respectively exposed from the plurality of first upper side openings 61. The plurality of first upper side openings 61 may be arrayed in a matrix so as to oppose each other in the first direction X and the second direction Y in a plan view. The plurality of first upper side openings 61 may be respectively formed in a band shape extending in the second direction Y in a plan view. The plurality of first upper side openings 61 may be respectively formed in a circular shape, an oval shape, or a polygonal shape in a plan view. As a matter of course, a single first upper side opening 61 from which an inward portion of the first lower side wiring 55 is exposed while being spaced from a peripheral edge of the first lower side wiring 55 may be formed.

The semiconductor device 1B includes the above-described second interlayer wiring 64 that is formed on the second interlayer insulating film 60. In this embodiment, the second interlayer wiring 64 includes at least one (in this embodiment, one) first upper side wiring 65 and at least one (in this embodiment, one) third upper side wiring 67, and does not include second upper side wirings 66. The third upper side wiring 67 is formed in the same mode as with the case of the first embodiment.

In this embodiment, the first upper side wiring 65 is arranged in a film shape on the second interlayer insulating film 60 so as to overlap all the first trench structures 10 and all the second trench structures 30 in a plan view. The first upper side wiring 65 may overlap the entire region of all the second trench structures 30 in a plan view.

The first upper side wiring 65 enters the plurality of first upper side openings 61 from the upper side of the second interlayer insulating film 60, and is electrically connected to the first lower side wiring 55 in the plurality of first upper side openings 61. Thereby, the single first upper side wiring 65 is electrically connected to all the first mesa portions 15A via the single first lower side wiring 55. The first upper side wiring 65 may be formed in a square shape or a polygonal shape in a plan view.

The semiconductor device 1B includes the above-described uppermost insulating film 70 that is formed on the second interlayer insulating film 60. In this embodiment, the uppermost insulating film 70 selectively covers the first upper side wiring 65 and the third upper side wiring 67 so that the first upper side wiring 65 and the third upper side wiring 67 are partially exposed.

In this embodiment, the uppermost insulating film 70 includes at least one (in this embodiment, one) first pad opening 71 and at least one (in this embodiment, one) third pad opening 73, and does not include a second pad opening 72. An inward portion of the first upper side wiring 65 is exposed from the first pad opening 71 while being spaced from a peripheral edge portion of the first upper side wiring 65. The third pad opening 73 is formed in the same mode as with the case of the first embodiment.

The semiconductor device 1B includes the above-described base electrode 75 that covers a second main surface 4 of the chip 2. In this embodiment, the base electrode 75 is arranged so that an electric potential (in this embodiment, a source potential) is to be applied to the second trench structures 30 via the second semiconductor region 7. That is, the base electrode 75 is arranged so that a current path via the second semiconductor region 7 is formed between second electrodes 33 and the base electrode 75.

In such a way, the semiconductor device 1B has the MISFET structure including both characteristics of the trench gate lateral type and the trench gate vertical type. With this MISFET structure, a gate potential is to be applied to the first trench structures 10 (gate electrodes 13), a drain potential is to be applied to the first electrodes 25 (first mesa portions 15A), and a source potential is to be applied to the second electrodes 33 (second mesa portions 15B). Thereby, a channel 42 is formed in a region on the lower side of the first trench structures 10 in the second semiconductor region 7, and a current path that connects the first electrodes 25 and the second electrodes 33 is formed.

Thereby, a drain-source current flows through a region between the first electrodes 25 and the second electrodes 33. In this embodiment, the second electrodes 33 form the current path via the second semiconductor region 7 between the base electrode 75 and the second electrodes 33. Therefore, the drain-source current flows between the second electrodes 33 and the base electrode 75 via the second semiconductor region 7. That is, the drain-source current according to the semiconductor device 1B flows between the first electrodes 25 and the base electrode 75 via the second electrodes 33.

As described above, the same effects as the semiconductor device 1A are also exerted by the semiconductor device 1B. The semiconductor device 1B includes the base electrode 75 electrically connected to the second main surface 4 of the chip 2. According to this structure, it is possible to form the current path in the lateral direction between the first electrodes 25 and the second electrodes 33 by applying an electric potential (in this embodiment, a source potential) to the second trench structures 30 (second electrodes 33) from the base electrode 75 via the second semiconductor region 7, and at the same time, it is possible to form the current path in the vertical direction between the second electrodes 33 and the base electrode 75.

Thereby, it is possible to arrange the trench gate three-dimensional type MISFET structure including both characteristics of the lateral type in which the current path is formed in the lateral direction along the first main surface 3 and characteristics of the vertical type in which the current path is formed in the vertical direction perpendicular to the first main surface 3. Therefore, it is possible to provide the semiconductor device 1B having the new structure (MISFET structure).

Also, the semiconductor device 1B does not have wirings (that is, the second upper side wiring 66 and the second upper side wiring 66) according to the second mesa portions 15B (second trench structures 30) on the first main surface 3. A wiring according to the second mesa portions 15B (second trench structures 30) is formed by the second trench structures 30 (second electrodes 30) and the base electrode 75. Thereby, it is possible to increase a wiring area of wirings (that is, the first upper side wiring 65 and the first upper side wiring 65) according to the first mesa portions 15A (first electrodes 25) on the first main surface 3.

Therefore, it is possible to reduce wiring resistance of the wirings according to the first mesa portions 15A. Also, it is possible to eliminate wiring margins of the wirings according to the first mesa portions 15A with respect to the wirings according to the second mesa portions 15B. Thus, it is possible to downsize the semiconductor device 1B. As a matter of course, the base electrode 75 that forms the current path via the second semiconductor region 7 between the second electrodes 33 and the base electrode 75 may be adopted in the first embodiment. In this case, the structure is that the drain-source current is taken out from both the first main surface 3 side and the second main surface 4 side of the chip 2.

Figure 18:
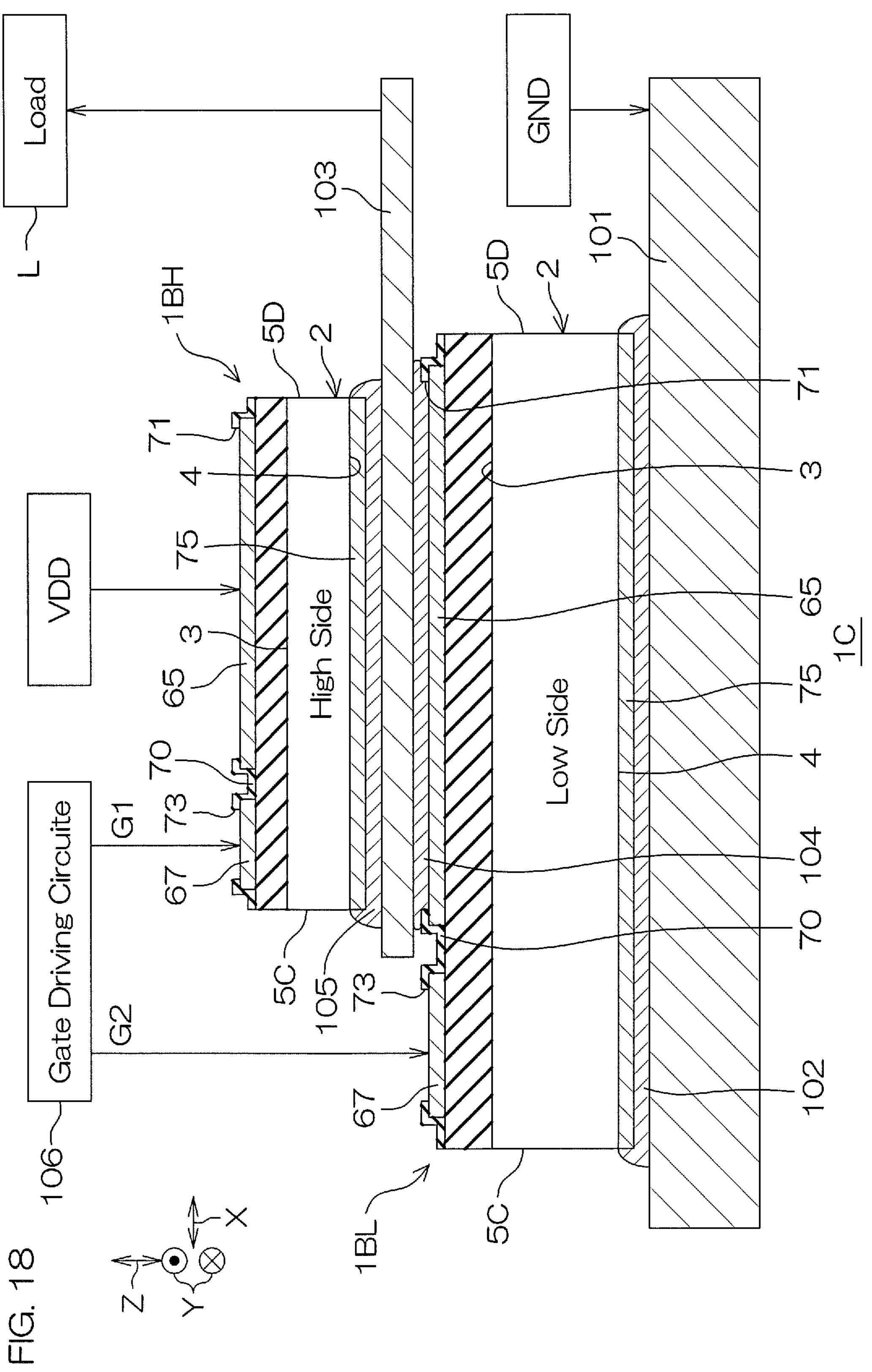
FIG. 18 is a schematic cross-sectional view of a semiconductor device according to a third embodiment (semiconductor module in which two semiconductor devices according to the second embodiment are used).
Figure 19:
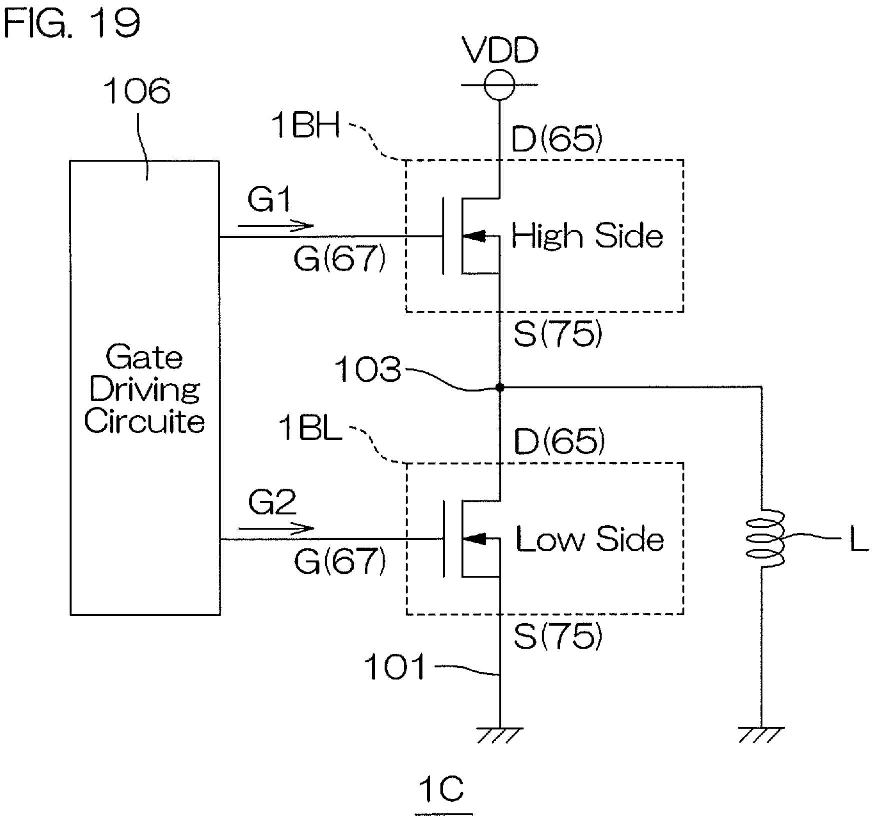
FIG. 19 is a circuit diagram showing an arrangement example of an electric circuit in which the semiconductor device shown in FIG. 18 is incorporated.

FIG. 18 is a schematic cross-sectional view of a semiconductor device 1C according to a third embodiment (semiconductor module in which two semiconductor devices 1B according to the second embodiment are used). FIG. 19 is a circuit diagram showing an arrangement example of an electric circuit in which the semiconductor device 1C shown in FIG. 18 is incorporated.

In this embodiment, the semiconductor device 1C includes a first conductor plate 101, a first semiconductor device 1BL, a third conducting joint member 102, a second conductor plate 103, a second conducting joint member 104, a second semiconductor device 1BH, and a third conducting joint member 105. The first conductor plate 101 is formed by, for example, a die pad of a lead frame, etc.

The first semiconductor device 1BL is formed by the semiconductor device 1B according to the second embodiment, and is provided as a switching device on the low (low potential) side. In comparison to the second semiconductor device 1BH, the first semiconductor device 1BL has a relatively large first size S1, and has a relatively small first ON resistance Ron1 and relatively large first feedback capacity Crss1. The first semiconductor device 1BL contributes to reduction in conduction losses.

The first semiconductor device 1BL is arranged on the first conductor plate 101 in a posture that the base electrode 75 opposes the first conductor plate 101. The first conducting joint member 102 is made of a solder, a metal paste, etc. The first conducting joint member 102 is placed between the first conductor plate 101 and the base electrode 75 of the first semiconductor device 1BL, and electrically and mechanically connects the first conductor plate 101 and the base electrode 75 of the first semiconductor device 1BL. Thereby, the first conductor plate 101 is electrically connected to second mesa portions 15B (second trench structures 30) of the first semiconductor device 1BL.

The second conductor plate 103 is formed by, for example, a conductor clip, etc. The second conductor plate 103 is arranged on the first semiconductor device 1BL so that the third upper side wiring 67 of the first semiconductor device 1BL is exposed and the first upper side wiring 65 of the first semiconductor device 1BL is covered. The second conducting joint member 104 is made of a solder, a metal paste, etc.

The second conducting joint member 104 is placed between the first upper side wiring 65 of the first semiconductor device 1BL and the second conductor plate 103, and electrically and mechanically connects the first upper side wiring 65 and the second conductor plate 103. Thereby, the second conductor plate 103 is electrically connected to the first mesa portions 15A of the first semiconductor device 1BL.

The second semiconductor device 1BH is formed by the semiconductor device 1B according to the second embodiment, and is provided as a switching device on the high (high potential) side. In comparison to the first semiconductor device 1BL, the second semiconductor device 1BH has a relatively small second size S2, and has a relatively large second ON resistance Ron2 and relatively small second feedback capacity Crss2.

That is, the second size S2 is less than the first size S1 of the first semiconductor device 1BL (S2<S1). The second ON resistance Ron2 exceeds the first ON resistance Ron1 of the first semiconductor device 1BL (Ron1<Ron2). The second feedback capacity Crss2 is less than the first feedback capacity Crss1 of the first semiconductor device 1BL (Crss2<Crss1). That is, the second semiconductor device 1BH has a switching speed higher than that of the first semiconductor device 1BL, and contributes to reduction in switching losses. A combination mode of the first semiconductor device 1BL and the second semiconductor device 1BH is effective for enhancing DC-DC power source efficiency.

The second semiconductor device 1BH is arranged on the second conductor plate 103 in a posture that the base electrode 75 opposes the second conductor plate 103. The third conducting joint member 105 is made of a solder, a metal paste, etc. The third conducting joint member 105 is placed between the base electrode 75 of the second semiconductor device 1BH and the second conductor plate 103, and electrically and mechanically connects the base electrode 75 of the second semiconductor device 1BH and the second conductor plate 103. Thereby, second mesa portions 15B of the second semiconductor device 1BH are electrically connected to the first mesa portions 15A of the first semiconductor device 1BL via the second conductor plate 103.

In an electric circuit in which the semiconductor device 1C is utilized, for example, a ground potential VGND, a power source potential VDD, a load (in this embodiment, an inductive load L), and a gate driving circuit 106 are electrically connected to the semiconductor device 1C. The ground potential VGND is electrically connected to the base electrode 75 (second mesa portions 15B) of the first semiconductor device 1BL via the first conductor plate 101.

The power source potential VDD is electrically connected to the first upper side wiring 65 (first mesa portions 15A) of the second semiconductor device 1BH. The inductive load L is electrically connected to the first upper side wiring 65 (first mesa portions 15A) of the first semiconductor device 1BL and the base electrode 75 (second mesa portions 15B) of the second semiconductor device 1BH via the second conductor plate 103.

The gate driving circuit 106 is electrically connected to the third upper side wiring 67 of the first semiconductor device 1BL and the third upper side wiring 67 of the second semiconductor device 1BH. The gate driving circuit 106 is arranged so as to individually control first trench structures 10 of the first semiconductor device 1BL and first trench structures 10 of the second semiconductor device 1BH.

Specifically, the gate driving circuit 106 generates a first gate signal G1 that controls the first semiconductor device 1BL to be in an ON state and an OFF state, and outputs the signal to the third upper side wiring 67 of the first semiconductor device 1BL. The gate driving circuit 106 generates a second gate signal G2 that controls the second semiconductor device 1BH to be in an ON state and an OFF state, and outputs the signal to the third upper side wiring 67 of the second semiconductor device 1BH. The gate driving circuit 106 may be a gate driver IC.

The first semiconductor device 1BL and the second semiconductor device 1BH are controlled to be in the ON state and the OFF state alternately by the first gate signal G1 and the second gate signal G2. When the first semiconductor device 1BL is in the OFF state and the second semiconductor device 1BH is in the ON state, a current flows from the second semiconductor device 1BH toward the inductive load L. When the first semiconductor device 1BL is in the ON state and the second semiconductor device 1BH is in the OFF state, a current flows from the inductive load L toward the first semiconductor device 1BL.

As described above, the semiconductor device 1C includes the two semiconductor devices 1B according to the second embodiment having shortened wiring routes. Therefore, it is possible to provide the semiconductor device 1C including the semiconductor devices 1B having the new structure. The two semiconductor devices 1B include the first semiconductor device 1BL on one side and the second semiconductor device 1BH on the other side. The second semiconductor device 1BH is electrically connected to the first semiconductor device 1BL. Specifically, the second semiconductor device 1BH is connected to the first semiconductor device 1BL in series.

Further specifically, the second semiconductor device 1BH is arranged and laminated on the first semiconductor device 1BL. In this structure, the second mesa portions 15B (base electrode 75) of the second semiconductor device 1BH are electrically connected to the first mesa portions 15A (first upper side wiring 65) of the first semiconductor device 1BL. According to this structure, it is possible to shorten a wiring distance between the first semiconductor device 1BL and the second semiconductor device 1BH. Therefore, it is possible to properly reduce wiring resistance.

Figure 20:
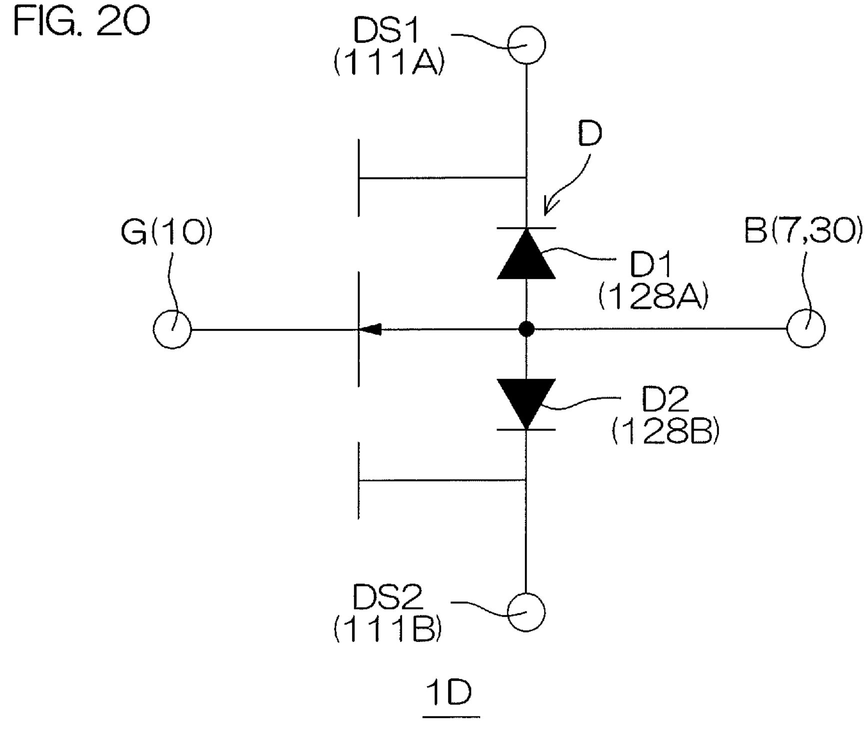
FIG. 20 is a circuit diagram showing an electric structure of a semiconductor device according to a fourth embodiment

FIG. 20 is a circuit diagram showing an electric structure of a semiconductor device 1D according to a fourth embodiment. With reference to FIG. 20, the semiconductor device 1D is a switching device including a trench gate, common drain-source, lateral type MISFET structure. The MISFET structure includes a first drain-source DS1, a second drain-source DS2, a gate G, and a base B. Each of the first drain-source DS1 and the second drain-source DS2 integrally includes a drain and a source.

A drain potential is to be applied to any one of the first drain-source DS1 and the second drain-source DS2, and a source potential is to be applied to the other. A base potential is to be applied to the base B. The base potential is an electric potential to be a basis of circuit operations. A gate potential is to be applied to the gate G. Conduction and blocking of a drain-source current flowing between the first drain-source DS1 and the second drain-source DS2 are controlled by the gate G.

The semiconductor device 1D includes a diode pair D connected to the first drain-source DS1 and the second drain-source DS2. The diode pair D includes a first diode D1 and a second diode D2 which are reverse-bias connected. Both the first diode D1 and the second diode D2 are formed by a pn junction diode (body diode).

Each of the first diode D1 and the second diode D2 includes an anode and a cathode. The anode of the first diode D1 is connected to the base B, and the cathode of the first diode D1 is connected to the first drain-source DS1. The anode of the second diode D2 is connected to the base B, and the cathode of the second diode D2 is connected to the second drain-source DS2. The diode pair D regulates (blocks) the drain-source current in an OFF state of the MISFET structure.

The semiconductor device 1D is a bidirectional device in which the drain-source current can flow in both the directions of the first drain-source DS1 and the second drain-source DS2. That is, in a case where the first drain-source DS1 is connected to the high potential side, the second drain-source DS2 is connected to the low potential side. Meanwhile, in a case where the first drain-source DS1 is connected to the low potential side, the second drain-source DS2 is connected to the high potential side. In a case where gate voltage which is not less than gate threshold voltage is to be applied to the gate G, the drain-source current flows. Meanwhile, in a case where gate voltage which is less than the gate threshold voltage is to be applied to the gate G, the drain-source current does not flow.

Figure 21:
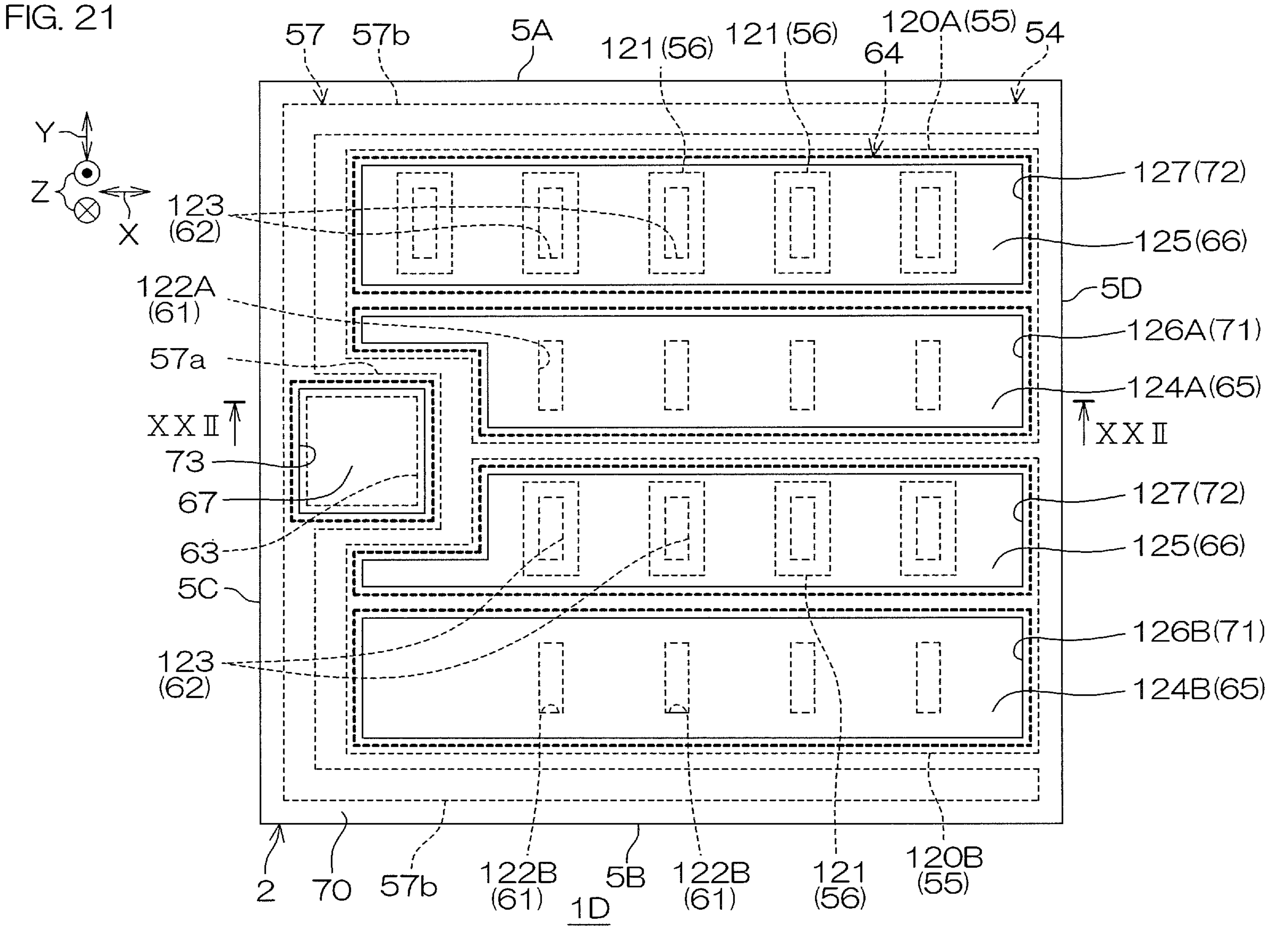
FIG. 21 is a schematic plan view showing the semiconductor device shown in FIG. 20.
Figure 22:
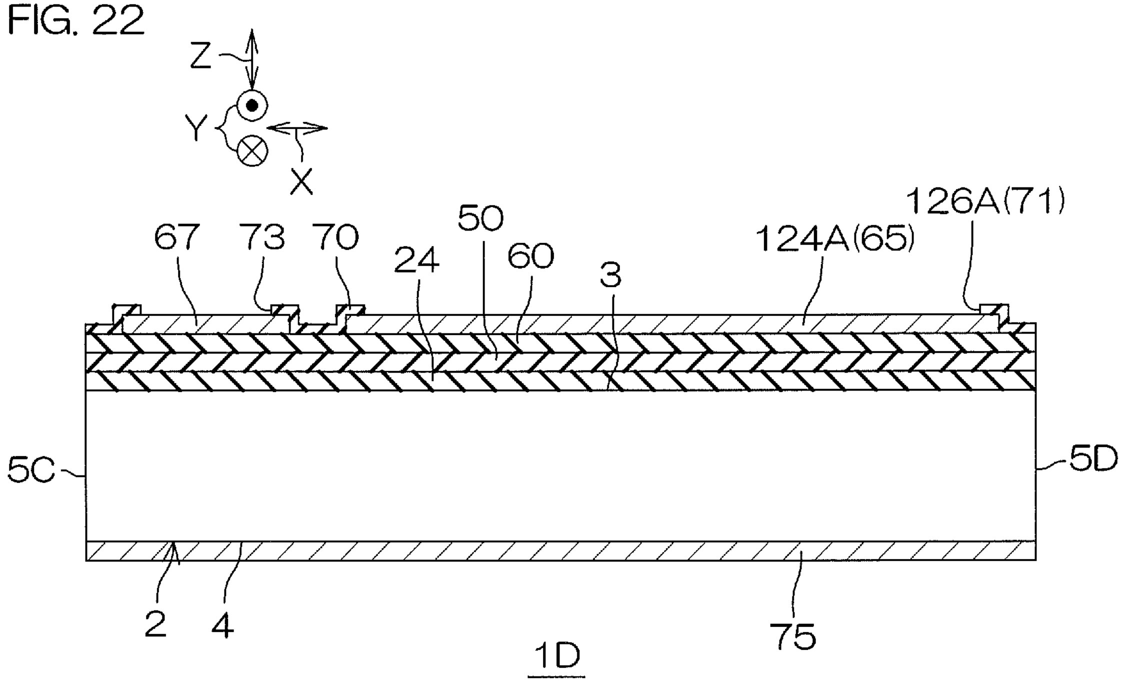
FIG. 22 is a cross-sectional view taken along line XXII-XXII shown in FIG. 21.
Figure 23:
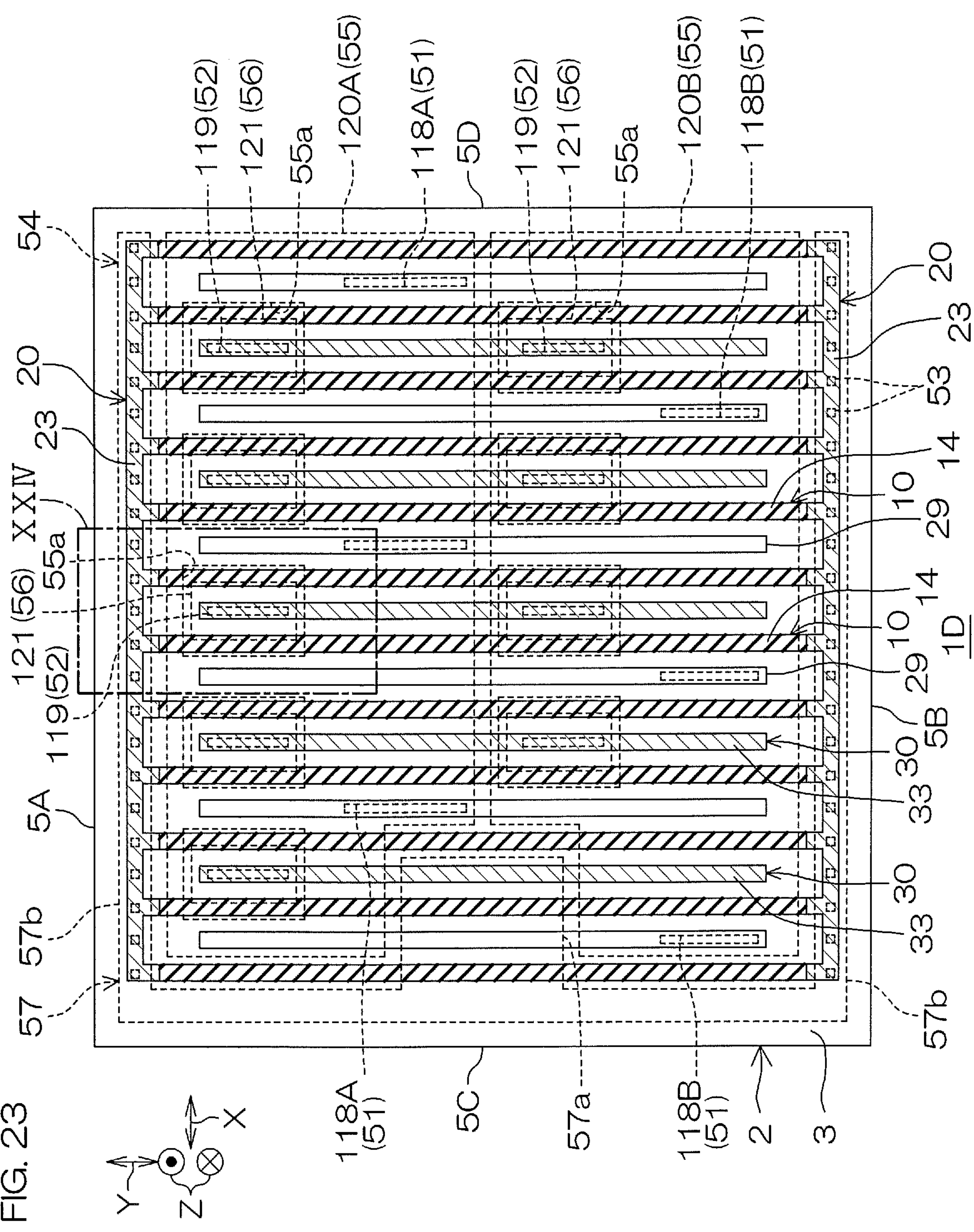
FIG. 23 is a schematic plan view showing a layout example of a first main surface of a chip according to the fourth embodiment.
Figure 24:
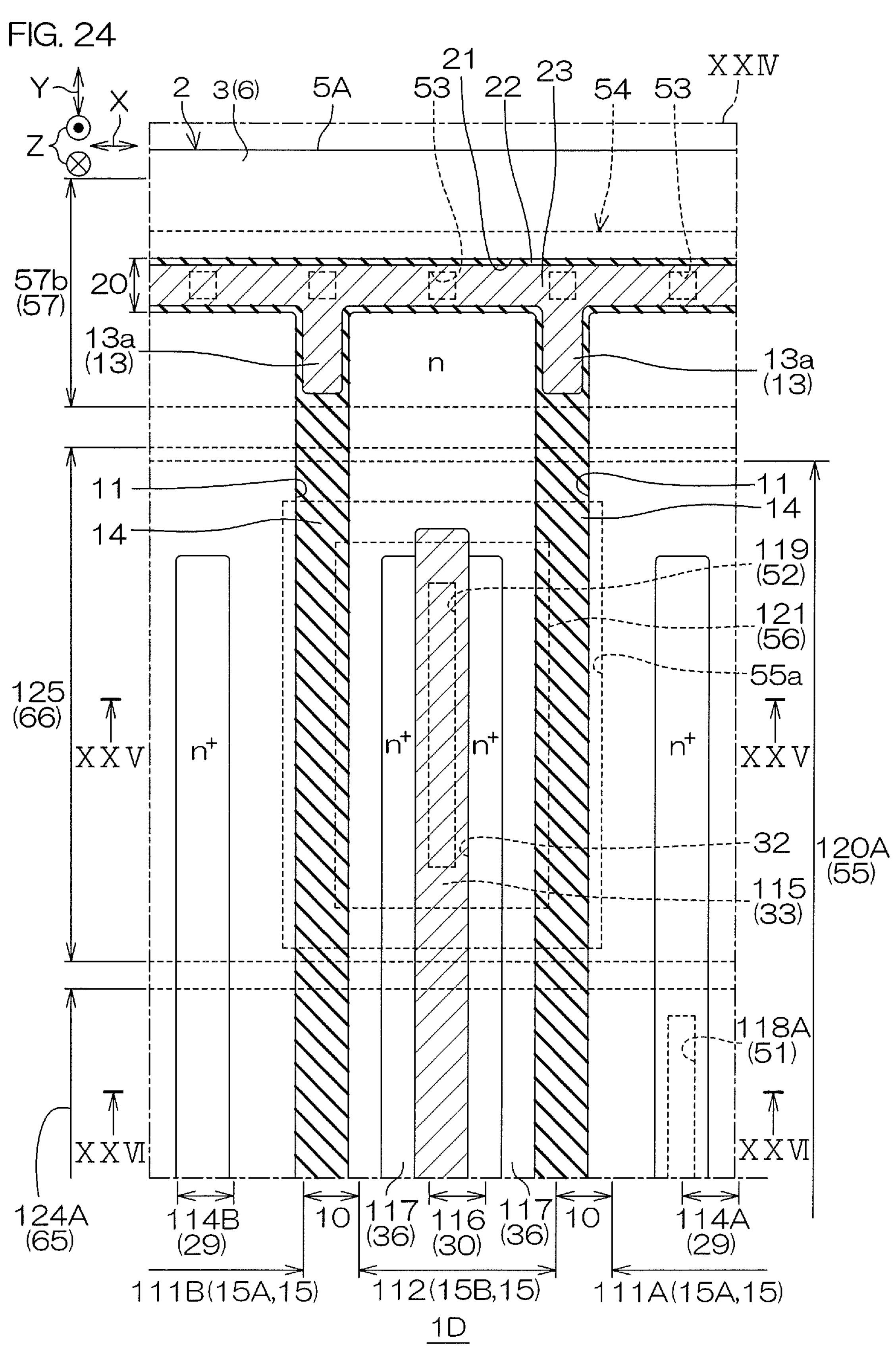
FIG. 24 is an enlarged view of a region XXIV shown in FIG. 23.
Figure 25:
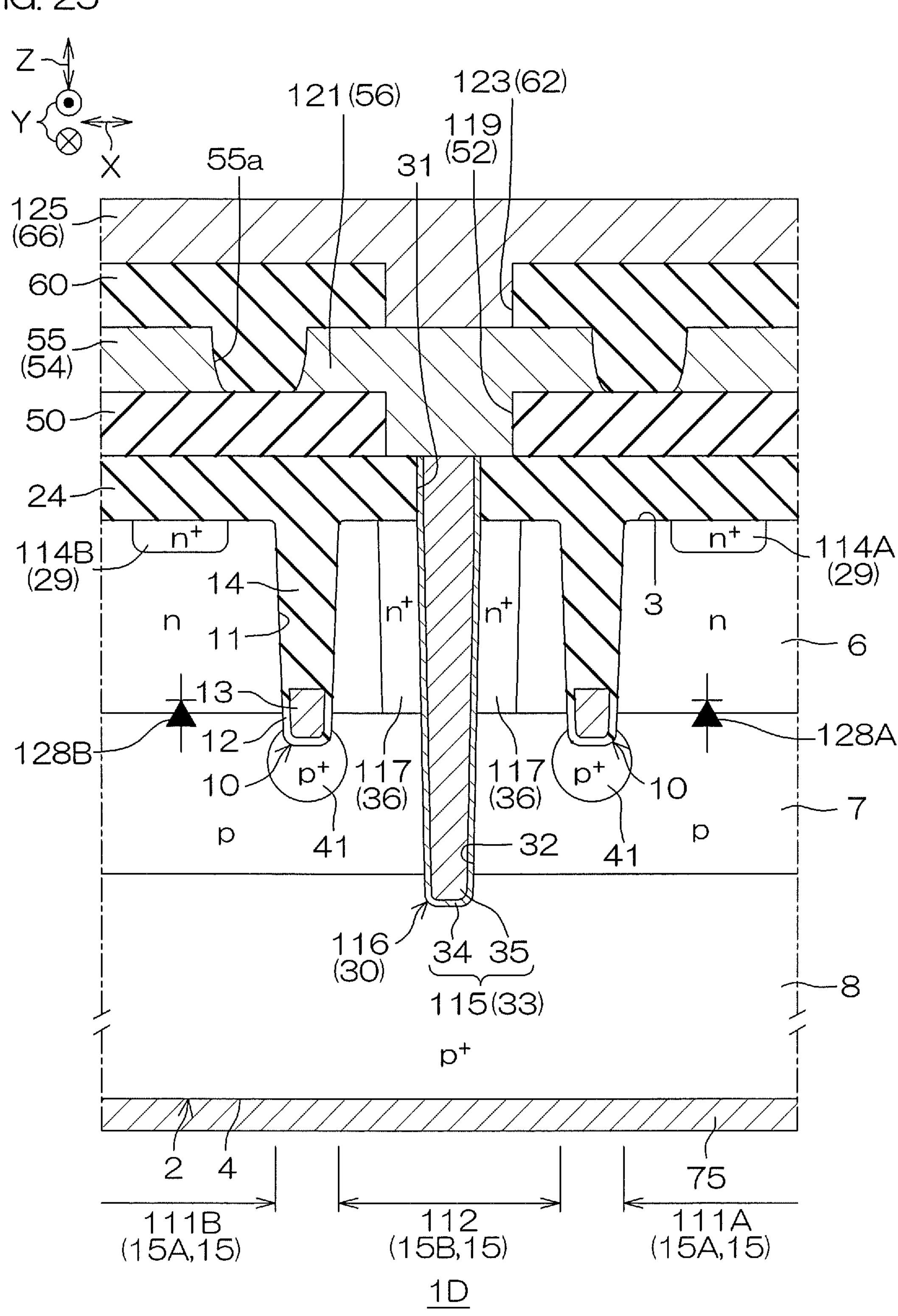
FIG. 25 is a cross-sectional view taken along line XXV-XXV shown in FIG. 24.
Figure 26:
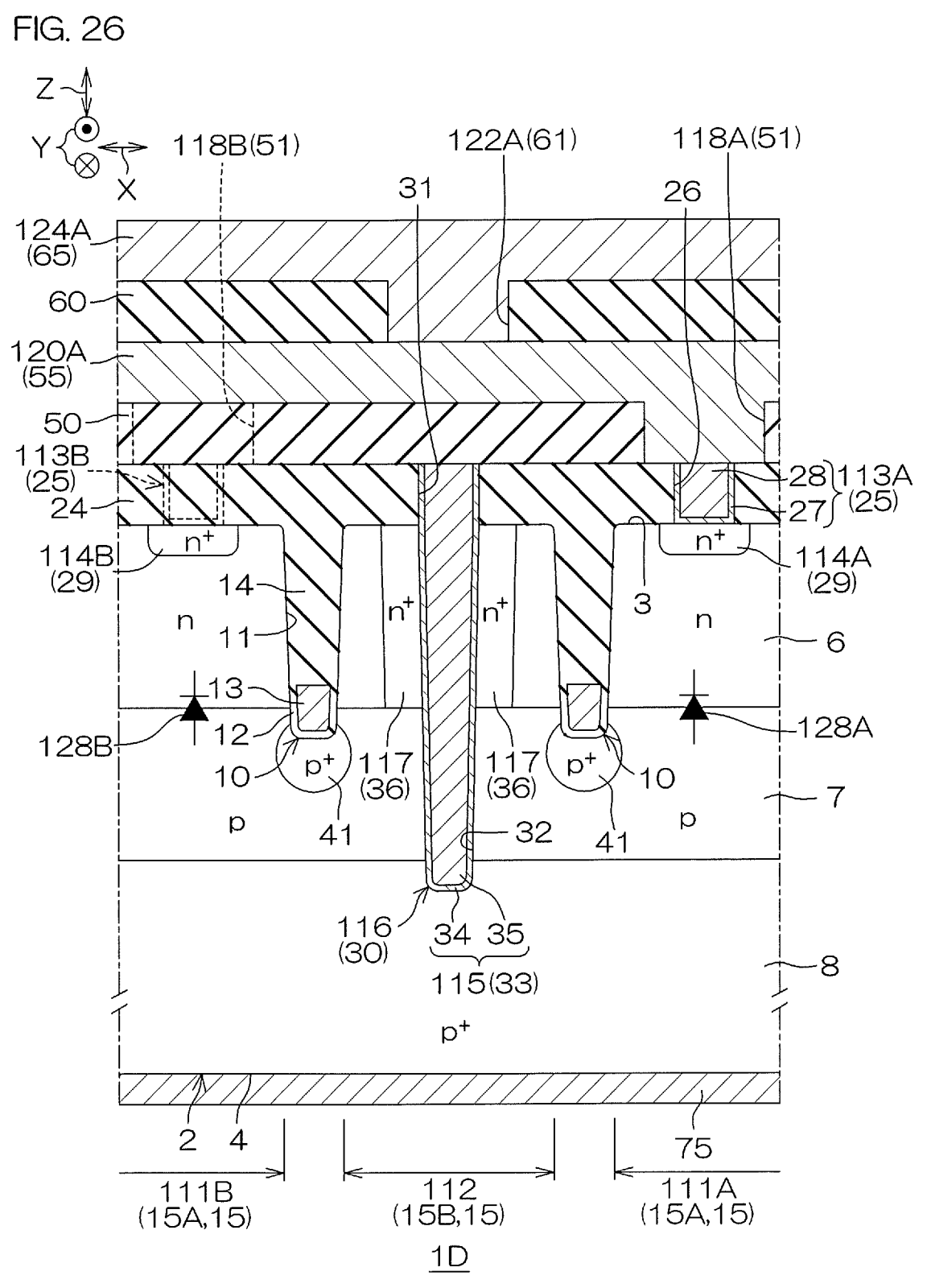

FIG. 21 is a schematic plan view showing the semiconductor device 1D shown in FIG. 20. FIG. 22 is a cross-sectional view taken along line XXII-XXII shown in FIG. 21. FIG. 23 is a schematic plan view showing a layout example of a first main surface 3 of a chip 2 according to the fourth embodiment. FIG. 24 is an enlarged view of a region XXIV shown in FIG. 23. FIG. 25 is a cross-sectional view taken along line XXV-XXV shown in FIG. 24. FIG. 26 is a cross-sectional view taken along line XXVI-XXVI shown in FIG. 24.

With reference to FIGS. 21 to 26, a structure inside the chip 2 according to the semiconductor device 1D is substantially the same as the structure inside the chip 2 according to the semiconductor device 1A. The semiconductor device 1D is formed by changing layouts of the masks for forming wirings in FIGS. 11A to 11Q described above, and has wiring patterns and voltage application conditions different from the semiconductor device 1A. Hereinafter, structures in the semiconductor device 1D different from the semiconductor device 1A will be described.

The semiconductor device 1D includes the plurality of first mesa portions 15A and the plurality of second mesa portions 15B as with the case of the first embodiment. In this embodiment, the plurality of first mesa portions 15A include a plurality of first drain-source mesa portions 111A and a plurality of second drain-source mesa portions 111B. The first drain-source mesa portions 111A function as the first drain-source DS1 of the MISFET structure. The second drain-source mesa portions 111B function as the second drain-source DS2 of the MISFET structure. The plurality of second drain-source mesa portions 111B are arrayed alternately with the plurality of first drain-source mesa portions 111A along the first direction X.

In this embodiment, the plurality of second mesa portions 15B are formed as a plurality of base mesa portions 112. Each of the base mesa portions 112 is formed between the first drain-source mesa portion 111A and the second drain-source mesa portion 111B which are adjacent to each other.

In this embodiment, the plurality of first electrodes 25 include a first drain-source connection electrode 113A and a second drain-source connection electrode 113B. The first drain-source connection electrode 113A is electrically connected to the first drain-source mesa portion 111A. The second drain-source connection electrode 113B is electrically connected to the second drain-source mesa portion 111B.

In this embodiment, the plurality of first impurity regions 29 include a plurality of first drain-source regions 114A and a plurality of second drain-source regions 114B. The first drain-source region 114A functions as the first drain-source DS1 of the MISFET structure. The first drain-source region 114A is formed in the first drain-source mesa portion 111A, and electrically connected to the first drain-source connection electrode 113A. The second drain-source region 114B functions as the second drain-source DS2 of the MISFET structure. The second drain-source region 114B is formed in the second drain-source mesa portion 111B, and electrically connected to the second drain-source connection electrode 113B.

In this embodiment, the second electrodes 33 are formed as base connection electrodes 115. That is, the second trench structures 30 are formed as trench base structures 116. In this embodiment, the second impurity regions 36 are formed as n-type base contact regions 117. In this embodiment, the plurality of first lower side openings 51 include a plurality of first lower side drain-source openings 118A and a plurality of second lower side drain-source openings 118B.

The plurality of first lower side drain-source openings 118A respectively expose the plurality of first drain-source connection electrodes 113A. Arranged portions of the plurality of first lower side drain-source openings 118A are arbitrary. In this embodiment, the plurality of first lower side drain-source openings 118A are formed in a one-to-one correspondence with each of the first drain-source connection electrodes 113A. In this embodiment, the plurality of first lower side drain-source openings 118A are respectively formed on the first side surface 5A side of the chip 2 in a plan view and respectively expose the plurality of first drain-source connection electrodes 113A on the one end portion side.

In this embodiment, the plurality of first lower side drain-source openings 118A are arrayed in a row along the first direction X in a plan view, and respectively formed in a band shape extending in the second direction Y. As a matter of course, the plurality of first lower side drain-source openings 118A may be formed in a one-to-many correspondence for each first drain-source connection electrode 113A. Also, the plurality of first lower side drain-source openings 118A may be formed in a circular shape, a square shape, or a polygonal shape in a plan view.

The plurality of second lower side drain-source openings 118B respectively expose the plurality of second drain-source connection electrodes 113B. Arranged portions of the plurality of second lower side drain-source openings 118B are arbitrary. In this embodiment, the plurality of second lower side drain-source openings 118B are formed in a one-to-one correspondence with each of the second drain-source connection electrodes 113B.

In this embodiment, the plurality of second lower side drain-source openings 118B are respectively formed on the second side surface 5B side of the chip 2 with respect to the plurality of first lower side drain-source openings 118A in a plan view, and respectively expose the plurality of second drain-source connection electrodes 113B on the other end portion side.

In this embodiment, the plurality of second lower side drain-source openings 118B are arrayed in a row along the first direction X in a plan view, and respectively formed in a band shape extending in the second direction Y. As a matter of course, the plurality of second lower side drain-source openings 118B may be formed in a one-to-many correspondence for each second drain-source connection electrode 113B. Also, the plurality of second lower side drain-source openings 118B may be formed in a circular shape, a square shape, or a polygonal shape in a plan view.

In this embodiment, the second lower side openings 52 are formed as lower side base openings 119. The second lower side openings 52 are formed in the same mode as with the case of the first embodiment. The third lower side openings 53 are formed in the same mode as with the case of the first embodiment. In this embodiment, the plurality of first lower side wirings 55 include at least one (in this embodiment, one) first lower side drain-source wiring 120A, and at least one (in this embodiment, one) second lower side drain-source wiring 120B.

In this embodiment, the first lower side drain-source wiring 120A is arranged in a region on the first side surface 5A side of the chip 2 in a plan view. The first lower side drain-source wiring 120A enters the plurality of first lower side drain-source openings 118A from the upper side of the first interlayer insulating film 50, and is electrically connected to the plurality of first drain-source connection electrodes 113A. An electric potential applied to the first lower side drain-source wiring 120A is transmitted to the first drain-source mesa portions 111A via the plurality of first drain-source connection electrodes 113A respectively extending in a band shape.

The routing mode of the first lower side drain-source wiring 120A is arbitrary. In this embodiment, the first lower side drain-source wiring 120A is formed in a band shape extending in the first direction X in a plan view, and overlaps a region on the one end portion side of all the first trench structures 10 and a region on the one end portion side of all the second trench structures 30. In this embodiment, the first lower side drain-source wiring 120A has the plurality of removal portions 55*a* from which the plurality of lower side base openings 119 (second lower side openings 52) are respectively exposed as with the case of the first embodiment.

In this embodiment, the second lower side drain-source wiring 120B is formed in a region on the second side surface 5B side of the chip 2 in a plan view. The second lower side drain-source wiring 120B is arranged while being spaced from the first lower side drain-source wiring 120A so as to be electrically separated from the first lower side drain-source wiring 120A, and forms a current path different from the first lower side drain-source wiring 120A.

The second lower side drain-source wiring 120B enters the plurality of second lower side drain-source openings 118B from the upper side of the first interlayer insulating film 50, and is electrically connected to the plurality of second drain-source connection electrodes 113B. An electric potential applied to the second lower side drain-source wiring 120B is transmitted to the second drain-source mesa portions 111B via the plurality of second drain-source connection electrodes 113B respectively extending in a band shape.

The routing mode of the second lower side drain-source wiring 120B is arbitrary. In this embodiment, the second lower side drain-source wiring 120B is formed in a band shape extending in the first direction X in a plan view, and overlaps a region on the other end portion side of all the first trench structures 10 and a region on the other end portion side of all the second trench structures 30. In this embodiment, the second lower side drain-source wiring 120B has the plurality of removal portions 55*a* from which the plurality of lower side base openings 119 (second lower side openings 52) are respectively exposed as with the case of the first embodiment.

In this embodiment, the plurality of second lower side wirings 56 are formed as a plurality of lower side base wirings 121. The plurality of lower side base wirings 121 (second lower side wirings 56) are formed in the same mode as with the case of the first embodiment.

The total plane area of the plurality of second lower side wirings 56 surrounded by the first lower side drain-source wiring 120A is less than a plane area of the first lower side drain-source wiring 120A. The total plane area of the plurality of second lower side wirings 56 surrounded by the second lower side drain-source wiring 120B is less than a plane area of the second lower side drain-source wiring 120B. The total plane area of all the second lower side wirings 56 is preferably less than the plane area of the first lower side drain-source wiring 120A. The total plane area of all the second lower side wirings 56 is preferably less than the plane area of the second lower side drain-source wiring 120B.

The third lower side wiring 57 is formed in the same mode as with the case of the first embodiment. The plurality of first upper side openings 61 include at least one (in this embodiment, a plurality of) first upper side drain-source openings 122A, and at least one (in this embodiment, a plurality of) second upper side drain-source openings 122B.

The plurality of first lower side drain-source wirings 120A are respectively exposed from the plurality of first upper side drain-source openings 122A. Arranged portions of the plurality of first upper side drain-source openings 122A are arbitrary. In this embodiment, the plurality of first upper side drain-source openings 122A are arrayed in a row along the first direction X in a plan view, and respectively formed in a band shape extending in the second direction Y. The plurality of first upper side drain-source openings 122A may be formed in a circular shape, a square shape, or a polygonal shape in a plan view. As a matter of course, a single first upper side drain-source opening 122A extending in a band shape along the first lower side drain-source wiring 120A in a plan view may be formed.

The plurality of second lower side drain-source wirings 120B are respectively exposed from the plurality of second upper side drain-source openings 122B. Arranged portions of the plurality of second upper side drain-source openings 122B are arbitrary. In this embodiment, the plurality of second upper side drain-source openings 122B are arrayed in a row along the first direction X in a plan view, and respectively formed in a band shape extending in the second direction Y.

The plurality of second upper side drain-source openings 122B may be formed in a circular shape, a square shape, or a polygonal shape in a plan view. As a matter of course, a single second upper side drain-source opening 122B extending in a band shape along the second lower side drain-source wiring 120B in a plan view may be formed.

In this embodiment, the plurality of second upper side openings 62 are formed as a plurality of upper base openings 123. The plurality of upper base openings 123 (second upper side openings 62) are formed in the same mode as with the case of the first embodiment. In this embodiment, the plurality of first upper side wirings 65 include at least one (in this embodiment, one) first upper side drain-source wiring 124A, and at least one (in this embodiment, one) second upper side drain-source wiring 124B.

The first upper side drain-source wiring 124A enters the plurality of first upper side drain-source openings 122A from the upper side of the second interlayer insulating film 60, and is electrically connected to the plurality of first lower side drain-source wirings 120A. The routing mode of the first upper side drain-source wiring 124A is arbitrary. In this embodiment, the first upper side drain-source wiring 124A is formed in a band shape extending in the first direction X in a plan view.

The second upper side drain-source wiring 124B is arranged while being spaced from the first upper side drain-source wiring 124A so as to be electrically separated from the first upper side drain-source wiring 124A, and forms a current path different from the first upper side drain-source wiring 124A. The second upper side drain-source wiring 124B enters the plurality of second upper side drain-source openings 122B from the upper side of the second interlayer insulating film 60, and is electrically connected to the plurality of second lower side drain-source wirings 120B. The routing mode of the second upper side drain-source wiring 124B is arbitrary. In this embodiment, the second upper side drain-source wiring 124B is formed in a band shape extending in the first direction X in a plan view.

The plurality of second upper side wirings 66 are formed as a plurality of upper base wirings 125. The plurality of upper side base wirings 125 (second upper side wirings 66) are formed in the same mode as with the case of the first embodiment. In this embodiment, the plurality of first pad openings 71 include at least one (in this embodiment, one) first drain-source pad opening 126A, and at least one (in this embodiment, one) second drain-source pad opening 126B.

The first drain-source pad opening 126A is formed while being spaced inward from a peripheral edge portion of the first upper side drain-source wiring 124A, and an inward portion of the first upper side drain-source wiring 124A is exposed as a terminal electrode from the first drain-source pad opening 126A. The second drain-source pad opening 126B is formed while being spaced inward from a peripheral edge portion of the second upper side drain-source wiring 124B, and an inward portion of the second upper side drain-source wiring 124A is exposed as a terminal electrode from the second drain-source pad opening 126B.

The plurality of second pad openings 72 are formed as a plurality of base pad openings 127. The plurality of base pad openings 127 (second pad openings 72) are formed in the same mode as with the case of the first embodiment.

The semiconductor device 1D includes a first pn junction portion 128A and a second pn junction portion 128B respectively formed inside the chip 2. The first pn junction portion 128A is formed in a border portion between the first semiconductor region 6 and the second semiconductor region 7 on the first drain-source mesa portion 111A side. Thereby, the first diode D1 including the second semiconductor region 7 as an anode region and the first semiconductor region 6 as a cathode region is formed in the first drain-source mesa portion 111A.

The second pn junction portion 128B is formed in the border portion between the first semiconductor region 6 and the second semiconductor region 7 on the second drain-source mesa portion 111B side. Thereby, the second diode D2 including the second semiconductor region 7 as an anode region and the first semiconductor region 6 as a cathode region is formed in the second drain-source mesa portion 111B. The anode of the second diode D2 (second pn junction portion 128B) is electrically connected to the anode of the first diode D1 (first pn junction portion 128A) via the second semiconductor region 7 and the trench base structures 116 (second trench structures 30).

In such a way, the semiconductor device 1D has the trench gate, common drain-source, lateral type MISFET structure. In the semiconductor device 1D, a high potential (for example, a power source potential VDD) is to be applied to the first drain-source mesa portions 111A, a low potential (for example, a ground potential VGND) is to be applied to the second drain-source mesa portions 111B, and a base potential VB is to be applied to the second trench structures 30 (second electrodes 33) and the base electrode 75. The base potential VB is larger than the ground potential VGND and smaller than the power source potential VDD (VGND<VB<VDD).

A gate potential VG is to be applied to the plurality of first trench structures 10 (gate electrodes 13). First gate voltage VG1 (not less than gate threshold voltage) on the basis of the base potential VB is to be applied to the first trench structures 10 (gate electrodes 13) on one side, and second gate voltage VG2 (not less than the gate threshold voltage) on the basis of the ground potential VGND is to be applied to the first trench structures 10 (gate electrodes 13) on the other side. Thereby, the channels 42 are formed in regions on the lower side of the plurality of first trench structures 10 in the second semiconductor region 7, and current paths that connect the plurality of first electrodes 25 via the plurality of second electrodes 33 are formed.

Thereby, a drain-source current flows from the first drain-source mesa portions 111A to the second drain-source mesa portions 111B via the plurality of channels 42. That is, the drain-source current flows from the first drain-source mesa portions 111A to the second trench structures 30 (second electrodes 33) via the channel 42 on the first drain-source mesa portion 111A side, and flows from the second trench structures 30 (second electrodes 33) to the second drain-source mesa portions 111B via the channel 42 on the second drain-source mesa portion 111B side.

As a matter of course, first gate voltage VG1 (not less than the gate threshold voltage) on the basis of the ground potential VGND is to be applied to the first trench structures 10 (gate electrodes 13) on one side, and second gate voltage VG2 (not less than the gate threshold voltage) on the basis of the base potential VB is to be applied to the first trench structures 10 (gate electrodes 13) on the other side. In this case, the drain-source current flows from the second drain-source mesa portions 111B to the first drain-source mesa portions 111A via the plurality of channels 42.

As described above, the semiconductor device 1D according to the fourth embodiment has the same internal structure as the internal structure of the chip 2 of the semiconductor device 1A according to the first embodiment while having the trench gate, common drain-source, lateral type MISFET structure, and electric characteristics different from the semiconductor device 1A are expressed. Therefore, it is possible to provide the semiconductor device 1D having the new structure. Also, the same effects as the semiconductor device 1A are also exerted by the semiconductor device 1D.

Also, with the semiconductor device 1D, it is possible to reduce wiring resistance of the wirings according to the first mesa portions 15A (the first lower side drain-source wirings 120A and the second lower side drain-source wirings 120B). Also, it is possible to reduce wiring margins of the wirings according to the first mesa portions 15A with respect to the wirings according to the second mesa portions 15B (lower side base wirings 121). Thus, it is possible to downsize the semiconductor device 1D.

Hereinafter, modified examples applied to the embodiments described above will be shown. The modified examples to be shown below and arbitrary combination modes of the modified examples will be appropriately applied to the first to fourth embodiments.

Figure 27:
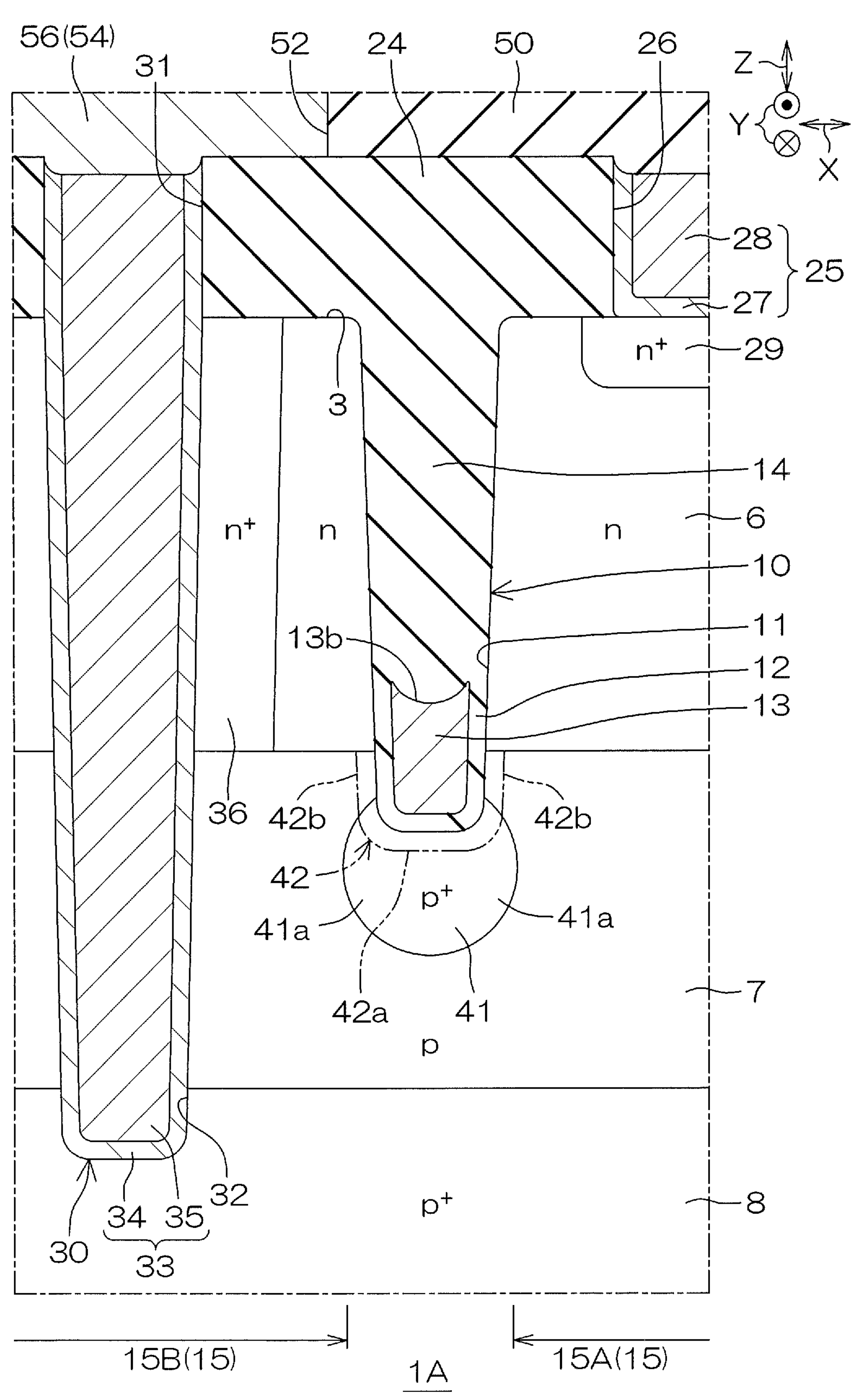
FIG. 27 is an enlarged cross-sectional view corresponding to the region shown in FIG. 8, the view showing a modified example of a gate electrode.

The embodiments described above show the example that the gate electrode 13 has the flat upper end surface. However, the gate electrode 13 shown in FIG. 27 may be adopted. FIG. 27 is an enlarged cross-sectional view corresponding to the region shown in FIG. 8, the view showing a modified example of the gate electrode 13. With reference to FIG. 27, the upper end portion of the gate electrode 13 may have a recess 13*b* recessed toward the bottom wall of the first trench 11. The gate electrode 13 having the recess 13*b* can be formed by omitting the step of flattening the electrode surface of the first base electrode 86 (CMP method) and executing the step of removing the first base electrode 86 (etching method) in the step of FIG. 11F described above.

Figure 28:
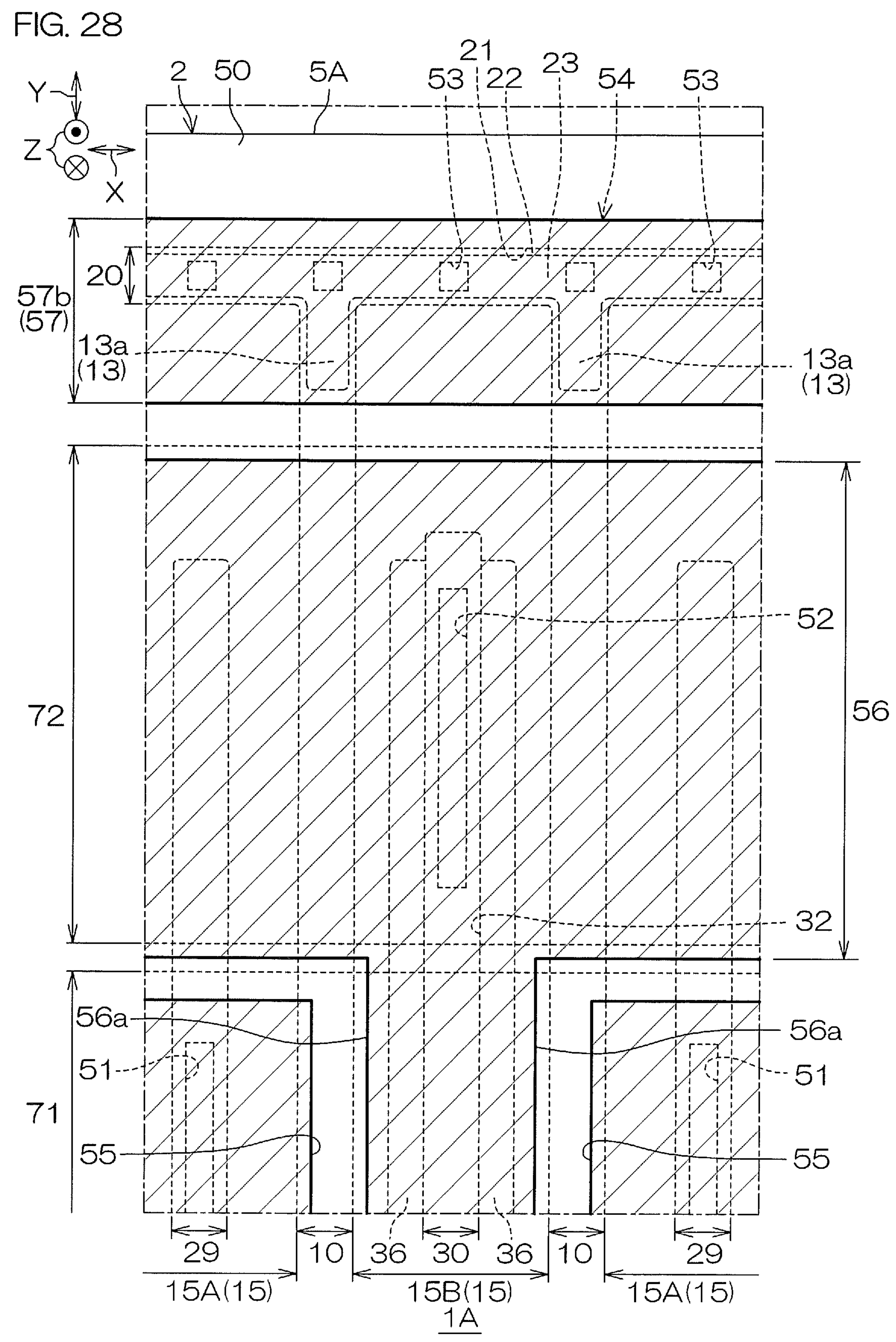
FIG. 28 is an enlarged plan view corresponding to the region shown in FIG. 9, the view showing a modified example of the first layer wiring.

The first embodiment described above shows the example that the total plane area of the plurality of second lower side wirings 56 is less than the plane area of the first lower side wiring 55. However, the first interlayer wiring 54 shown in FIG. 28 may be adopted. FIG. 28 is an enlarged plan view corresponding to the region shown in FIG. 9, the view showing a modified example of the first interlayer wiring 54.

With reference to FIG. 28, in this embodiment, the first interlayer wiring 54 includes at least one (in this embodiment, a plurality of) first lower side wirings 55, at least one (in this embodiment, one) second lower side wiring 56, and at least one (in this embodiment, one) third lower side wiring 57. The third lower side wiring 57 is formed in the same mode as with the case of the first embodiment.

The plurality of first lower side wirings 55 are respectively arranged in a film shape on the first interlayer insulating film 50 while being spaced from each other so as to cover the plurality of first lower side openings 51. In this embodiment, the plurality of first lower side wirings 55 respectively cover the plurality of first lower side openings 51 in a one-to-one correspondence.

The plurality of first lower side wirings 55 enter the corresponding first lower side openings 51 from the upper side of the first interlayer insulating film 50, and are respectively electrically connected to the corresponding first electrodes 25 in the corresponding first lower side openings 51. Thereby, the plurality of first lower side wirings 55 are electrically connected to the plurality of first mesa portions 15A (first impurity regions 29). The first lower side wirings 55 may be formed in a square shape or a polygonal shape in a plan view.

In this embodiment, the second lower side wiring 56 overlaps all the first trench structures 10 and all the second trench structures 30 in a plan view. The second lower side wiring 56 preferably covers at least the inward portions of all the first trench structures 10 and at least the inward portions of all the second trench structures 30 in a plan view.

In this embodiment, the second lower side wiring 56 covers the inward portions of all the first trench structures 10 so that both end portions of all the first trench structures 10 are exposed in a plan view. Also, the second lower side wiring 56 covers both end portions and the inward portions of all the second trench structures 30 in a plan view. The second lower side wiring 56 covers all the second lower side openings 52, and all the first lower side openings 51 are exposed from the second lower side wiring 56.

The second lower side wiring 56 enters all the second lower side openings 52 from the upper side of the first interlayer insulating film 50, and is electrically connected to all the second electrodes 33 in all the second lower side openings 52. Thereby, the single second lower side wiring 56 is electrically connected to the plurality of second mesa portions 15B (second impurity regions 36). The second lower side wiring 56 may be formed in a square shape or a polygonal shape in a plan view.

In this embodiment, the second lower side wiring 56 has a plurality of removal portions 56*a* from which the plurality of first lower side wirings 55 are respectively exposed. The plurality of removal portions 56*a* respectively have wall surfaces positioned on the main surface insulating film 24 in a plan view, and respectively surround the plurality of first lower side wirings 55 on the main surface insulating film 24.

That is, in this embodiment, the plurality of removal portions 56*a* are respectively formed as openings from which the first lower side wirings 55 are exposed. In this embodiment, each of the removal portions 56*a* has a planar shape similar to a part of or all of a planar shape of the corresponding first lower side wiring 55 in a plan view. A plane area of the second lower side wiring 56 preferably exceeds the total plane area of the single first lower side wiring 55.

According to this structure, although wiring resistance of the first lower side wiring 55 is increased, it is possible to reduce wiring resistance of the second lower side wiring 56. By adjusting a layout of the first lower side wiring 55 and a layout of the second lower side wiring 56, it is possible to adjust the wiring resistance of the first lower side wiring 55 and the wiring resistance of the second lower side wiring 56. Thereby, it is possible to adjust the electric characteristics of the semiconductor device 1A.

Figure 29:
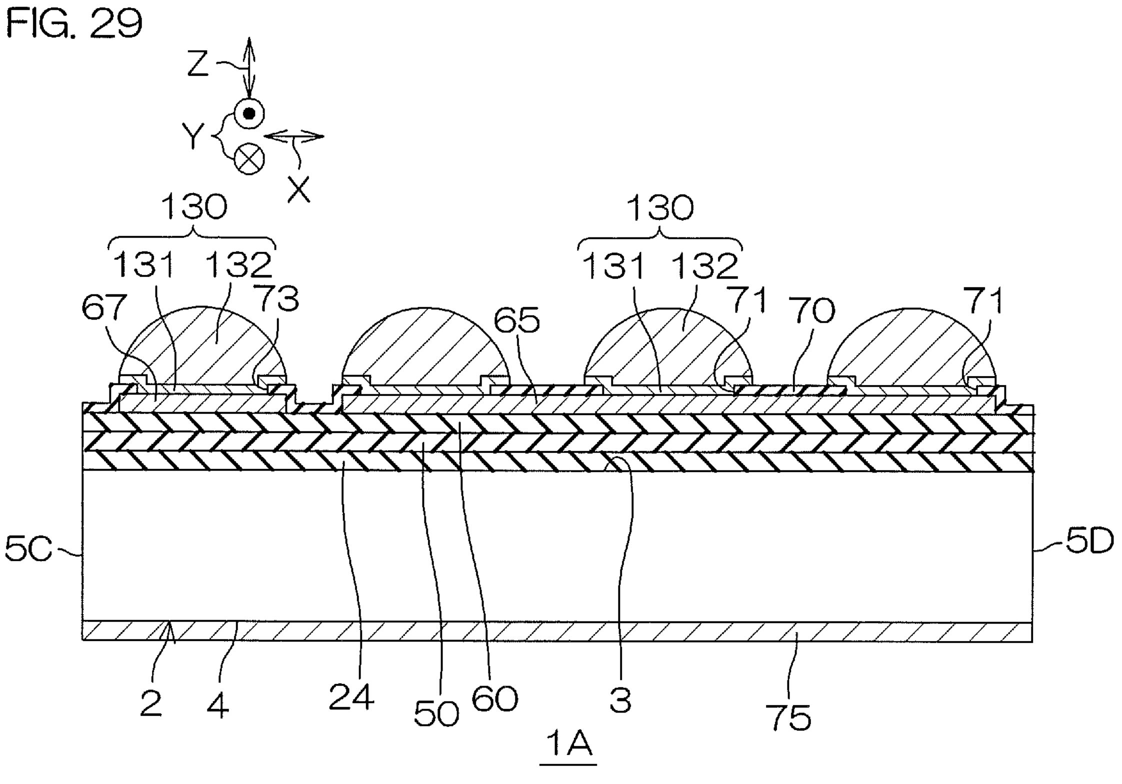
FIG. 29 is a schematic cross-sectional view showing a structure example in a case where a terminal electrode is adopted in the semiconductor device according to the first embodiment.

The embodiments described above show the example that the second interlayer wiring 64 also serves as a part of an external terminal. However, a structure shown in FIG. 29 may be adopted. FIG. 29 is a schematic cross-sectional view showing a structure example in a case where terminal electrodes 130 are adopted in the semiconductor device 1A according to the first embodiment. The terminal electrodes 130 shown in FIG. 29 can also be applied to the semiconductor devices 1B to 1D according to the second to fourth embodiments.

In this example, the uppermost insulating film 70 according to the semiconductor device 1A includes at least one (in this embodiment, a plurality of) first pad openings 71, at least one (in this embodiment, a plurality of) second pad openings 72, and at least one (in this embodiment, one) third pad opening 73. Layouts of the first to third pad openings 71 to 73 are appropriately adjusted in accordance with a layout of the second interlayer wiring 64, a specification of the semiconductor device 1A, a specification of an object to which the semiconductor device 1A is to be connected, etc.

In this embodiment, the plurality of first pad openings 71 are formed so that each of the first upper side wirings 65 is exposed from plural portions. In this embodiment, the plurality of second pad openings 72 are formed so that each of the second upper side wirings 66 is exposed from plural portions. The pad portion 57*a* of the third upper side wiring 67 is exposed from the third pad opening 73 as with the case of the first embodiment.

The semiconductor device 1A includes the plurality of terminal electrodes 130 electrically and mechanically connected to the second interlayer wiring 64 so as to project from the uppermost insulating film 70. The plurality of terminal electrodes 130 include at least one (in this embodiment, a plurality of) terminal electrodes 130 for the first upper side wirings 65, at least one (in this embodiment, a plurality of) terminal electrodes 130 for the second upper side wirings 66, and at least one (in this embodiment, one) terminal electrode 130 for the third upper side wiring 67.

The plurality of terminal electrodes 130 are respectively arranged in the first to third pad openings 71 to 73. In this embodiment, each of the terminal electrodes 130 includes a foundation electrode 131 and a terminal main body 132. The foundation electrode 131 is formed on the second interlayer wiring 64 in the corresponding one of the first to third pad openings 71 to 73. The foundation electrode 131 has an overlap portion pulled out onto the uppermost insulating film 70 from the upper side of the second interlayer wiring 64. The foundation electrode 131 may include at least one type of a titanium film, a titanium nitride film, a copper film, a gold film, a nickel film, and an aluminum film.

The terminal main body 132 is formed on the foundation electrode 131 and electrically connected to the second interlayer wiring 64 via the foundation electrode 131. The terminal main body 132 covers the overlap portion of the foundation electrode 131. The terminal main body 132 projects in a semi-spherical shape from the foundation electrode 131. The terminal main body 132 is preferably made of low-melting metal (for example, a solder). In this case, the terminal main body 132 is formed as a so-called solder ball.

As described above, according to the structure examples described above, it is possible to provide the semiconductor device 1A of a wafer-level chip size package having a size of the chip 2 cut out from the wafer 80 as a package size. This example shows the example that the plurality of terminal electrodes 130 are mechanically and electrically connected to the second interlayer wiring 64. However, the semiconductor device 1A may include a plurality of re-wirings arranged on the uppermost insulating film 70 so that the re-wirings are electrically connected to the second interlayer wiring 64. In this case, the plurality of terminal electrodes 130 may be respectively arranged on the plurality of re-wirings.

Figure 30:
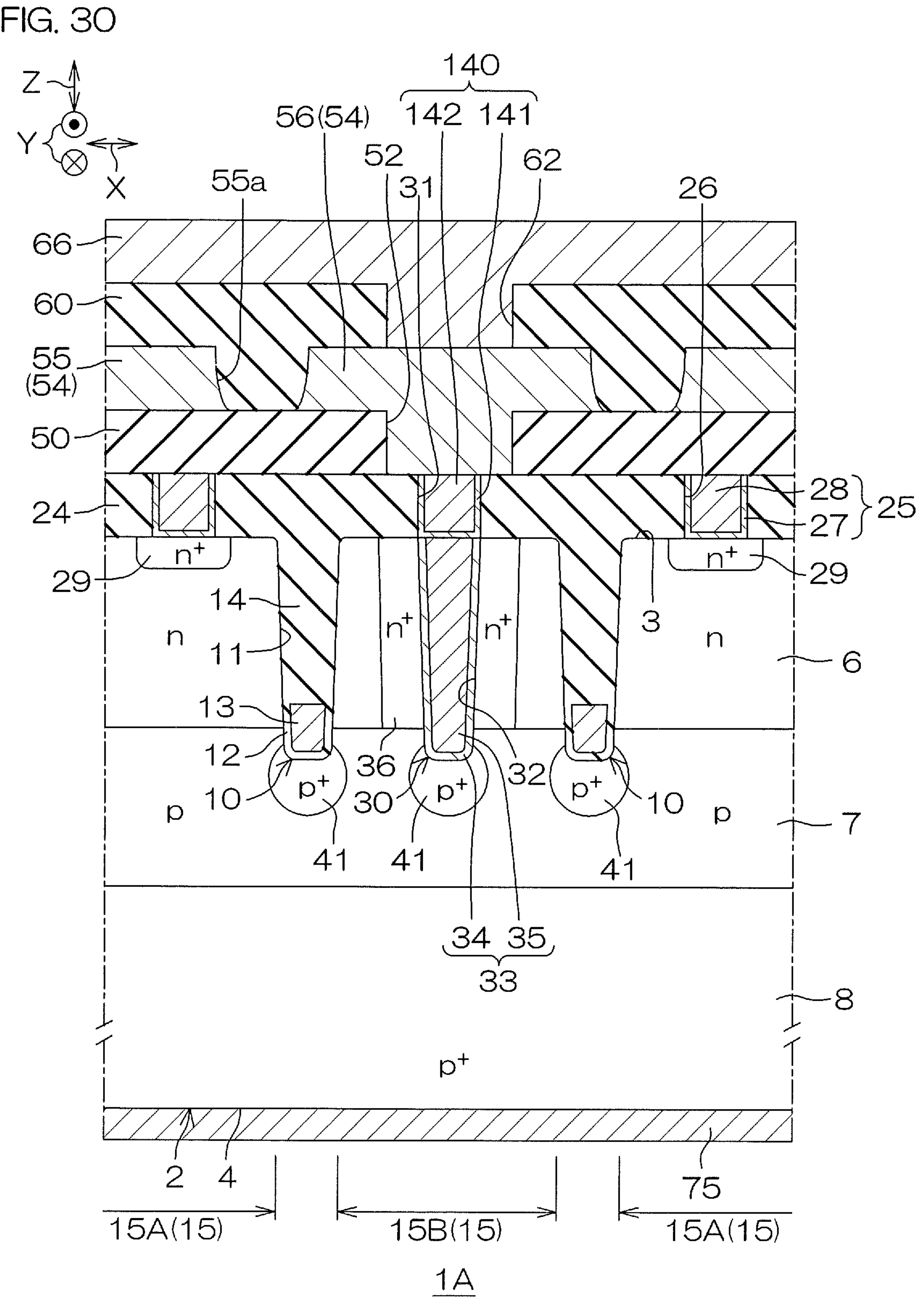
FIG. 30 is an enlarged cross-sectional view corresponding to the region shown in FIG. 5, the view showing a modified example of a second trench structure.

The embodiments described above show the example that the second trench structures 30 deeper than the first trench structures 10 are formed. However, a structure shown in FIG. 30 may be adopted. FIG. 30 is an enlarged cross-sectional view corresponding to the region shown in FIG. 5, the view showing a modified example of the second trench structure 30. Hereinafter, an example that the second trench structure 30 according to the modified example is adopted in the semiconductor device 1A according to the first embodiment will be shown.

With reference to FIG. 30, in this example, the second trench structure 30 is formed to have a depth substantially equal to the first trench structure 10. That is, a bottom wall of the second trench structure 30 is formed in the second semiconductor region 7 while being spaced from the third semiconductor region 8. In this example, the second electrode 33 is electrically and mechanically connected to the first semiconductor region 6 and the second semiconductor region 7 in the second trench 32. The second electrode 33 is not mechanically connected to the third semiconductor region 8. In this embodiment, the second electrode 33 includes metal, but may be made of non-metal conductor (for example, conductive polysilicon).

In this example, the semiconductor device 1A includes a plurality of connection electrodes 140 electrically connected to the second trench structures 30 on the second mesa portions 15B. The plurality of connection electrodes 140 are respectively connected to the plurality of second trench structures 30 while passing through the main surface insulating film 24. Specifically, the plurality of connection electrodes 140 are respectively arranged in the plurality of second connection openings 31 formed on the main surface insulating film 24. The plurality of connection electrodes 140 are respectively formed along the plurality of second trench structures 30. The plurality of connection electrodes 140 may be respectively formed in a band shape extending in the direction in which the first trench structures 10 extend (that is, in the second direction Y) in a plan view.

The plurality of connection electrodes 140 are respectively made of metal. In this embodiment, each of the connection electrodes 140 has a laminated structure including a barrier film 141 and an electrode main body 142. The barrier film 141 and the electrode main body 142 are formed in the same mode as the first barrier film 27 and the first electrode main body 28 according to the first electrode 25.

In this example, the semiconductor device 1A includes the plurality of bottom wall impurity regions 41 respectively formed in the region along the bottom wall of the first trench structure 10 and a region along the bottom wall of the second trench structure 30 in the second semiconductor region 7. The bottom wall impurity region 41 on the second trench structure 30 side is formed in substantially the same mode as the bottom wall impurity region 41 on the first trench structure 10 side except the portion that the bottom wall impurity region 41 on the second trench structure 30 side is electrically connected to the second electrode 33.

As described above, even in a case where the second trench structures 30 according to the modified example are adopted, the same effects as the effects described for the semiconductor device 1A according to the first embodiment, etc., are also exerted. The second trench structures 30 according to the modified example can be formed only by changing the manufacturing steps of FIGS. 11A to 11Q. For example, the second trench structures 30 and the connection electrodes 140 according to the modified example can be formed by utilizing the step of forming the first trench structures 10 or the step of forming the first electrodes 25.

Figure 31:
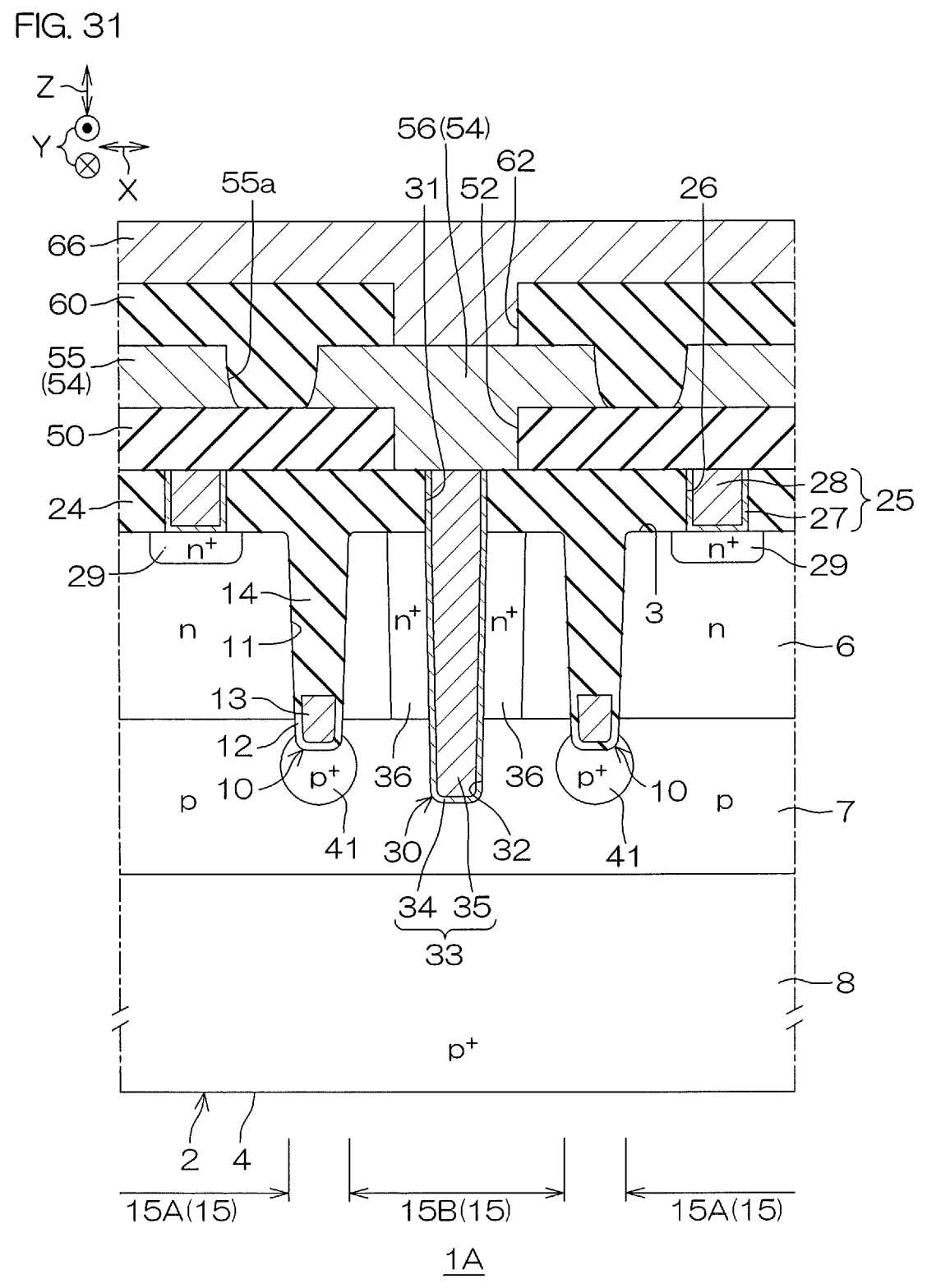

The embodiments described above show the example that the base electrode 75 that covers the second main surface 4 is formed. However, a structure shown in FIG. 31 may be adopted. FIG. 31 is an enlarged cross-sectional view corresponding to the region shown in FIG. 5, the view showing a structure example in a case where the base electrode is removed in the semiconductor device according to the first embodiment.

With reference to FIG. 31, the semiconductor device 1A may have the second main surface 4 (third semiconductor region 8) which is exposed to the outside. That is, the semiconductor device 1A may not have the base electrode 75 that covers the second main surface 4. In this case, the second trench structures 30 (second trenches 32) may be formed to be deeper than the first trench structures 10 (first trenches 11). As a matter of course, the second trench structures 30 (second trenches 32) may be formed to have a depth substantially equal to the first trench structures 10 (first trenches 11). Such a semiconductor device 1A is manufactured by omitting the step of forming the base electrode 75 in the step of FIG. 11Q described above.

Figure 32:
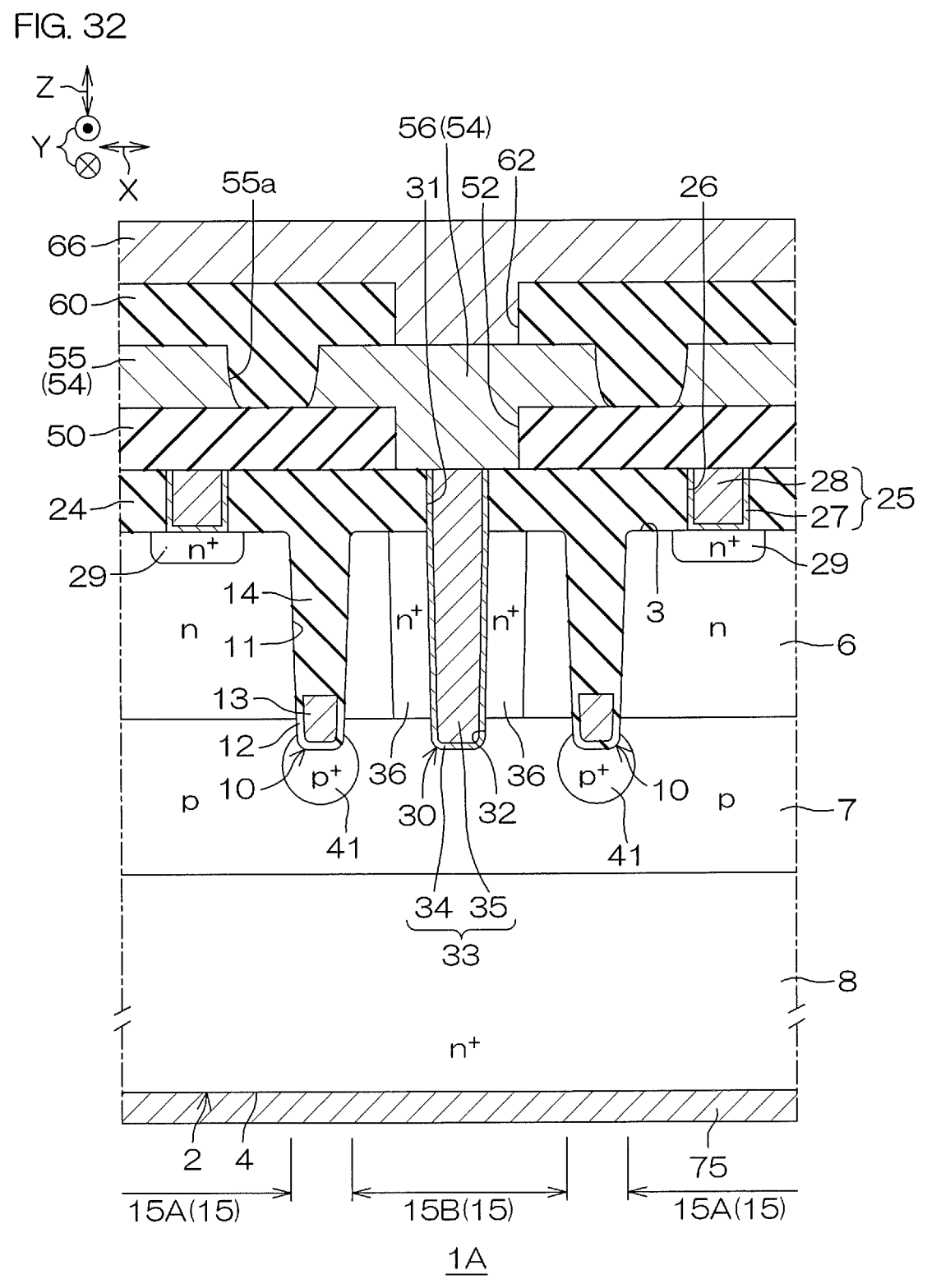

The embodiments described above show the example that the conductivity type of the third semiconductor region 8 is the "p-type." However, a structure shown in FIG. 32 may be adopted. FIG. 32 is an enlarged cross-sectional view corresponding to the region shown in FIG. 5, the view showing a modified example of the third semiconductor region 8. Hereinafter, an example that a third semiconductor region 8 according to the modified example is adopted in the semiconductor device 1A according to the first embodiment will be shown.

With reference to FIG. 32, the third semiconductor region 8 may have the conductivity type of "n-type" instead of the "p-type." The third semiconductor region 8 may have an n-type impurity concentration higher than that of the first semiconductor region 6. In this case, the third semiconductor region 8 may have an n-type impurity concentration of not less than $1\times10^{18}$ $cm^{-3}$ and not more than $1\times10^{21}$ $cm^{-3}$. As a matter of course, the third semiconductor region 8 may have an n-type impurity concentration lower than that of the first semiconductor region 6. In this case, the third semiconductor region 8 may have an n-type impurity concentration of not less than $1\times10^{14}$ $cm^{-3}$ and not more than $1\times10^{18}$ $cm^{-3}$.

In a case where the conductivity type of the third semiconductor region 8 is the "n-type," the plurality of second trench structures 30 are preferably formed while being spaced from the bottom portion of the second semiconductor region 7 (third semiconductor region 8) on the first main surface 3 side. That is, preferably, the second electrodes 33 are mechanically and electrically connected to the first semiconductor region 6 and the second semiconductor region 7 in the second trenches 32 and are not mechanically connected to the third semiconductor region 8.

In this case, the third semiconductor region 8 may be formed in an electrically floating state. The second trench structures 30 (second trenches 32) may be formed to be deeper than the first trench structures 10 (first trenches 11). As a matter of course, the second trench structures 30 (second trenches 32) may be formed to have a depth substantially equal to the first trench structures 10 (first trenches 11).

Further, in a case where the conductivity type of the third semiconductor region 8 is the "n-type," the semiconductor device 1A may have the second main surface 4 (third semiconductor region 8) which is exposed to the outside. That is, the semiconductor device 1A may not have the base electrode 75 that covers the second main surface 4. As a matter of course, even in a case where the conductivity type of the third semiconductor region 8 is the "n-type," the semiconductor device 1A may have the base electrode 75.

In the method of manufacturing the semiconductor device 1A having such a structure, in the step of FIG. 11A, the wafer 80 having the n-type third semiconductor region 8 on the second wafer main surface 82 side and having the second semiconductor region 7 on the first wafer main surface 81 side is prepared. Also, in the step of FIG. 11I, etching conditions with respect to the wafer 80 are adjusted, and the plurality of second trenches 32 passing through the first semiconductor region 6, the second trenches 32 from which the second semiconductor region 7 is exposed while being spaced from the third semiconductor region 8 are formed. Also, in the step of FIG. 11Q, the step of forming the base electrode 75 is omitted as needed.

It is possible to implement the embodiments described above in further other modes. For example, the embodiments described above describe the example that the "first conductivity type" is the "n-type" and the "second conductivity type" is the "p-type." However, a structure that the "first conductivity type" is the "p-type" and the "second conductivity type" is the "n-type" may be adopted. A specific arrangement in this case is obtained by replacing the "n-type region" with the "p-type region," and at the same time by replacing the "p-type region" with the "n-type region" in the description above and the attached drawings.

In a case where the chip 2 includes an SiC monocrystal in the embodiments described above, the chip 2 preferably includes an SiC monocrystal made of a hexagonal crystal. The SiC monocrystal made of a hexagonal crystal has a plurality of polytypes including a 2H (Hexagonal)-SiC monocrystal, a 4H-SiC monocrystal, and a 6H-SiC monocrystal in accordance with the period of atomic arrangement. The chip 2 is preferably made of a 4H-SiC monocrystal among the plurality of polytypes.

In this case, preferably, the first main surface 3 is formed by a silicon plane ((0001) plane) of an SiC monocrystal, and the second main surface 4 is formed by a carbon plane ((000-1) plane) of an SiC monocrystal. As a matter of course, the first main surface 3 may be formed by the carbon plane, and the second main surface 4 may be formed by the silicon plane. The (0001) plane and the (000-1) plane of the SiC monocrystal are referred to as c-planes.

The first main surface 3 may have an off-angle inclined by a predetermined angle in the predetermined off direction with respect to the c-plane of the SiC monocrystal. The off direction may be an a-axis direction ([11-20] direction) of the SiC monocrystal. The off-angle may be not less than 0° and not more than 5.0°. In this case, the first direction X may be an m-axis direction of the SiC monocrystal, and the second direction Y may be the a-axis direction of the SiC monocrystal. As a matter of course, the first direction X may be the a-axis direction of the SiC monocrystal, and the second direction Y may be the m-axis direction of the SiC monocrystal.

Hereinafter, characteristic examples extracted from this specification and the attached drawings will be shown. Hereinafter, a semiconductor device having a new structure will be provided. Hereinafter, although alphabets and numbers in parentheses will represent the corresponding constituent elements, etc., in the embodiments described above, there is no intention to limit ranges of each item to the embodiments.

[A1] A semiconductor device (1A to 1D) comprising: a chip (2) having a first main surface (3) on one side and a second main surface (4) on the other side; a first conductivity type (n-type) first semiconductor region (6) formed in a region on the first main surface (3) side in the chip (2); a second conductivity type (p-type) second semiconductor region (7) formed in a region on the second main surface (4) side than the first semiconductor region (6) in the chip (2); a first groove structure (10) including a first groove (11) formed in the first main surface (3) while passing through the first semiconductor region (6) so as to partition the first semiconductor region (6) into a first region (15A) on one side and a second region (15B) on the other side as viewed in cross-section, a control insulating film (12) that covers a wall surface of the first groove (11), and a control electrode (13) embedded in the first groove (11) while sandwiching the control insulating film (12) so as to control a channel (42) in the second semiconductor region (7); a first electrode (25) electrically connected to the first semiconductor region (6) in the first region (15A); and a second groove structure (30) including a second groove (32) formed in the first main surface (3) while passing through the first semiconductor region (6) in the second region (15B), and a second electrode (33) embedded in the second groove (32) so as to form a current path via the channel (42) between the first electrode (25) and the second electrode (33).

[A2] The semiconductor device (1A to 1D) according to A1, wherein the second electrode (33) is electrically connected to both the first semiconductor region (6) and the second semiconductor region (7) in the second groove (32).

[A3] The semiconductor device (1A to 1D) according to A1 or A2, wherein the second groove (32) is deeper than the first groove (11).

[A4] The semiconductor device (1A to 1D) according to any one of A1 to A3, further comprising: a first conductivity type (n-type) first impurity region (29) formed in the first region (15A) at a concentration higher than that of the first semiconductor region (6) so as to be electrically connected to the first electrode (25); and a first conductivity type (n-type) second impurity region (36) formed in the second region (15B) at a concentration higher than that of the first semiconductor region (6) so as to be electrically connected to the second electrode (33).

[A5] The semiconductor device (1A to 1D) according to A4, wherein the second impurity region (36) is formed to be deeper than the first impurity region (29).

[A6] The semiconductor device (1A to 1D) according to A4 or A5, wherein the first impurity region (29) extends in the lateral direction along the first main surface (3) as viewed in cross-section, and the second impurity region (36) extends in the vertical direction along the second groove structure (30) as viewed in cross-section.

[A7] The semiconductor device (1A to 1D) according to any one of A4 to A6, wherein the second impurity region (36) is connected to the second electrode (33).

[A8] The semiconductor device (1A to 1D) according to any one of A1 to A7, wherein the control electrode (13) is embedded in the first groove (11) while being spaced from the first main surface (3) on the bottom wall side of the first groove (11).

[A9] The semiconductor device (1A to 1D) according to A8, wherein the control electrode (13) is embedded in the first groove (11) while being spaced from an intermediate portion of the first groove (11) on the bottom wall side of the first groove (11).

[A10] The semiconductor device (1A to 1D) according to A8 or A9, wherein the first groove structure (10) includes an insulator (14) embedded in the first groove (11) so as to cover the control electrode (13).

[A11] The semiconductor device (1A to 1D) according to A10, wherein a thickness of the insulator (14) exceeds a thickness of the control electrode (13) regarding the depth direction of the first groove (11).

[A12] The semiconductor device (1A to 1D) according to any one of A1 to A11, further comprising: a main surface insulating film (24) that covers the first main surface (3) and the first groove structure (10); wherein the first electrode (25) passes through the main surface insulating film (24), and the second groove structure (30) has the second groove (32) passing through the main surface insulating film (24).

[A13] The semiconductor device (1A to 1D) according to A12, wherein the second electrode (33) has a portion positioned on the chip (2) side with respect to the first main surface (3), and a portion positioned on the main surface insulating film (24) side with respect to the first main surface (3) in the second groove (32).

[A14] The semiconductor device (1A to 1D) according to A12 or A13, wherein the main surface insulating film (24) is thicker than the control insulating film (12).

[A15] The semiconductor device (1A to 1D) according to any one of A1 to A14, further comprising: a second conductivity type (p-type) bottom wall impurity region (41) formed along a bottom wall of the first groove structure (10) in the second semiconductor region (7).

[A16] The semiconductor device (1A to 1D) according to any one of A1 to A15, further comprising: a second conductivity type third semiconductor region (8) formed in a region on the second main surface (4) side than the second semiconductor region (7) in the chip (2), the third semiconductor region having an impurity concentration higher than that of the second semiconductor region (7).

[A17] The semiconductor device (1A to 1D) according to A16, wherein a bottom wall of the first groove structure (10) is positioned in the second semiconductor region (7), and a bottom wall of the second groove structure (30) is positioned in the third semiconductor region (8).

[A18] The semiconductor device (1A to 1D) according to any one of A1 to A17, wherein the control electrode (13) includes non-metal conductor, and the second electrode (33) includes metal.

[A19] The semiconductor device (1A to 1D) according to any one of A1 to A18, wherein the plurality of first groove structures (10) are formed, and the second groove structure (30) is formed in a region between the plurality of first groove structures (10).

[A20] The semiconductor device (1A to 1D) according to any one of A1 to A19, wherein the chip (2) includes an Si monocrystal or an SiC monocrystal.

While the embodiments have been described in detail, these are merely specific examples used to clarify the technical content and the present invention should not be interpreted as being limited to these specific examples, and the scope of the present invention shall be limited only by the appended claims.

What is claimed is:

1. A semiconductor device comprising:

a chip having a first main surface on one side and a second main surface on the other side;

a first conductivity type first semiconductor region formed in a region on the first main surface side in the chip;

a second conductivity type second semiconductor region formed in a region on the second main surface side than the first semiconductor region in the chip;

a first groove structure including a first groove formed in the first main surface while passing through the first semiconductor region so as to partition the first semiconductor region into a first region on one side and a second region on the other side as viewed in cross-section, a control insulating film that covers a wall surface of the first groove, and a control electrode embedded in the first groove while sandwiching the control insulating film so as to control a channel in the second semiconductor region;

a first electrode electrically connected to the first semiconductor region in the first region; and a second groove structure including a second groove formed in the first main surface while passing through the first semiconductor region in the second region, and a second electrode embedded in the second groove so as to form a current path via the channel between the first electrode and the second electrode.

2. The semiconductor device according to claim 1, wherein the second electrode is electrically connected to both the first semiconductor region and the second semiconductor region in the second groove.

3. The semiconductor device according to claim 1, wherein the second groove is deeper than the first groove.

4. The semiconductor device according to claim 1, further comprising:

a first conductivity type first impurity region formed in the first region at a concentration higher than that of the first semiconductor region so as to be electrically connected to the first electrode; and a first conductivity type second impurity region formed in the second region at a concentration higher than that of the first semiconductor region so as to be electrically connected to the second electrode.

5. The semiconductor device according to claim 4, wherein the second impurity region is formed to be deeper than the first impurity region.

6. The semiconductor device according to claim 4, wherein the first impurity region extends in the lateral direction along the first main surface as viewed in cross-section, and the second impurity region extends in the vertical direction along the second groove structure as viewed in cross-section.

7. The semiconductor device according to claim 4, wherein the second impurity region is connected to the second electrode.

8. The semiconductor device according to claim 1, wherein the control electrode is embedded in the first groove while being spaced from the first main surface on the bottom wall side of the first groove.

9. The semiconductor device according to claim 8, wherein the control electrode is embedded in the first groove while being spaced from an intermediate portion of the first groove on the bottom wall side of the first groove.

10. The semiconductor device according to claim 8, wherein the first groove structure includes an insulator embedded in the first groove so as to cover the control electrode.

11. The semiconductor device according to claim 10, wherein a thickness of the insulator exceeds a thickness of the control electrode regarding the depth direction of the first groove.

12. The semiconductor device according to claim 1, further comprising:

a main surface insulating film that covers the first main surface and the first groove structure;

wherein the first electrode passes through the main surface insulating film, and the second groove structure has the second groove passing through the main surface insulating film.

13. The semiconductor device according to claim 12, wherein the second electrode has a portion positioned on the chip side with respect to the first main surface, and a portion positioned on the main surface insulating film side with respect to the first main surface in the second groove.

14. The semiconductor device according to claim 12, wherein the main surface insulating film is thicker than the control insulating film.

15. The semiconductor device according to claim 1, further comprising:

a second conductivity type bottom wall impurity region formed along a bottom wall of the first groove structure in the second semiconductor region.

16. The semiconductor device according to claim 1, further comprising:

a second conductivity type third semiconductor region formed in a region on the second main surface side than the second semiconductor region in the chip, the third semiconductor region having an impurity concentration higher than that of the second semiconductor region.

17. The semiconductor device according to claim 16, wherein a bottom wall of the first groove structure is positioned in the second semiconductor region, and a bottom wall of the second groove structure is positioned in the third semiconductor region.

18. The semiconductor device according to claim 1, wherein the control electrode includes non-metal conductor, and the second electrode includes metal.

19. The semiconductor device according to claim 1, wherein the first groove structures are formed, and the second groove structure is formed in a region between the first groove structures.

20. The semiconductor device according to claim 1, wherein the chip includes an Si monocrystal or an SiC monocrystal.

* * * * *